(12) United States Patent
Tiwari et al.

(10) Patent No.: US 9,583,163 B2
(45) Date of Patent: Feb. 28, 2017

(54) LOOP STRUCTURE FOR OPERATIONS IN MEMORY

(71) Applicant: Micron Technology, Inc., Boise, ID (US)

(72) Inventors: Sanjay Tiwari, Meridian, ID (US); Kyle Wheeler, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/013,269

(22) Filed: Feb. 2, 2016

(65) Prior Publication Data
US 2016/0225422 A1 Aug. 4, 2016

Related U.S. Application Data

(60) Provisional application No. 62/111,311, filed on Feb. 3, 2015.

(51) Int. Cl.
*G11C 8/04* (2006.01)
*G11C 7/00* (2006.01)
(Continued)

(52) U.S. Cl.
CPC .................. *G11C 8/04* (2013.01); *G11C 7/00* (2013.01); *G11C 7/065* (2013.01); *G11C 7/1006* (2013.01);
(Continued)

(58) Field of Classification Search
CPC .................................... G11C 7/00; G11C 8/04
See application file for complete search history.

(56) References Cited

U.S. PATENT DOCUMENTS 4,380,046 A   4/1983 Fung
4,435,792 A   3/1984 Bechtolsheim
(Continued)

FOREIGN PATENT DOCUMENTS

CN   102141905   8/2011
EP     0214718   3/1987
(Continued)

OTHER PUBLICATIONS

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.
(Continued)

*Primary Examiner* — R Lance Reidlinger
(74) *Attorney, Agent, or Firm* — Brooks, Cameron & Huebsch, PLLC

(57) ABSTRACT

Examples of the present disclosure provide apparatuses and methods related to performing a loop structure for operations performed in memory. An example apparatus might also include a controller configured to cause sensing circuitry to iterate through a plurality of first elements and a plurality of second elements via a loop structure to perform an operation using the plurality of first elements and the plurality of second elements, wherein a conditional statement associated with the loop structure is used to determine whether at least one of a plurality of bits stored as an iterator mask has a particular bit-value. An example apparatus might also include sensing circuitry controllable to perform a shift operation using the iterator mask at each iteration of the loop structure and perform an AND operation using the iterator mask at each iteration of the loop structure.

37 Claims, 21 Drawing Sheets

(51) Int. Cl.
  *G11C 7/06*  (2006.01)
  *G11C 7/10*  (2006.01)
  *G11C 7/12*  (2006.01)
  *G11C 11/4091*  (2006.01)
  *G11C 11/4094*  (2006.01)

(52) U.S. Cl.
  CPC .............. *G11C 7/1036* (2013.01); *G11C 7/12* (2013.01); *G11C 11/4091* (2013.01); *G11C 11/4094* (2013.01)

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,430,687 A | 7/1995 | Hung et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,953,738 A | 9/1999 | Rao |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,058,880 B1 | 6/2006 | Ding et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,532,529 B2 | 5/2009 | Dadashev et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mokhlesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |

(56) References Cited

U.S. PATENT DOCUMENTS

| | | |
|---|---|---|
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung |
| 8,644,101 B2 | 2/2014 | Jun et al. |
| 8,650,232 B2 | 2/2014 | Stortz et al. |
| 8,683,183 B2 | 3/2014 | Sprangle |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,235,414 B2 | 1/2016 | Gopal et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0196030 A1 | 10/2003 | Elliott et al. |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0142419 A1 | 6/2011 | Zou et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0247673 A1 | 9/2014 | Muralimanohar et al. |
| 2014/0250279 A1 | 9/2014 | Manning |
| 2014/0281371 A1 | 9/2014 | Thantry et al. |
| 2014/0344934 A1 | 11/2014 | Jorgensen |
| 2015/0029798 A1 | 1/2015 | Manning |
| 2015/0089166 A1 | 3/2015 | Kogge |
| 2015/0134713 A1 | 5/2015 | Wheeler |
| 2015/0279466 A1* | 10/2015 | Manning ............... G11C 15/043 365/49.17 |
| 2015/0324290 A1 | 11/2015 | Leidel |
| 2015/0325272 A1 | 11/2015 | Murphy |
| 2015/0357047 A1* | 12/2015 | Tiwari ............... G06F 9/30029 714/719 |
| 2016/0064047 A1* | 3/2016 | Tiwari ............... G11C 7/065 365/189.05 |
| 2016/0196856 A1* | 7/2016 | Tiwari ............... G11C 7/1012 365/189.05 |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 100821616 | 4/2008 |
| KR | 10-2010-0134235 | 12/2010 |
| KR | 10-2013-0049421 | 5/2013 |
| TW | 485601 | 5/2002 |
| TW | 200532708 | 10/2005 |
| TW | 201218070 | 5/2012 |
| TW | 201346724 | 11/2013 |
| WO | 2001065359 | 9/2001 |
| WO | 2010079451 | 7/2010 |
| WO | 2013062596 | 5/2013 |

(56) References Cited

FOREIGN PATENT DOCUMENTS

| WO | 2013081588 | 6/2013 |
|---|---|---|
| WO | 2013095592 | 6/2013 |

OTHER PUBLICATIONS

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

Boyd et al., "On the General Applicability of Instruction-Set Randomization", Jul.-Sep. 2010, (14 pgs.), vol. 7, Issue 3, IEEE Transactions on Dependable and Secure Computing.

Stojmenovic, "Multiplicative Circulant Networks Topological Properties and Communication Algorithms", (25 pgs.), Discrete Applied Mathematics 77 (1997) 281-305.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, mailed Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Warren Jr., Henry S., "Hacker's Delight", Second Edition, Oct. 2013, pp. 181-184 and 194.

\* cited by examiner

| 496 STEP # | COMP_COMP (431) | ITERATOR_MASK (476) | STATIC_MASK (478) | ELEMENT_MASK (488) | ELEMENT_WIDTH (490) |
|---|---|---|---|---|---|
|  |  |  |  |  | 8 |
| 1 | 0XFF,FF,FF,FF |  |  |  |  |
| 2 | 0X7F,FF,FF,FF |  |  |  |  |
| 3 | 0X80,00,00,00 |  |  | 0X80,00,00,00 |  |
| 4 | 0X80,80,80,80 |  |  | 0X80,00,00,00 |  |
| 5 | 0X80,80,80,80 |  |  | 0X80,80,80,80 |  |
| 6 | 0X7F,7F,7F,7F |  | 0X7F,7F,7F,7F | 0X80,80,80,80 |  |
| 7 | 0X80,80,80,80 |  | 0X7F,7F,7F,7F | 0X80,80,80,80 |  |
| 8 | 0X40,40,40,40 |  | 0X7F,7F,7F,7F | 0X80,80,80,80 |  |
| 9 | 0X40,40,40,40 | 0X40,40,40,40 | 0X7F,7F,7F,7F | 0X80,80,80,80 |  |
| 10 | 0X40,40,40,40 | 0X40,40,40,40 | 0X7F,7F,7F,7F | 0X80,80,80,80 |  |
| 1ST ITERATION 10.a | 0X40,40,40,40 | 0X40,40,40,40 | 0X7F,7F,7F,7F | 0X80,80,80,80 |  |
| 10.b | 0X40,40,40,40 | 0X40,40,40,40 | 0X7F,7F,7F,7F | 0X80,80,80,80 |  |
| 10.c | 0X20,20,20,20 | 0X40,40,40,40 | 0X7F,7F,7F,7F | 0X80,80,80,80 |  |
| 10.d | 0X20,20,20,20 | 0X20,20,20,20 | 0X7F,7F,7F,7F | 0X80,80,80,80 |  |
|  |  |  |  |  |  |
| 2ND ITERATION 10.b | 0X20,20,20,20 | 0X20,20,20,20 | 0X7F,7F,7F,7F | 0X80,80,80,80 |  |
| 10.c | 0X10,10,10,10 | 0X20,20,20,20 | 0X7F,7F,7F,7F | 0X80,80,80,80 |  |
| 10.d | 0X10,10,10,10 | 0X10,10,10,10 | 0X7F,7F,7F,7F | 0X80,80,80,80 |  |
|  |  |  |  |  |  |
| 3RD ITERATION 10.b | 0X10,10,10,10 | 0X10,10,10,10 | 0X7F,7F,7F,7F | 0X80,80,80,80 |  |
| 10.c | 0X08,08,08,08 | 0X10,10,10,10 | 0X7F,7F,7F,7F | 0X80,80,80,80 |  |
| 10.d | 0X08,08,08,08 | 0X08,08,08,08 | 0X7F,7F,7F,7F | 0X80,80,80,80 |  |

| STEP # 496 | | COMP_COMP 431 | ITERATOR_MASK 476 | STATIC_MASK 478 | ELEMENT_MASK 488 | ELEMENT_WIDTH 490 |
|---|---|---|---|---|---|---|
| | | | | | | 8 |
| 4TH ITERATION | 10.b | 0X08,08,08,08 | 0X08,08,08,08 | 0X7F,7F,7F,7F | 0X80,80,80,80 | |
| | 10.c | 0X04,04,04,04 | 0X08,08,08,08 | 0X7F,7F,7F,7F | 0X80,80,80,80 | |
| | 10.d | 0X04,04,04,04 | 0X04,04,04,04 | 0X7F,7F,7F,7F | 0X80,80,80,80 | |
| | | | | | | |
| 5TH ITERATION | 10.b | 0X04,04,04,04 | 0X04,04,04,04 | 0X7F,7F,7F,7F | 0X80,80,80,80 | |
| | 10.c | 0X02,02,02,02 | 0X04,04,04,04 | 0X7F,7F,7F,7F | 0X80,80,80,80 | |
| | 10.d | 0X02,02,02,02 | 0X02,02,02,02 | 0X7F,7F,7F,7F | 0X80,80,80,80 | |
| | | | | | | |
| 6TH ITERATION | 10.b | 0X02,02,02,02 | 0X02,02,02,02 | 0X7F,7F,7F,7F | 0X80,80,80,80 | |
| | 10.c | 0X01,01,01,01 | 0X02,02,02,02 | 0X7F,7F,7F,7F | 0X80,80,80,80 | |
| | 10.d | 0X01,01,01,01 | 0X01,01,01,01 | 0X7F,7F,7F,7F | 0X80,80,80,80 | |
| | | | | | | |
| 7TH ITERATION | 10.b | 0X01,01,01,01 | 0X01,01,01,01 | 0X7F,7F,7F,7F | 0X80,80,80,80 | |
| | 10.c | 0X00,80,80,80 | 0X01,01,01,01 | 0X7F,7F,7F,7F | 0X80,80,80,80 | |
| | 10.d | 0X00,00,00,00 | 0X00,00,00,00 | 0X7F,7F,7F,7F | 0X80,80,80,80 | |

| 596 STEP # | | COMP_COMP (531) | ITERATOR_MASK (576) | STATIC_MASK (578) | ELEMENT_MASK (588) | ELEMENT_WIDTH (590) |
|---|---|---|---|---|---|---|
| | | | | | | 8 |
| | 1 | 0XFF,FF,FF,FF | | | | |
| | 2 | 0X7F,FF,FF,FF | | | | |
| | 3 | 0X80,00,00,00 | | | 0X80,00,00,00 | |
| | 4 | 0X80,80,80,80 | | | 0X80,00,00,00 | |
| | 5 | 0X80,80,80,80 | | | 0X80,80,80,80 | |
| | 6 | 0X7F,7F,7F,7F | | 0X7F,7F,7F,7F | 0X80,80,80,80 | |
| | 7 | 0X80,80,80,80 | | 0X7F,7F,7F,7F | 0X80,80,80,80 | |
| | 8 | 0X01,01,01,01 | | 0X7F,7F,7F,7F | 0X80,80,80,80 | |
| | 9 | 0X01,01,01,01 | 0X01,01,01,01 | 0X7F,7F,7F,7F | 0X80,80,80,80 | |
| | 10 | 0X01,01,01,01 | 0X01,01,01,01 | 0X7F,7F,7F,7F | 0X80,80,80,80 | |
| 1ST ITERATION | 10.a | 0X01,01,01,01 | 0X01,01,01,01 | 0X7F,7F,7F,7F | 0X80,80,80,80 | |
| | 10.b | 0X01,01,01,01 | 0X01,01,01,01 | 0X7F,7F,7F,7F | 0X80,80,80,80 | |
| | 10.c | 0X02,02,02,02 | 0X01,01,01,01 | 0X7F,7F,7F,7F | 0X80,80,80,80 | |
| | 10.d | 0X02,02,02,02 | 0X02,02,02,02 | 0X7F,7F,7F,7F | 0X80,80,80,80 | |
| | | | | | | |
| 2ND ITERATION | 10.b | 0X02,02,02,02 | 0X02,02,02,02 | 0X7F,7F,7F,7F | 0X80,80,80,80 | |
| | 10.c | 0X04,04,04,04 | 0X02,02,02,02 | 0X7F,7F,7F,7F | 0X80,80,80,80 | |
| | 10.d | 0X04,04,04,04 | 0X04,04,04,04 | 0X7F,7F,7F,7F | 0X80,80,80,80 | |
| | | | | | | |
| 3RD ITERATION | 10.b | 0X04,04,04,04 | 0X04,04,04,04 | 0X7F,7F,7F,7F | 0X80,80,80,80 | |
| | 10.c | 0X08,08,08,08 | 0X04,04,04,04 | 0X7F,7F,7F,7F | 0X80,80,80,80 | |
| | 10.d | 0X08,08,08,08 | 0X08,08,08,08 | 0X7F,7F,7F,7F | 0X80,80,80,80 | |

*Fig. 5A*

| 596 STEP # | | COMP_COMP (531) | ITERATOR_MASK (576) | STATIC_MASK (578) | ELEMENT_MASK (588) | ELEMENT_WIDTH (590) |
|---|---|---|---|---|---|---|
| | | | | | | 8 |
| 4TH ITERATION | 10.b | 0X08,08,08,08 | 0X08,08,08,08 | 0X7F,7F,7F,7F | 0X80,80,80,80 | |
| | 10.c | 0X10,10,10,10 | 0X08,08,08,08 | 0X7F,7F,7F,7F | 0X80,80,80,80 | |
| | 10.d | 0X10,10,10,10 | 0X10,10,10,10 | 0X7F,7F,7F,7F | 0X80,80,80,80 | |
| | | | | | | |
| 5TH ITERATION | 10.b | 0X10,10,10,10 | 0X10,10,10,10 | 0X7F,7F,7F,7F | 0X80,80,80,80 | |
| | 10.c | 0X20,20,20,20 | 0X10,10,10,10 | 0X7F,7F,7F,7F | 0X80,80,80,80 | |
| | 10.d | 0X20,20,20,20 | 0X20,20,20,20 | 0X7F,7F,7F,7F | 0X80,80,80,80 | |
| | | | | | | |
| 6TH ITERATION | 10.b | 0X20,20,20,20 | 0X20,20,20,20 | 0X7F,7F,7F,7F | 0X80,80,80,80 | |
| | 10.c | 0X40,40,40,40 | 0X20,20,20,20 | 0X7F,7F,7F,7F | 0X80,80,80,80 | |
| | 10.d | 0X40,40,40,40 | 0X40,40,40,40 | 0X7F,7F,7F,7F | 0X80,80,80,80 | |
| | | | | | | |
| 7TH ITERATION | 10.b | 0X40,40,40,40 | 0X40,40,40,40 | 0X7F,7F,7F,7F | 0X80,80,80,80 | |
| | 10.c | 0X80,80,80,80 | 0X40,40,40,40 | 0X7F,7F,7F,7F | 0X80,80,80,80 | |
| | 10.d | 0X00,00,00,00 | 0X00,00,00,00 | 0X7F,7F,7F,7F | 0X80,80,80,80 | |

*Fig. 5B*

| | STEP # | COMP_COMP | ITERATOR_MASK | STATIC_MASK | ELEMENT_MASK |
|---|---|---|---|---|---|
| | | | | | 0X8,8,80,80,80 |
| | 1 | | 0X8,8,80,80,80 | | 0X8,8,80,80,80 |
| | 2 | 0X7,7,7F,7F,7F | 0X8,8,80,80,80 | | 0X8,8,80,80,80 |
| | 3 | 0XE,E,FE,FE,FE | 0X8,8,80,80,80 | | 0X8,8,80,80,80 |
| | 4 | 0XE,E,FE,FE,FE | 0X8,8,80,80,80 | 0XE,E,FE,FE,FE | 0X8,8,80,80,80 |
| | 5 | 0X8,8,80,80,80 | 0X8,8,80,80,80 | 0XE,E,FE,FE,FE | 0X8,8,80,80,80 |
| | 6 | 0X8,8,80,80,80 | 0X8,8,80,80,80 | 0XE,E,FE,FE,FE | 0X8,8,80,80,80 |
| 1ST ITERATION | 6.a | 0X8,8,80,80,80 | 0X8,8,80,80,80 | 0XE,E,FE,FE,FE | 0X8,8,80,80,80 |
| | 6.b | 0X8,8,80,80,80 | 0X8,8,80,80,80 | 0XE,E,FE,FE,FE | 0X8,8,80,80,80 |
| | 6.c | 0X4,4,40,40,40 | 0X8,8,80,80,80 | 0XE,E,FE,FE,FE | 0X8,8,80,80,80 |
| | 6.d | 0X4,4,40,40,40 | 0X4,4,40,40,40 | 0XE,E,FE,FE,FE | 0X8,8,80,80,80 |
| 2ND ITERATION | 6.b | 0X4,4,40,40,40 | 0X4,4,40,40,40 | 0XE,E,FE,FE,FE | 0X8,8,80,80,80 |
| | 6.c | 0X2,2,20,20,20 | 0X4,4,40,40,40 | 0XE,E,FE,FE,FE | 0X8,8,80,80,80 |
| | 6.d | 0X2,2,20,20,20 | 0X2,2,20,20,20 | 0XE,E,FE,FE,FE | 0X8,8,80,80,80 |
| 3RD ITERATION | 6.b | 0X2,2,20,20,20 | 0X2,2,20,20,20 | 0XE,E,FE,FE,FE | 0X8,8,80,80,80 |
| | 6.c | 0X1,1,10,10,10 | 0X2,2,20,20,20 | 0XE,E,FE,FE,FE | 0X8,8,80,80,80 |
| | 6.d | 0X0,0,10,10,10 | 0X0,0,10,10,10 | 0XE,E,FE,FE,FE | 0X8,8,80,80,80 |
| 4TH ITERATION | 6.b | 0X0,0,10,10,10 | 0X0,0,10,10,10 | 0XE,E,FE,FE,FE | 0X8,8,80,80,80 |
| | 6.c | 0X0,0,08,08,08 | 0X0,0,10,10,10 | 0XE,E,FE,FE,FE | 0X8,8,80,80,80 |
| | 6.d | 0X0,0,08,08,08 | 0X0,0,08,08,08 | 0XE,E,FE,FE,FE | 0X8,8,80,80,80 |
| 5TH ITERATION | 6.b | 0X0,0,08,08,08 | 0X0,0,08,08,08 | 0XE,E,FE,FE,FE | 0X8,8,80,80,80 |
| | 6.c | 0X0,0,04,04,04 | 0X0,0,08,08,08 | 0XE,E,FE,FE,FE | 0X8,8,80,80,80 |
| | 6.d | 0X0,0,04,04,04 | 0X0,0,04,04,04 | 0XE,E,FE,FE,FE | 0X8,8,80,80,80 |
| 6TH ITERATION | 6.b | 0X0,0,04,04,04 | 0X0,0,04,04,04 | 0XE,E,FE,FE,FE | 0X8,8,80,80,80 |
| | 6.c | 0X0,0,02,02,02 | 0X0,0,04,04,04 | 0XE,E,FE,FE,FE | 0X8,8,80,80,80 |
| | 6.d | 0X0,0,02,02,02 | 0X0,0,02,02,02 | 0XE,E,FE,FE,FE | 0X8,8,80,80,80 |
| 7TH ITERATION | 6.b | 0X0,0,02,02,02 | 0X0,0,02,02,02 | 0XE,E,FE,FE,FE | 0X8,8,80,80,80 |
| | 6.c | 0X0,0,01,01,01 | 0X0,0,02,02,02 | 0XE,E,FE,FE,FE | 0X8,8,80,80,80 |
| | 6.d | 0X0,0,00,00,00 | 0X0,0,00,00,00 | 0XE,E,FE,FE,FE | 0X8,8,80,80,80 |

*Fig. 6*

| STEP # 796 | | COMP_COMP 731 | ITERATOR_MASK 776 | STATIC_MASK 778 | ELEMENT_MASK 788 | ELEMENT_WIDTH 790 |
|---|---|---|---|---|---|---|
| | | | | | 0X8,8,80,80,80 | 8 |
| | 1 | | 0X8,8,80,80,80 | | 0X8,8,80,80,80 | |
| | 2 | 0X7,7,7F,7F,7F | 0X8,8,80,80,80 | | 0X8,8,80,80,80 | |
| | 3 | 0X7,7,7F,7F,7F | 0X8,8,80,80,80 | 0X7,7,7F,7F,7F | 0X8,8,80,80,80 | |
| | 4 | 0XE,E,FE,FE,FE | 0X8,8,80,80,80 | 0X7,7,7F,7F,7F | 0X8,8,80,80,80 | |
| | 5 | 0X1,1,01,01,01 | 0X1,1,01,01,01 | 0X7,7,7F,7F,7F | 0X8,8,80,80,80 | |
| | | | | | | |
| 1ST ITERATION | 6.a | 0X1,1,01,01,01 | 0X1,1,01,01,01 | 0X7,7,7F,7F,7F | 0X8,8,80,80,80 | |
| | 6.b | 0X1,1,01,01,01 | 0X1,1,01,01,01 | 0X7,7,7F,7F,7F | 0X8,8,80,80,80 | |
| | 6.c | 0X2,2,02,02,02 | 0X1,1,01,01,01 | 0X7,7,7F,7F,7F | 0X8,8,80,80,80 | |
| | 6.d | 0X2,2,02,02,02 | 0X2,2,02,02,02 | 0X7,7,7F,7F,7F | 0X8,8,80,80,80 | |
| | | | | | | |
| 2ND ITERATION | 6.b | 0X2,2,02,02,02 | 0X22,20,20,20 | 0X7,7,7F,7F,7F | 0X8,8,80,80,80 | |
| | 6.c | 0X4,4,04,04,04 | 0X22,20,20,20 | 0X7,7,7F,7F,7F | 0X8,8,80,80,80 | |
| | 6.d | 0X4,4,04,04,04 | 0X4,4,04,04,04 | 0X7,7,7F,7F,7F | 0X8,8,80,80,80 | |
| | | | | | | |
| 3RD ITERATION | 6.b | 0X4,4,04,04,04 | 0X4,4,04,04,04 | 0X7,7,7F,7F,7F | 0X8,8,80,80,80 | |
| | 6.c | 0X8,8,08,08,08 | 0X4,4,04,04,04 | 0X7,7,7F,7F,7F | 0X8,8,80,80,80 | |
| | 6.d | 0X0,0,08,08,08 | 0X0,0,08,08,08 | 0X7,7,7F,7F,7F | 0X8,8,80,80,80 | |

*Fig. 7A*

| 796 STEP # | | COMP_COMP (731) | ITERATOR_MASK (776) | STATIC_MASK (778) | ELEMENT_MASK (788) | ELEMENT_WIDTH (790) |
|---|---|---|---|---|---|---|
| 4TH ITERATION | 6.b | 0X0,0,08,08,08 | 0X0,0,08,08,08 | 0X7,7,7F,7F,7F | 0X8,8,80,80,80 | |
| | 6.c | 0X0,0,10,10,10 | 0X0,0,08,08,08 | 0X7,7,7F,7F,7F | 0X8,8,80,80,80 | |
| | 6.d | 0X0,0,10,10,10 | 0X0,0,10,10,10 | 0X7,7,7F,7F,7F | 0X8,8,80,80,80 | |
| | | | | | | |
| 5TH ITERATION | 6.b | 0X0,0,10,10,10 | 0X0,0,10,10,10 | 0X7,7,7F,7F,7F | 0X8,8,80,80,80 | |
| | 6.c | 0X0,0,20,20,20 | 0X0,0,10,10,10 | 0X7,7,7F,7F,7F | 0X8,8,80,80,80 | |
| | 6.d | 0X0,0,20,20,20 | 0X0,0,20,20,20 | 0X7,7,7F,7F,7F | 0X8,8,80,80,80 | |
| | | | | | | |
| 6TH ITERATION | 6.b | 0X0,0,20,20,20 | 0X0,0,20,20,20 | 0X7,7,7F,7F,7F | 0X8,8,80,80,80 | |
| | 6.c | 0X0,0,40,40,40 | 0X0,0,20,20,20 | 0X7,7,7F,7F,7F | 0X8,8,80,80,80 | |
| | 6.d | 0X0,0,40,40,40 | 0X0,0,40,40,40 | 0X7,7,7F,7F,7F | 0X8,8,80,80,80 | |
| | | | | | | |
| 7TH ITERATION | 6.b | 0X0,0,40,40,40 | 0X0,0,40,40,40 | 0X7,7,7F,7F,7F | 0X8,8,80,80,80 | |
| | 6.c | 0X0,0,80,80,80 | 0X0,0,40,40,40 | 0X7,7,7F,7F,7F | 0X8,8,80,80,80 | |
| | 6.d | 0X0,0,00,00,00 | 0X0,0,00,00,00 | 0X7,7,7F,7F,7F | 0X8,8,80,80,80 | |

*Fig. 7B*

TABLE 15-1

| 1544 | 1545 | 1556 | 1570 | 1571 |
| --- | --- | --- | --- | --- |
| A | B | NOT OPEN | OPEN TRUE | OPEN INVERT |
| 0 | 0 | 0 | 0 | 1 |
| 0 | 1 | 0 | 1 | 0 |

1575 →

| 1 | 0 | 1 | 0 | 1 |
| --- | --- | --- | --- | --- |
| 1 | 1 | 1 | 1 | 0 |

TABLE 15-2

| | | | | | | | | | | |
| --- | --- | --- | --- | --- | --- | --- | --- | --- | --- | --- |
| | FF | 0 | 0 | 0 | 0 | 0 | 0 | 1 | 1 | 1 | ← 1576 |
| | FT | 0 | 0 | 0 | 1 | 1 | 1 | 0 | 0 | 0 | ← 1577 |
| | TF | 0 | 0 | 1 | 0 | 0 | 1 | 0 | 0 | 1 | ← 1578 |
| | TT | 0 | 1 | 0 | 0 | 1 | 0 | 0 | 1 | 0 | ← 1579 |
| A | B | A | A*B | A*$\overline{B}$ | A+B | B | AXB | A+$\overline{B}$ | $\overline{AXB}$ | $\overline{B}$ | ← 1547 |
| 0 | 0 | 0 | 0 | 0 | 0 | 0 | 0 | 1 | 1 | 1 |
| 0 | 1 | 0 | 0 | 0 | 1 | 1 | 1 | 0 | 0 | 0 |
| 1 | 0 | 1 | 0 | 1 | 1 | 0 | 1 | 1 | 0 | 1 |
| 1 | 1 | 1 | 1 | 0 | 1 | 1 | 0 | 1 | 1 | 0 |

1580 brackets rows 1576-1579

LOOP STRUCTURE FOR OPERATIONS IN MEMORY

PRIORITY INFORMATION

This application is a Non-Provisional of U.S. Provisional Application No. 62/111,311, filed Feb. 3, 2015, the contents of which are included herein by reference.

TECHNICAL FIELD

The present disclosure relates generally to semiconductor memory apparatuses and methods, and more particularly, to apparatuses and methods related to performing an operation in memory using a loop structure.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units (e.g., herein referred to as functional unit circuitry) such as arithmetic logic unit (ALU) circuitry, floating point unit (FPU) circuitry, and/or a combinatorial logic block, for example, which can execute instructions to perform logical operations such as AND, OR, NOT, NAND, NOR, and XOR logical operations on data (e.g., one or more operands).

A number of components in an electronic system may be involved in providing instructions to the functional unit circuitry for execution. The instructions may be generated, for instance, by a processing resource such as a controller and/or host processor. Data (e.g., the operands on which the instructions will be executed to perform the logical operations) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the operations and/or data may also be sequenced and/or buffered.

In many instances, the processing resources (e.g., processor and/or associated functional unit circuitry) may be external to the memory array, and data can be accessed (e.g., via a bus between the processing resources and the memory array) to execute instructions. Data can be moved from the memory array to registers external to the memory array via a bus.

BRIEF DESCRIPTION OF THE DRAWINGS

FIGS. 4A-4B illustrate a table showing the states of memory cells of a portion of an array at a number of iterations associated with a loop structure for performing operations in memory in accordance with a number of embodiments of the present disclosure.

FIGS. 5A-5B illustrate a table showing the states of memory cells of a portion of an array at a number of iterations associated with a loop structure for performing operations in memory in accordance with a number of embodiments of the present disclosure.

FIG. 6 illustrate a table showing the states of memory cells of a portion of an array at a number of iterations associated with a loop structure for performing operations in memory in accordance with a number of embodiments of the present disclosure.

FIGS. 7A-7B illustrate a table showing the states of memory cells of a portion of an array at a number of iterations associated with a loop structure for performing operations in memory in accordance with a number of embodiments of the present disclosure.

DETAILED DESCRIPTION

Figure 1:
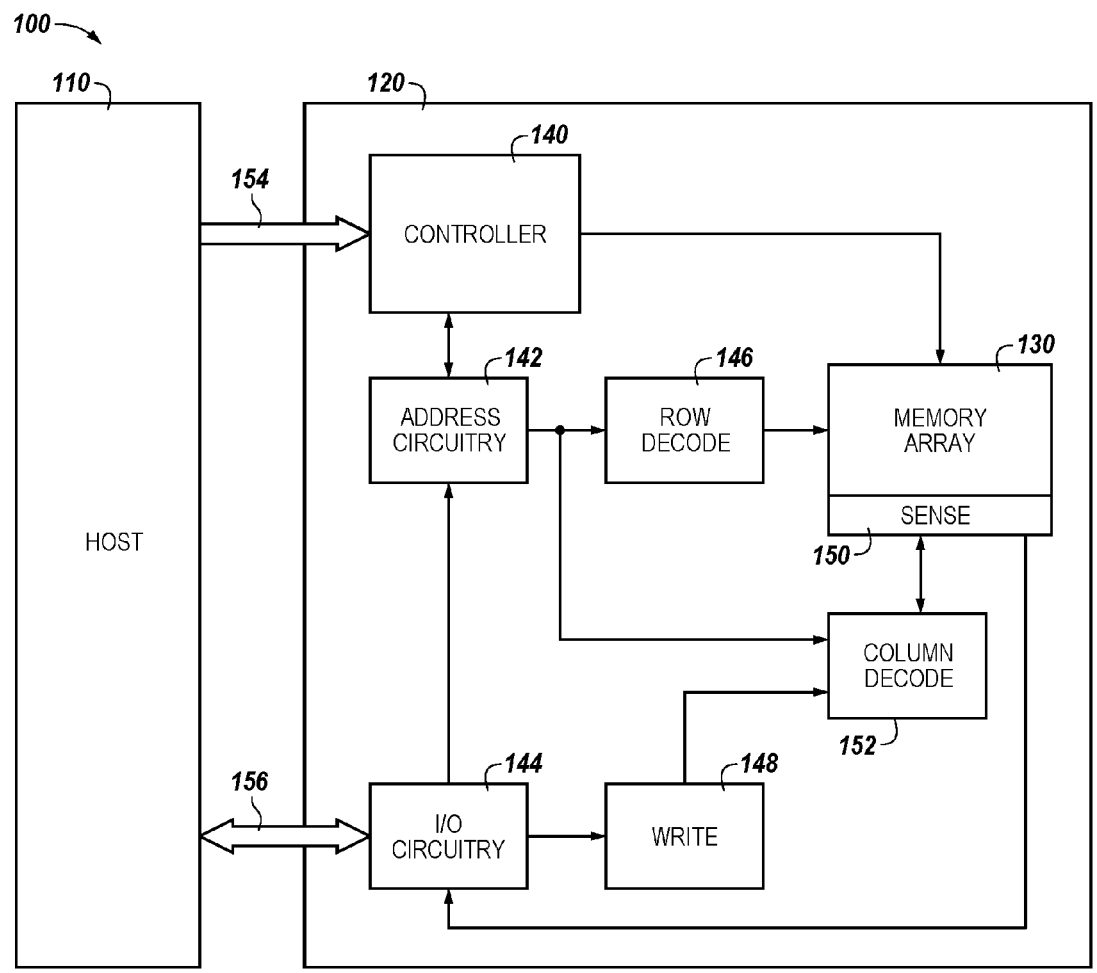
FIG. 1 is a block diagram of an apparatus in the form of a computing system including a memory device in accordance with a number of embodiments of the present disclosure.

The present disclosure includes apparatuses and methods related to a loop structure for performing operations in memory. Operations can be performed in memory on a plurality of first elements (e.g., first bit-vector) and a plurality of elements (e.g., second bit-vector). The plurality of first elements and the plurality of second elements can be stored in groups of memory cells coupled to an access line. For example, a first group of memory cells coupled to a first access line can be configured to store a plurality of first elements. A second group of memory cells coupled to a second access line can be configured to store a plurality of second elements. A loop structure can be used to perform the operations on the plurality of first elements and the plurality of second elements. The operations can include, but is not limited to, addition operations, subtraction operations, and/or division operations, among other possible operations. A loop structure can include a conditional statement associated with the loop structure to determine whether at least one of a plurality of bits stored as an iterator mask has a particular bit-value. The loop structure can also include performing a shift operation using the iterator mask at each iteration of the loop structure. The loop structure can also include performing an AND operation using the iterator mask at each iteration of the loop structure. The shift operation and the AND operation in the loop structure can be performed without transferring data via an input/output (I/O) line, for example.

The operation performed on the plurality of first elements and the plurality of second elements is referred to herein as a primary operation (e.g., a mathematical operation such as an addition operation, subtraction operation, multiplication operation, and/or division operation). However, embodiments of the present disclosure are not limited to a particular type of primary operation. A primary operation can be performed by performing a number of logical operations such as AND, OR, NOT, NAND, NOR, and XOR logical operations but are not limited to logical operations such as AND, OR, NOT, NAND, NOR, and XOR logical operations. The logical operations that are performed to perform a primary operation are referred to herein as a secondary operation. The secondary operations and the control flow associated with the secondary operations is referred to as computation logic in the pseudo code associated with FIGS. 4A, 4B, 5A, 5B, 6, 7A, and 7B. The secondary operations can also include mathematical and/or additional types of operations. For instance, secondary operations can include data movement and/or non-Boolean operations. As used herein, data movement operations include operations that are not one of an AND, OR, NOT, NAND, NOR, and XOR operations.

Performing a primary operation can include performing a plurality of logical operations (e.g., AND, OR, NOT, NAND, NOR, and XOR operations) as well as data movement operations. The plurality of logical operations and/or data movement operations can be performed by executing a number of iterations of a loop structure.

As used herein, a loop structure is defined as a control flow statement that allows a number of operations to be performed in a number of iterations based on a boolean condition (e.g., conditional statement). A loop structure can be a FOR loop, a WHILE loop, and/or a DO WHILE loop, among other possible loop structures.

For example, a primary operation performed on the plurality of first elements and the plurality of second elements can be performed via a loop structure that implements a number of iterations of a plurality of secondary operations that are performed on the first elements and the second elements. The secondary operations (e.g., shift operations, AND operations, etc.) and/or the conditional statement associated with the loop structure can be performed in memory (e.g., without transferring data from an array via an I/O line).

As used herein, elements can be numerical values that can be stored (e.g., as bit-vectors) in a memory array. A plurality of elements can also be stored as a bit-vector in the memory array. An element can also represent an object and/or other construct, which may also be represented by a bit-vector.

A number of embodiments of the present disclosure can provide a reduction of the number of operations (e.g., computations, functions, etc.) and/or time involved in performing a primary operation relative to previous approaches. For instance, the boundaries of a plurality of elements can be defined using an iterator mask and a primary operation including a loop structure can be performed on a plurality of elements using the iterator mask. In contrast, in previous approaches, a primary operation performed on a plurality of elements can be performed by implementing a plurality of loop structures each of which defines the boundaries of a different portion of the plurality of elements. The number of computations and/or the time can be reduced due to an ability to reduce the plurality of loop structures used in previous approaches to a single loop structure used in a number of embodiments of the present disclosure. Furthermore, using a single loop structure to perform an operation on a plurality of elements also provides the ability to perform the operation concurrently on element pairs from the plurality of elements. Using a single loop can also provide the ability to perform the operation concurrently on element pairs with different element widths.

The iterator mask is used in association with a conditional statement to execute a loop structure. The iterator mask can be a bit-vector that is associated with the plurality of first elements and the plurality of second elements. The iterator mask can define the element widths of the plurality of first elements and the plurality of second elements as represented in bit-vectors. For example, the iterator mask [1000 0000, 1000 0000, 1000 0000, 1000 0000] can identify (e.g., using a 1-bit) the most significant bit for each of the elements in a first bit-vector representing a plurality of first elements and a second bit-vector representing a plurality of second elements. For example, the iterator mask [1000 0000, 1000 0000, 1000 0000, 1000 0000] can define an element width of eight bits for each of the elements represented in the first bit-vector [1010 0101, 0000 1111, 1100 0011, 0101 1010] and a second bit-vector [1010 0101, 0000 1111, 1100 0011, 0101 1010]. Each bit position in the iterator mask can correspond with a bit-position in each of the first bit-vector and the second bit-vector. For example, the eight most significant bit positions in the iterator mask [1000 0000, 1000 0000, 1000 0000, 1000 0000] can correspond with the eight most significant bit positions in the first bit-vector [1010 0101, 0000 1111, 1100 0011, 0101 1010] and the second bit-vector [1010 0101, 0000 1111, 1100 0011, 0101 1010]. For example, each bit position and/or bit in the iterator mask can be associated with a bit pair consisting of a bit from the first bit-vector and the second bit-vector. For example, the most significant bit (e.g., left most bit) in the iterator mask is associated with the most significant bit from the first bit-vector and the second bit-vector. The element widths of the element pairs in the plurality of first elements and the plurality of second elements can define the number of iterations of a loop structure. Each bit-pair in the element pairs that are associated with the iterator mask can represent an iteration of the loop structure. After each iteration of the loop structure is performed, the iterator mask can be updated by shifting bits in the iterator mask. The conditional statement can be evaluated to determine whether any of the bits in the iterator mask have a particular bit-value. If none of the bits in the iterator mask have a particular value, then the conditional statement can indicate the end of the primary operation.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "M," "N," "J," "R," "S," "U," "V," "X," "Y," and "W," particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 130 may reference element "30" in FIG. 1, and a similar element may be referenced as 230 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a memory array 130, and/or sensing circuitry 150 might also be separately considered an "apparatus."

System 100 includes a host 110 coupled to memory device 120, which includes a memory array 130. Host 110 can be a host system such as a personal laptop computer, a desktop computer, a digital camera, a mobile telephone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines (which may be referred to herein as digit lines or data lines). Although a single array 130 is shown in FIG. 1, embodiments are not so limited. For instance, memory device 120 may include a number of arrays 130 (e.g., a number of banks of DRAM cells). An example DRAM array is described in association with FIG. 2.

The memory device 120 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Controller 140 decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110. The controller 140 can be a state machine, a sequencer, or some other type of controller.

An example of the sensing circuitry 150 is described further below in association with FIG. 2. For instance, in a number of embodiments, the sensing circuitry 150 can comprise a number of sense amplifiers and a number of compute components, which may comprise an accumulator and can be used to perform logical operations (e.g., on data associated with complementary sense lines) using a loop structure in accordance with embodiments described herein. In a number of embodiments, the sensing circuitry (e.g., 150) can be used to perform a primary operation using a loop structure that incorporates a BLOCKOR operation, an AND operation, and a shift operation on data stored in array 130 and to store the results of the primary operation back to the array 130. The AND operation, the shift operation, and the storing of the results of the primary operation back to the array 130 can be performed without transferring data via a sense line address access (e.g., without firing a column decode signal). A BLOCKOR operation will be defined and examples of the BLOCKOR operations are provided in FIGS. 4A, 4B, 5A, 5B, 6, 7A and 7B. A primary operation can be performed using sensing circuitry 150 rather than and/or in addition to being performed by processing resources external to the sensing circuitry 150 (e.g., by a processor associated with host 110 and/or other processing circuitry, such as ALU circuitry, located on device 120 (e.g., on controller 140 or elsewhere)).

In various previous approaches, data associated with a primary operation, for instance, would be read from memory via sensing circuitry and provided to an external ALU. The external ALU circuitry would perform the primary operation and the result could be transferred back to the array via the local I/O lines. In contrast, in a number of embodiments of the present disclosure, sensing circuitry (e.g., 150) is configured to perform a primary operation on data stored in memory cells in memory array 130 using a loop structure that is executed in array 130 and store the result back to the array 130 without enabling a local I/O line coupled to the sensing circuitry.

As such, in a number of embodiments, registers and/or an ALU external to array 130 and sensing circuitry 150 may not be needed to perform the primary operation as the sensing circuitry 150 can perform the appropriate computations involved in performing the primary operation using the address space of memory array 130. Additionally, the primary operation can be performed without the use of an external processing resource.

Figure 2A:
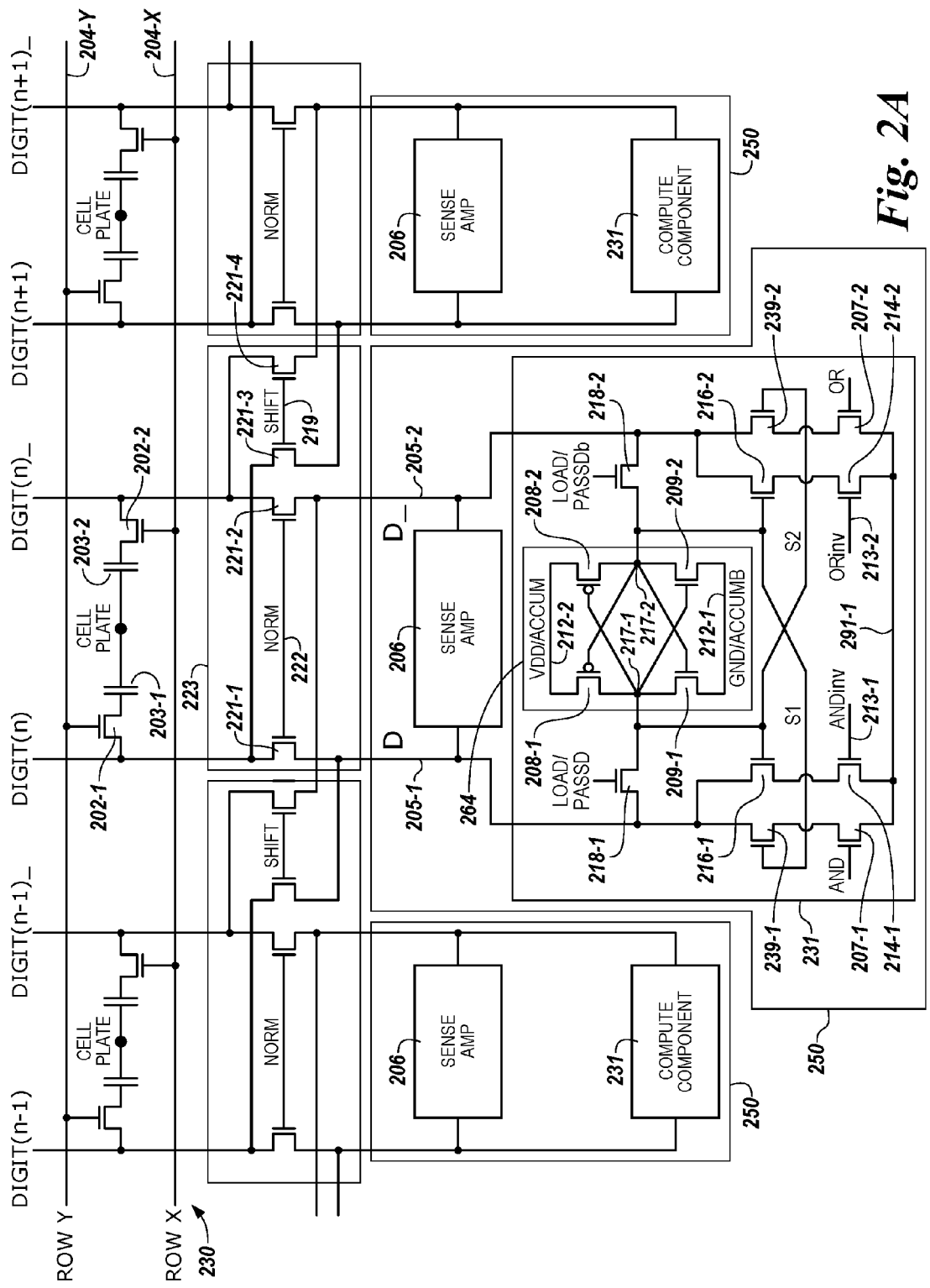
FIG. 2A illustrates a schematic diagram of a portion of a memory array in accordance with a number of embodiments of the present disclosure.

FIG. 2A illustrates a schematic diagram of a portion of a memory array 230 including sensing circuitry 250 in accordance with a number of embodiments of the present disclosure. In FIG. 2A, a memory cell comprises a storage element (e.g., capacitor) and an access device (e.g., transistor). For instance, a first memory cell comprises transistor 202-1 and capacitor 203-1 and a second memory cell comprises transistor 202-2 and capacitor 203-2. In this example, the memory array 230 is a DRAM array of 1T1C (one transistor one capacitor) memory cells; however, embodiments are not so limited. In a number of embodiments, the memory cells may be destructive read memory cells (e.g., reading the data stored in the cell destroys the data such that the data originally stored in the cell is refreshed after being read). The cells of the memory array 230 are arranged in rows coupled by word lines 204-X (Row X), 204-Y (Row Y), etc., and columns coupled by pairs of complementary data lines (e.g., DIGIT(n−1)/DIGIT(n−1)_, DIGIT(n)/DIGIT(n)_, DIGIT(n+1)/DIGIT(n+1)_). The individual data lines corresponding to each pair of complementary data lines can also be referred to as data lines 205-1 (D) and 205-2 (D_) respectively. Although only three pair of complementary data lines are shown in FIG. 2A, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-1 can be coupled to data line 205-1 (D), a second source/drain region of transistor 202-1 can be coupled to capacitor 203-1, and a gate of a transistor 202-1 can be coupled to word line 204-X. A first source/drain region of a transistor 202-2 can be coupled to data line 205-2 (D_), a second source/drain region of transistor 202-2 can be coupled to capacitor 203-2, and a gate of a transistor 202-2 can be coupled to word line 204-Y. The cell plate, as shown in FIG. 2A, can be coupled to each of capacitors 203-1 and 203-2. The cell plate can be a common node to which a reference voltage (e.g., ground) can be applied in various memory array configurations.

The memory array 230 is coupled to sensing circuitry 250 in accordance with a number of embodiments of the present disclosure. In this example, the sensing circuitry 250 comprises a sense amplifier 206 and a compute component 231 corresponding to respective columns of memory cells (e.g., coupled to respective pairs of complementary data lines). The sense amplifier 206 can comprise a cross coupled latch, which can be referred to herein as a primary latch. The sense amplifier 206 can be configured, for example, as described with respect to FIG. 2B.

In the example illustrated in FIG. 2A, the circuitry corresponding to compute component 231 comprises a static latch 264 and an additional ten transistors that implement, among other things, a dynamic latch. The dynamic latch and/or static latch of the compute component 231 can be collectively referred to herein as a secondary latch, which can serve as an accumulator. As such, the compute component 231 can operate as and/or be referred to herein as an accumulator. The compute component 231 can be coupled to each of the data lines 205-1 (D) and 205-2 (_D) as shown in FIG. 2A. However, embodiments are not limited to this example. The transistors of compute component 231 can all be n-channel transistors (e.g., NMOS transistors); however, embodiments are not so limited.

In this example, data line 205-1 can be coupled to a first source/drain region of transistors 216-1 and 239-1, as well as to a first source/drain region of load/pass transistor 218-1. Data line 205-2 can be coupled to a first source/drain region of transistors 216-2 and 239-2, as well as to a first source/drain region of load/pass transistor 218-2.

The gates of load/pass transistor 218-1 and 218-2 can be commonly coupled to a LOAD control signal, or respectively coupled to a PASSD/PASSDB control signal, as discussed further below. A second source/drain region of load/pass transistor 218-1 can be directly coupled to the gates of transistors 216-1 and 239-2. A second source/drain region of load/pass transistor 218-2 can be directly coupled to the gates of transistors 216-2 and 239-1.

A second source/drain region of transistor 216-1 can be directly coupled to a first source/drain region of pull-down transistor 214-1. A second source/drain region of transistor 239-1 can be directly coupled to a first source/drain region of pull-down transistor 207-1. A second source/drain region of transistor 216-2 can be directly coupled to a first source/drain region of pull-down transistor 214-2. A second source/drain region of transistor 239-2 can be directly coupled to a first source/drain region of pull-down transistor 207-2. A second source/drain region of each of pull-down transistors 207-1, 207-2, 214-1, and 214-2 can be commonly coupled together to a reference voltage line 291-1 (e.g., ground (GND)). A gate of pull-down transistor 207-1 can be coupled to an AND control signal line, a gate of pull-down transistor 214-1 can be coupled to an ANDinv control signal line 213-1, a gate of pull-down transistor 214-2 can be coupled to an ORinv control signal line 213-2, and a gate of pull-down transistor 207-2 can be coupled to an OR control signal line.

The gate of transistor 239-1 can be referred to as node S1, and the gate of transistor 239-2 can be referred to as node S2. The circuit shown in FIG. 2A stores accumulator data dynamically on nodes S1 and S2. Activating the LOAD control signal causes load/pass transistors 218-1 and 218-2 to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 2A is not contingent on the LOAD control signal being elevated to a voltage greater than $V_{DD}$.

The configuration of compute component 231 shown in FIG. 2A has the benefit of balancing the sense amplifier for functionality when the pull-down transistors 207-1, 207-2, 214-1, and 214-2 are conducting before the sense amplifier 206 is fired (e.g., during pre-seeding of the sense amplifier 206). As used herein, firing the sense amplifier 206 refers to enabling the sense amplifier 206 to set the primary latch and subsequently disabling the sense amplifier 206 to retain the set primary latch. Performing logical operations after equilibration is disabled (in the sense amp), but before the sense amplifier fires, can save power usage because the latch of the sense amplifier does not have to be "flipped" using full rail voltages (e.g., $V_{DD}$, GND).

Inverting transistors can pull-down a respective data line in performing certain logical operations. For example, transistor 216-1 (having a gate coupled to S2 of the dynamic latch) in series with transistor 214-1 (having a gate coupled to an ANDinv control signal line 213-1) can be operated to pull-down data line 205-1 (D), and transistor 216-2 (having a gate coupled to S1 of the dynamic latch) in series with transistor 214-2 (having a gate coupled to an ANDinv control signal line 213-2) can be operated to pull-down data line 205-2 (D_).

The latch 264 can be controllably enabled by coupling to an active negative control signal line 212-1 (ACCUMB) and an active positive control signal line 212-2 (ACCUM) rather than be configured to be continuously enabled by coupling to ground and $V_{DD}$. In various embodiments, load/pass transistors 208-1 and 208-2 can each having a gate coupled to one of a LOAD control signal or a PASSD/PASSDB control signal.

According to some embodiments, the gate of load/pass transistor 218-1 can be coupled to a PASSD control signal, and the gate of load/pass transistor 218-2 can be coupled to a PASSDb control signal. In the configuration in which the gates of transistors 218-1 and 218-2 are respectively coupled to one of the PASSD and PASSDb control signals, transistors 218-1 and 218-2 can be pass transistors. Pass transistors can be operated differently (e.g., at different times and/or under different voltage/current conditions) than load transistors. As such, the configuration of pass transistors can be different than the configuration of load transistors.

For instance, load transistors can be constructed to handle loading associated with coupling data lines to the local dynamic nodes S1 and S2, and pass transistors can be constructed to handle heavier loading associated with coupling data lines to an adjacent accumulator (e.g., through the shift circuitry 223, as shown in FIG. 2A). According to some embodiments, load/pass transistors 218-1 and 218-2 can be configured to accommodate the heavier loading corresponding to a pass transistor but be coupled and operated as a load transistor. Load/pass transistors 218-1 and 218-2 configured as pass transistors can also be utilized as load transistors. However, load/pass transistors 218-1 and 218-2 configured as load transistors may not be capable of being utilized as pass transistors.

In a number of embodiments, the compute component 231, including the latch 264, can comprise a number of transistors formed on pitch with the transistors of the corresponding memory cells of an array (e.g., array 230 shown in FIG. 2A) to which they are coupled, which may conform to a particular feature size (e.g., $4F^2$, $6F^2$, etc.). According to various embodiments, latch 264 includes four transistors 208-1, 208-2, 209-1, and 209-2 coupled to a pair of complementary data lines 205-1 and 205-2 through load/pass transistors 218-1 and 218-2. However, embodiments are not limited to this configuration. The latch 264 can be a cross coupled latch (e.g., gates of a pair of transistors, such as n-channel transistors (e.g., NMOS transistors) 209-1 and 209-2 are cross coupled with the gates of another pair of transistors, such as p-channel transistors (e.g., PMOS transistors) 208-1 and 208-2). As described further herein, the cross coupled latch 264 can be referred to as a static latch.

The voltages or currents on the respective data lines 205-1 and 205-2 can be provided to the respective latch inputs 217-1 and 217-2 of the cross coupled latch 264 (e.g., the input of the secondary latch). In this example, the latch input 217-1 is coupled to a first source/drain region of transistors 208-1 and 209-1 as well as to the gates of transistors 208-2 and 209-2. Similarly, the latch input 217-2 can be coupled to a first source/drain region of transistors 208-2 and 209-2 as well as to the gates of transistors 208-1 and 209-1.

Figure 2B:
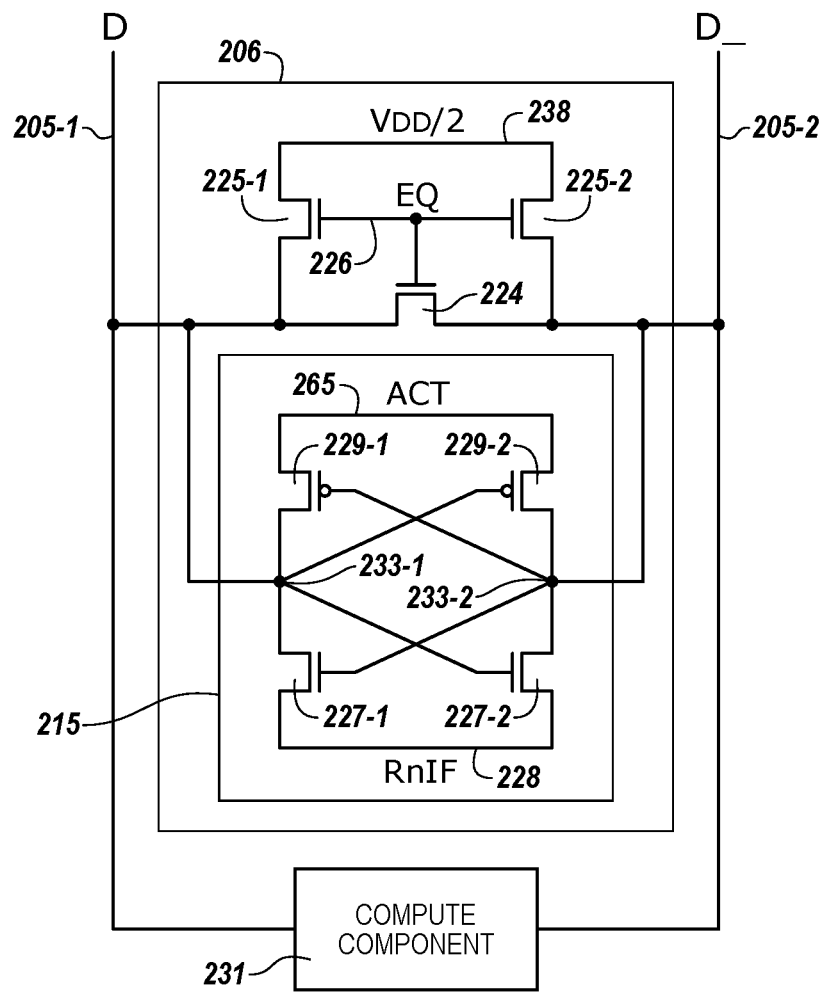
FIG. 2B illustrates a schematic diagram of a portion of a memory array in accordance with a number of embodiments of the present disclosure.

In this example, a second source/drain region of transistor 209-1 and 209-2 is commonly coupled to a negative control signal line 212-1 (e.g., ground (GND) or ACCUMB control signal similar to control signal RnIF shown in FIG. 2B with respect to the primary latch). A second source/drain region of transistors 208-1 and 208-2 is commonly coupled to a positive control signal line 212-2 (e.g., $V_{DD}$ or ACCUM control signal similar to control signal ACT shown in FIG. 2B with respect to the primary latch). The positive control signal 212-2 can provide a supply voltage (e.g., $V_{DD}$) and the negative control signal 212-1 can be a reference voltage (e.g., ground) to enable the cross coupled latch 264. According to some embodiments, the second source/drain region of transistors 208-1 and 208-2 are commonly coupled directly to the supply voltage (e.g., $V_{DD}$), and the second source/drain region of transistor 209-1 and 209-2 are commonly coupled directly to the reference voltage (e.g., ground) so as to continuously enable latch 264.

The enabled cross coupled latch 264 operates to amplify a differential voltage between latch input 217-1 (e.g., first common node) and latch input 217-2 (e.g., second common node) such that latch input 217-1 is driven to either the activated positive control signal voltage (e.g., $V_{DD}$) or the activated negative control signal voltage (e.g., ground), and latch input 217-2 is driven to the complementary (e.g., other) of the activated positive control signal voltage (e.g., $V_{DD}$) or the activated negative control signal voltage (e.g., ground).

FIG. 2B illustrates a schematic diagram of a portion of a memory array in accordance with a number of embodiments of the present disclosure. According to various embodiments, sense amplifier 206 can comprise a cross coupled latch. However, embodiments of the sense amplifier 206 are not limited to a cross coupled latch. As an example, the sense amplifier 206 can be current-mode sense amplifier and/or single-ended sense amplifier (e.g., sense amplifier coupled to one data line). Also, embodiments of the present disclosure are not limited to a folded data line architecture.

In a number of embodiments, a sense amplifier (e.g., 206) can comprise a number of transistors formed on pitch with the transistors of the corresponding compute component 231 and/or the memory cells of an array (e.g., 230 shown in FIG. 2A) to which they are coupled, which may conform to a particular feature size (e.g., $4F^2$, $6F^2$, etc.). The sense amplifier 206 comprises a latch 215 including four transistors coupled to a pair of complementary data lines 205-1 and 205-2. The latch 215 can be a cross coupled latch (e.g., gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2). As described further herein, the latch 215 comprising transistors 227-1, 227-2, 229-1, and 229-2 can be referred to as a primary latch. However, embodiments are not limited to this example.

The voltages and/or currents on the respective data lines 205-1 and 205-2 can be provided to the respective latch inputs 233-1 and 233-2 of the cross coupled latch 215 (e.g., the input of the secondary latch). In this example, the latch input 233-1 is coupled to a first source/drain region of transistors 227-1 and 229-1 as well as to the gates of transistors 227-2 and 229-2. Similarly, the latch input 233-2 can be coupled to a first source/drain region of transistors 227-2 and 229-2 as well as to the gates of transistors 227-1 and 229-1. The compute component 231 (e.g., accumulator) can be coupled to latch inputs 233-1 and 233-2 of the cross coupled latch 215 as shown; however, embodiments are not limited to the example shown in FIG. 2B.

In this example, a second source/drain region of transistor 227-1 and 227-2 is commonly coupled to an active negative control signal 228 (RnIF). A second source/drain region of transistors 229-1 and 229-2 is commonly coupled to an active positive control signal 265 (ACT). The ACT signal 265 can be a supply voltage (e.g., $V_{DD}$) and the RnIF signal can be a reference voltage (e.g., ground). Activating signals 228 and 265 enables the cross coupled latch 215.

The enabled cross coupled latch 215 operates to amplify a differential voltage between latch input 233-1 (e.g., first common node) and latch input 233-2 (e.g., second common node) such that latch input 233-1 is driven to one of the ACT signal voltage and the RnIF signal voltage (e.g., to one of $V_{DD}$ and ground), and latch input 233-2 is driven to the other of the ACT signal voltage and the RnIF signal voltage.

The sense amplifier 206 can also include circuitry configured to equilibrate the data lines 205-1 and 205-2 (e.g., in association with preparing the sense amplifier for a sensing operation). In this example, the equilibration circuitry comprises a transistor 224 having a first source/drain region coupled to a first source/drain region of transistor 225-1 and data line 205-1. A second source/drain region of transistor 224 can be coupled to a first source/drain region of transistor 225-2 and data line 205-2. A gate of transistor 224 can be coupled to gates of transistors 225-1 and 225-2.

The second source drain regions of transistors 225-1 and 225-2 are coupled to an equilibration voltage 238 (e.g., $V_{DD}/2$), which can be equal to $V_{DD}/2$, where $V_{DD}$ is a supply voltage associated with the array. The gates of transistors 224, 225-1, and 225-2 can be coupled to control signal 225 (EQ). As such, activating EQ enables the transistors 224, 225-1, and 225-2, which effectively shorts data line 205-1 to data line 205-2 such that the data lines 205-1 and 205-2 are equilibrated to equilibration voltage $V_{DD}/2$. According to various embodiments of the present disclosure, a number of logical operations using a loop structure as described herein can be performed using the sense amplifier, and storing the result in the compute component (e.g., accumulator).

As shown in FIG. 2A, the sense amplifier 206 and the compute component 231 can be coupled to the array 230 via shift circuitry 223. In this example, the shift circuitry 223 comprises a pair of isolation devices (e.g., isolation transistors 221-1 and 221-2) coupled to data lines 205-1 and 205-2, respectively). The isolation transistors 221-1 and 221-2 are coupled to a control signal 222 (NORM) that, when activated, enables (e.g., turns on) the isolation transistors 221-1 and 221-2 to couple the corresponding sense amplifier 206 and compute component 231 to a corresponding column of memory cells (e.g., to a corresponding pair of complementary data lines 205-1 and 205-2. According to various embodiments, conduction of isolation transistors 221-1 and 221-2 can be referred to as a "normal" configuration of the shift circuitry 223.

In the example illustrated in FIG. 2A, the shift circuitry 223 includes another (e.g., a second) pair of isolation devices (e.g., isolation transistors 221-3 and 221-4) coupled to a complementary control signal 219 (SHIFT), which can be activated, for example, when NORM is deactivated. The isolation transistors 221-3 and 221-4 can be operated (e.g., via control signal 219) such that a particular sense amplifier 206 and compute component 231 are coupled to a different pair of complementary data lines (e.g., a pair of complementary data lines different than the pair of complementary data lines to which isolation transistors 221-1 and 221-2 couple the particular sense amplifier 206 and compute component 231), or can couple a particular sense amplifier 206 and compute component 231 to another memory array (and isolate the particular sense amplifier 206 and compute component 231 from a first memory array). According to various embodiments, the shift circuitry 223 can be arranged as a portion of (e.g., within) the sense amplifier 206, for instance.

Although the shift circuitry 223 shown in FIG. 2A includes isolation transistors 221-1 and 221-2 used to couple particular sensing circuitry 250 (e.g., a particular sense amplifier 206 and corresponding compute component 231) to a particular pair of complementary data lines 205-1 and 205-2 (e.g., DIGIT(n) and DIGIT(n)_) and isolation transistors 221-3 and 221-4 are arranged to couple the particular sensing circuitry 250 to an adjacent pair of complementary data lines in one particular direction (e.g., adjacent data lines DIGIT(n+1) and DIGIT(n+1)_ shown to the right in FIG. 2A), embodiments of the present disclosure are not so limited. For instance, shift circuitry can include isolation transistors 221-1 and 221-2 used to couple particular sensing circuitry to a particular pair of complementary data lines (e.g., DIGIT(n) and DIGIT(n)_ and isolation transistors 221-3 and 221-4 arranged so as to be used to couple the particular sensing circuitry to an adjacent pair of complementary data lines in another particular direction (e.g., adjacent data lines DIGIT(n−1) and DIGIT(n−1)_ shown to the left in FIG. 2A).

Embodiments of the present disclosure are not limited to the configuration of shift circuitry 223 shown in FIG. 2A. In a number of embodiments, shift circuitry 223 such as that shown in FIG. 2A can be operated (e.g., in conjunction with sense amplifiers 206 and compute components 231) in association with performing various operations (e.g., logical and/or arithmetic operations) without transferring data out of the sensing circuitry 250 via an I/O line (e.g., I/O line 334 shown in FIG. 3), for instance. Although shift circuitry 223 is shown to be separate from sensing circuitry 250 (e.g., sensing circuitry 150 in FIG. 1), shift circuitry 223 can be considered to be part of sensing circuitry 250 (e.g., sensing circuitry 150 in FIG. 1).

Although not shown in FIG. 2A, each column of memory cells can be coupled to a column decode line (e.g., decode lines 310-0 to 310-W shown in FIG. 3) that can be activated to transfer, via local I/O line (e.g., I/O line 334 shown in FIG. 3), a data value from a corresponding sense amplifier 206 and/or compute component 231 to a control component external to the array such as an external processing resource (e.g., host processor and/or other functional unit circuitry). The column decode line can be coupled to a column decoder (e.g., column decoder 152 shown in FIG. 1). However, as described herein, in a number of embodiments, data need not be transferred via such I/O lines to perform logical operations in accordance with embodiments of the present disclosure. In a number of embodiments, shift circuitry 223 can be operated in conjunction with sense amplifiers 206 and compute components 231 to perform various operations (e.g., logical operations in association with performing subtraction, addition, multiplication, division, etc.) without transferring data to a control component external to the array, for instance.

The sensing circuitry 250 can be operated in several modes to perform logical operations, including a first mode in which a result of the logical operation is initially stored in the sense amplifier 206, and a second mode in which a result of the logical operation is initially stored in the compute component 231. Operation of the sensing circuitry 250 in the first mode is described below with respect to FIGS. 8 and 9, and operation of the sensing circuitry 250 in the second mode is described below with respect to FIGS. 10-13. Additionally with respect to the first operating mode, sensing circuitry 250 can be operated in both pre-sensing (e.g., sense amps fired before logical operation control signal active) and post-sensing (e.g., sense amps fired after logical operation control signal active) modes with a result of a logical operation being initially stored in the sense amplifier 206.

As described further below, the sense amplifier 206 can, in conjunction with the compute component 231, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations using less power than various previous approaches. Additionally, since a number of embodiments eliminate the need to transfer data across I/O lines (e.g., between memory and discrete processor) in order to perform various operations (e.g., compute functions), a number of embodiments can enable an increased parallel processing capability as compared to previous approaches.

Figure 3:
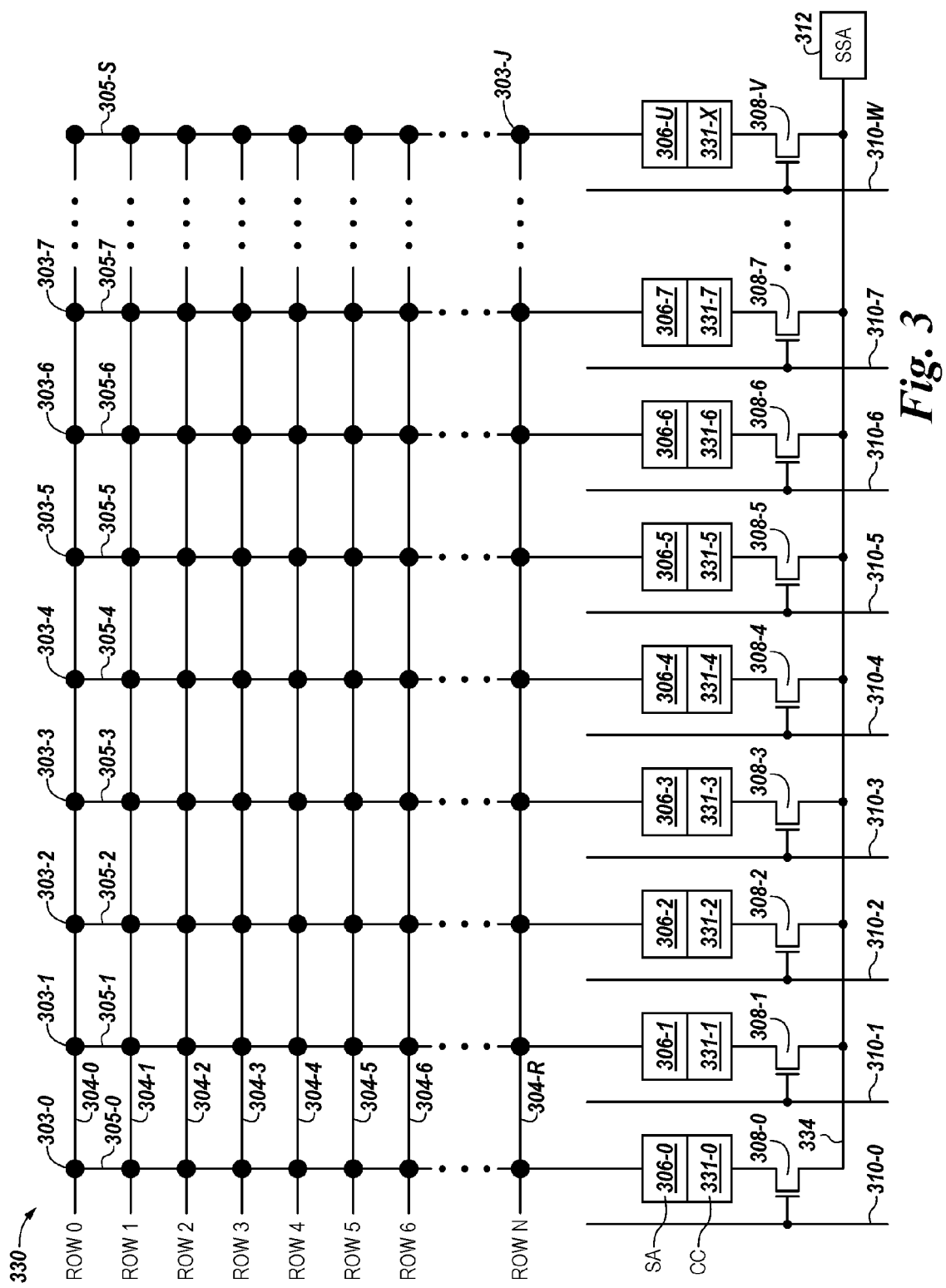
FIG. 3 illustrates a schematic diagram of a portion of a memory array in accordance with a number of embodiments of the present disclosure.

FIG. 3 illustrates a schematic diagram of a portion of a memory array 330 in accordance with a number of embodiments of the present disclosure. The array 330 includes memory cells 303-0, 303-1, 303-3, 303-4, 303-5, 303-6, 303-7, 303-8, . . . , 303-J (e.g., referred to generally as memory cells 303), coupled to rows of access lines 304-0, 304-1, 304-2, 304-3, 304-4, 304-5, 304-6, . . . , 304-R and columns of sense lines 305-0, 305-1, 305-2, 305-3, 305-4, 305-5, 305-6, 305-7, . . . , 305-S, which may be referred to generally as access lines 304 and sense lines 305. Memory array 330 is not limited to a particular number of access lines and/or sense lines, and use of the terms "rows" and "columns" does not intend a particular physical structure and/or orientation of the access lines and/or sense lines. Although not pictured, each column of memory cells can be associated with a corresponding pair of complementary sense lines (e.g., complementary sense lines 205-1 and 205-2 in FIG. 2A).

Each column of memory cells can be coupled to sensing circuitry (e.g., sensing circuitry 150 shown in FIG. 1 and sensing circuitry 250 shown in FIG. 2A). In this example, the sensing circuitry comprises a number of sense amplifiers 306-0, 306-1, 306-2, 306-3, 306-4, 306-5, 306-6, 306-7, . . . , 306-U (e.g., referred to generally as sense amplifiers 306) coupled to the respective sense lines 305-0, 305-1, 305-2, 305-3, 305-4, 305-5, 305-6, 305-7, . . . , 305-S. The sense amplifiers 306 are coupled to input/output (I/O) line 334 (e.g., a local I/O line) via access devices (e.g., transistors) 308-0, 308-2, 308-3, 308-4, 308-5, 308-6, 308-7, . . . , 308-V. In this example, the sensing circuitry also comprises a number of compute components 331-0, 331-2, 331-3, 331-4, 331-5, 331-6, 331-7, . . . , 331-X (e.g., referred to generally as compute components 331) coupled to the respective sense lines. Column decode lines 310-0 to 310-W are coupled to the gates of transistors 308-0 to 308-V, respectively, and can be selectively activated to transfer data sensed by respective sense amplifiers 306-0 to 306-U and/or stored in respective compute components 331-0 to 331-X to a secondary sense amplifier 312 and/or to processing resources external to array 330 (e.g., via I/O line 334). In a number of embodiments, the compute components 331 can be formed on pitch with the memory cells of their corresponding columns and/or with the corresponding sense amplifiers 306.

The sensing circuitry (e.g., compute components 331 and sense amplifiers 306) is configured to perform a primary operation in accordance with a number of embodiments described herein. The example described in association with FIGS. 4A-4B, FIGS. 5A-5B, FIG. 6, and FIGS. 7A-7B demonstrate how a primary operation can be performed using a loop structure as described herein on elements stored in an array such as array 330.

As described below, the elements can be stored such that each of a number of elements (e.g., data corresponding to logic "1" or logic "0") are stored in memory cells commonly coupled to one of a respective number sense lines (e.g., 305-0 to 305-S). For example, a plurality of first elements can be stored in a group of memory cells coupled to access line 304-0 and a plurality of second elements can be stored in a group of memory cells coupled to access line 304-1. In a number of embodiments, an operation can be performed on a number of elements. The elements can also be commonly coupled to a number of sense lines (e.g., 305-0 to 304-R). For instance, consider a plurality of first elements such that each of the first elements is stored in a group of eight memory cells commonly coupled to access line 304-0. Also consider a plurality of second elements such that each of the second elements is stored in a group of eight memory cells commonly coupled to access line 304-1. In this example, a first element in the plurality of first elements and a first element in the plurality of second elements are stored in memory cell that are commonly coupled to a first group of sense lines (e.g., 305-0 to 305-7), a second element in the plurality of first elements and a second element in the plurality of second elements are stored in memory cell that are commonly coupled to a second group of sense lines (e.g., 305-8 to 305-15), a third element in the plurality of first elements and a third element in the plurality of second elements are stored in memory cell that are commonly coupled to a third group of sense lines (e.g., 305-16 to 305-23), a fourth element in the plurality of first elements and a fourth element in the plurality of second elements are stored in memory cell that are commonly coupled to a fourth group of sense lines (e.g., 305-24 to 305-31), FIGS. 4A-4B illustrate a table showing the states of memory cells of a portion of an array at a number of iterations associated with a loop structure for performing operations in memory in accordance with a number of embodiments of the present disclosure. Column 496 of the table provides reference numbers (e.g., 1-10) for the rows of the table, and the reference numbers shown in the table correspond to the respective reference numbers of the pseudo code described below. The bit-vector values for each of the bit-vectors 476 (ITERATOR_MASK), 478 (STATIC_MASK), 488 (ELEMENT_MASK), are stored in an array such as array 330 in FIG. 3 at various phases corresponding to reference numbers 1-10.

The bit-vectors 476, 478, and 488 can be stored in respective groups of memory cells coupled to particular access lines, which may be referred to as temporary storage rows (e.g., rows that store data that may be updated during various iterations of the primary operation). The Element_Width 490, the plurality of first elements, and the plurality of second elements (not shown) can be referred to as vector arguments. FIGS. 4A-4B also indicate the bit-vector values for a bit-vector 431 (Comp_Comp) stored in compute components (e.g., 331 shown in FIG. 3) of the array. As used herein, the plurality of first elements and the plurality of second elements can correspond to bit-vectors that contain the values (e.g., decimal values) of the plurality of first elements and the plurality of second elements, respectively. As previously stated, a primary operation can be performed on the first elements and the second elements.

Examples of bit-vectors representing the plurality of first elements and the plurality of second elements are not shown in FIGS. 4A-4B, 5A-5B, 6, and 7A-7B. Rather, the examples described in association with FIGS. 4A-4B, 5A-5B, 6, and 7A-7B describe a loop structure that can be executed in association with performing a plurality of different primary operations and which is generic with respect to the values of the plurality of first and/or second elements. As such, an example is described in which bit-vectors 476, 478, 488, and 490 are used in association with executing a loop structure as described herein.

In FIGS. 4A-4B, 5A-B, 6, and 7A-7B the values of the bit-vectors (e.g., bit-vectors 476, 478, 488, 490) are shown in hexadecimal format although the corresponding bit-vectors operated on during the primary operation can be stored as binary bit patterns in the array. For example, an ELEMENT_MASK 488 (e.g., [1000 0000, 1000 0000, 1000 0000, 1000 0000] can be represented as [80, 80, 80, 80] in hexadecimal format. The values shown in FIGS. 4A-4B, 5A-B, 6, and 7A-7B are shown in hexadecimal format for ease of reference.

In the examples used herein, bit-vector values may include commas and/or spaces for ease of reference. For instance, a bit-vector represented in hexadecimal notation as [7F, 7F, 7F, 7F] can correspond to four 8-bit wide bit-vectors, with the four bit-vectors separated by a respective comma and space. However, the same bit-vector can be represented as [7F 7F 7F 7F] (e.g., without commas) and/or as [7F7F7F7F] (e.g., without commas and without spaces). As used herein, an N-bit wide bit-vector refers to a vector having a length of N bits (e.g., the terms length and width are used interchangeably with respect to the size of a bit-vector, such that a 4-bit wide bit-vector has a length of 4-bits).

In FIGS. 4A-4B, 5A-B, 6, and 7A-7B changes to the bit-vectors corresponding to Comp_Comp 431 and the bit-vectors corresponding to the temporary storage rows (e.g., ITERATOR_MASK 476, STATIC_MASK 478, and ELEMENT_MASK 488) are indicated in bold font. For example, at reference 1, Comp_Comp 431 is shown in bold font indicating values of the bit-vector has changed during a number of operations associated with the reference number 1.

In the example shown in FIGS. 4A-4B and 5A-5B, each of plurality of first elements and the plurality of second elements comprise four elements with a same element width 490 and are associated with four separate primary operations. The four separate primary operations can be performed in parallel. Performing a number of operations in parallel includes performing the number of operations in single instruction multiple data (SIMD) fashion. As used herein, SIMD is defined as performing a same operation on multiple elements in parallel (e.g., simultaneously).

For example, a first primary operation is performed on elements in a first element pair from the plurality of first elements and the plurality of second elements. A second primary operation is performed on elements in a second element pair from the plurality of first elements and the plurality of second elements simultaneously with the first primary operation. A third primary operation is performed on elements in a third element pair from the plurality of first elements and the plurality of second elements simultaneously with the first primary operation and the second primary operation. A fourth primary operation is performed on elements in a fourth element pair from the plurality of first elements and the plurality of second elements simultaneously with the first primary operation, the second primary operation, and the third primary operation.

A first group of memory cells that store the plurality of first elements can be cells coupled to a particular access line (e.g., 304-0 in FIG. 3) and to a number of sense lines (e.g., 305-0 to 305-31 in FIG. 3). The second group of memory cells that store the plurality of second elements can be cells coupled to a different particular access line (e.g., 304-1 in FIG. 3) and to a number of sense lines (e.g., 305-0 to 305-31 in FIG. 3).

The four elements of the plurality of first elements can be stored in the first group of memory cells. For example, a fourth element of the plurality of first elements can be stored in memory cells that are coupled to access line 304-0 and sense lines 305-24 to 305-31 in FIG. 3, a third element can be stored in memory cells that are coupled to access line 304-0 and sense lines 305-16 to 305-23 in FIG. 3, a second element can be stored in memory cells that are coupled to access line 304-0 and sense lines 305-8 to 305-15 in FIG. 3, and a first element can be stored in memory cells that are coupled to access line 304-0 and sense lines 305-0 to 305-7 in FIG. 3.

The four elements of the plurality of second elements can be stored in the second group of memory cells. For example, a fourth element of the plurality of second elements can be stored in memory cells that are coupled to access line 304-1 and sense lines 305-24 to 305-31, a third element can be stored in memory cells that are coupled to access line 304-1 and sense lines 305-16 to 305-23, a second element can be stored in memory cells that are coupled to access line 304-1 and sense lines 305-8 to 305-15, and a first element can be stored in memory cells that are coupled to access line 304-1 and sense lines 305-0 to 305-7.

ITERATOR_MASK 476, STATIC_MASK 478, and ELEMENT_MASK 488 include bit-vectors that are stored in a plurality of groups of memory cells. For instance, ITERATOR_MASK 476, STATIC_MASK 478, and ELEMENT_MASK 488 can be stored in memory cells that are coupled to respective access lines 304-2 to 304-4 and to sense lines 305-0 to 305-31.

The ITERATOR_MASK 476 is used in association with executing a loop structure associated with performing the primary operation and can indicate a quantity of iterations of the loop structure executed to perform the primary operation. In a number of examples, the ITERATOR_MASK 476 includes a plurality of groups of bits that are associated with a plurality of element pairs from the plurality of first elements and the plurality of second elements. Each element in an element pair can have a same element width and an associated group from the ITERATOR_MASK 476 can have a same quantity of bits as the element width. Each of the plurality of groups of bits can be used to identify a quantity of iterations that need to be performed for an associated element pair. For example, if a group of bits is composed of eight bits, then a primary operation performed on an associated element pair includes performing eight iterations of a loop structure. In a number of examples, the quantity of bits in a group with the greatest quantity of bits from the plurality of groups can indicate the quantity of iterations associated with a loop structure used to perform the primary operation.

For example, an ITERATOR_MASK 476 (e.g., [80,80, 80,80]) can be associated with a plurality of first elements (e.g., [34,28,92,45] in hexadecimal format, and [0011 0100, 0010 1000, 1001 0010, 0100 0101 in binary format) and a plurality of second elements (e.g., [F4,AA,12,1E] in hexadecimal format, and 1111 0100, 1010 1010, 0001 0010, 0001 1110 in binary format). All subsequent data examples will be in hexadecimal format unless otherwise noted. The first group of bits in the ITERATOR_MASK 476 (e.g., [80,80, 80,80]) can be associated with the first element pair (e.g., [34, F4)] from the plurality of first elements (e.g., [34,28, 92,45]) and a plurality of second elements (e.g., [F4,AA, 12,1E]). The second group of bits in the ITERATOR_MASK 476 (e.g., [80,80,80,80]) can be associated with the second element pair (e.g., [28, AA)] from the plurality of first elements (e.g., [34,28,92,45]) and a plurality of second elements (e.g., [F4,AA,12,1E]). The third group of bits in the ITERATOR_MASK 476 (e.g., [80,80,80,80]) can be associated with the third element pair (e.g., [92,12]) from the plurality of first elements (e.g., [34,28,92,45]) and a plurality of second elements (e.g., [F4,AA,12,1E]). The fourth group of bits in the ITERATOR_MASK 476 (e.g., [80,80,80,80]) can be associated with the fourth element pair (e.g., [45, 1E]) from the plurality of first elements (e.g., [34,28,92,45]) and a plurality of second elements (e.g., [F4,AA,12,1E]). In the above example, each of the elements in the plurality of first elements and the plurality of second elements has an element width of eight binary bits. As such, each group of bits in the ITERATOR_MASK 476 includes eight bits and a loop structure associated with a primary operation that is performed on the plurality of first elements and the plurality of second elements can include eight iterations.

As an example, the plurality of first elements, the plurality of second elements, and the bit-vectors 476, 478, 488 can be stored in the cells coupled to sense lines 305-0 to 305-31. In this example, bits stored in memory cells coupled to sense line 305-0 are a most significant bit (MSB), bits stored in memory cells coupled to sense line 305-1 are a next least significant bit (LSB), . . . , and bits stored in memory cells coupled to sense line 305-31 are a LSB.

However, embodiments are not limited to this example. For instance, elements can be represented by bit-vectors having a length other than 8-bits. As an example, a first 64-bit wide bit-vector could represent four elements each represented by a 16-bit wide bit-vector and could be stored in cells coupled to access line 304-0 (and to sense lines 305-0 to 305-63), and a second 64-bit wide bit-vector could represent four elements each represented by a 16-bit wide bit vector and could be stored in cells coupled to access line 304-1 (and to sense lines 305-0 to 305-63). A primary operation can be performed on the four elements represented by the first 64-bit wide bit-vector and respective four elements represented by the second 64-bit wide bit-vector in accordance with embodiments described herein.

In another example, a first 32-bit wide bit-vector could represent four elements having different lengths. For instance, a first element can be represented by an 8-bit wide bit-vector, a second element can be represented by a 4-bit wide bit-vector, a third element can be represented by a 12-bit wide bit-vector, and a fourth element can be represented by an 8-bit wide bit-vector and the four elements could be stored in cells coupled to access line 304-0 (and to sense lines 305-0 to 305-31). A second 32-bit wide bit-vector could also represent four elements corresponding to respective elements of the first 32-bit wide bit-vector. For example, a first element can be represented by an 8-bit wide bit-vector, a second element can be represented by a 4-bit wide bit-vector, a third element can be represented by a 12-bit wide bit-vector, and a fourth element can be represented by an 8-bit wide bit-vector and could be stored in cells coupled to access line 304-1 (and to sense lines 305-0 to 305-31). A primary operation can be performed on the four elements represented by the first 32-bit wide bit-vector and on the respective four elements represented by the second 32-bit wide bit-vector in accordance with embodiments described herein. Element pairs from the first 32-bit wide bit-vector and the second 32-bit wide bit-vector can have a same element length. In a number of embodiments, the result of a primary operation can be stored in a third group of memory cells, which can be cells coupled to a number of particular access lines (e.g., 304-0 to 304-R in FIG. 3).

The below pseudo code represents instructions executable to perform a primary operation by executing a loop structure as described herein in a memory in accordance with a number of embodiments of the present disclosure. The example pseudo code is referenced using reference numbers 1-10, which correspond to the respective reference numbers 1-10 shown in column 496 of the table shown in FIGS. 4A-4B. For example, reference number one (1) corresponds to "set_acc( )" in the below pseudo code, and reference number two (2) corresponds to "shift_accip(RIGHT, ZERO, 1)" in the below pseudo code.

```
1.      set_acc( );
2.      shift_accip(RIGHT, ZERO, 1);
3.      inv_to_row_acc(ELEMENT_MASK);
4.      for (len_t e = 0; e < elements – 1; e++) {
4.a         shift_accip(RIGHT, ZERO, ELEMENT_WIDTH);
4.b         row_OR_accip(ELEMENT_MASK);
        }
5.      row_write(ELEMENT_MASK);
6.      acc_inv_to_row(STATIC_MASK);
7.      row_to_acc(ELEMENT_MASK);
8.      shift_accip(RIGHT, ZERO, 1);
9.      acc_to_row(ITERATOR_MASK);
10.     while (acc_blockor( )) {
10.a        [[ COMPUTATION Logic requiring Looping ]]
10.b        row_to_acc(ITERATOR_MASK);
10.c        acc_shift(RIGHT, ZERO, 1);
10.d        acc_AND_row_accip(STATIC_MASK);
        }
```

The pseudo code corresponding to reference numbers 1-5 is associated with creating the ELEMENT_MASK 488. As used herein, the ELEMENT_MASK 488 identifies the most significant bit from each of the element pairs from the plurality of first elements and the plurality of second elements on which a primary operation is performed.

The pseudo code corresponding to reference number 1 (e.g., "set_acc( )") is associated with storing the bit-vector [FF,FF,FF,FF] in the sensing circuitry (e.g., compute components 331 and/or sense amplifiers 306). The pseudo code corresponding to reference number 2 (e.g., "shift_accip (RIGHT, ZERO, 1)") is associated with performing a right shift operation on Comp_Comp 431 that is stored in the sensing circuitry. As used herein, performing a right shift operation is associated with shifting bits in a particular bit-vector towards the LSB in the particular bit-vector. Performing a left shift operation is associated with shifting bits in the particular bit-vector towards a MSB in the particular bit-vector. The result of the rights shift operation is a bit-vector [7F,FF,FF,FF], as shown in FIG. 4A (e.g., COMP_COMP 431 has a value of [7F,FF,FF,FF] as shown at reference number 2 in FIG. 4A).

The pseudo code corresponding to reference number 3 (e.g., "inv_to_row_accip(ELEMENT_MASK)") is associated with performing an invert operation on Comp_Comp 431 and storing the result of the invert operation in the memory cells that store the ELEMENT_MASK 488. Performing an invert operation on Comp_Comp 431 results in a bit-vector that identifies the most significant bit in the plurality of first elements and the plurality of second elements. In this example, performing an invert operation on bit-vector 431 (e.g., [7F,FF,FF,FF]) results in bit-vector [80,00,00,00], which is stored as binary bit-vector [1000 000, 0000 0000, 0000 0000, 0000 0000] in the memory cells used to store the ELEMENT_MASK 488. The hexadecimal bit-vector [80, 00,00,00] (e.g., binary bit-vector [1000 000, 0000 0000, 0000 0000, 0000 0000]) identifies the most significant bit in the plurality of first elements and the plurality of second elements.

The pseudo code corresponding to reference number 4 (e.g., "for (len_t e=0; e<elements-1; e++)") is associated with performing a "FOR" loop to identify the most significant bit in each element pair from the plurality of first elements and the plurality of second elements using the ELEMENT_MASK 488. The "FOR" loop associated with reference number 5 iterates through the quantity of element pairs (e.g., elements). In a number of examples, the quantity of element pairs (e.g., the quantity of element in the plurality of first elements and/or the plurality of second elements) is provided by a host such as host 110 in FIG. 1. In FIGS. 4A-4B, the quantity of elements is equal to four elements. However, only the most significant bit associated with three element pairs needs to be identified due to the previous identification of the MSB (e.g., [80,00,00,00]) of the plurality of first elements and the plurality of second elements. As such, the "FOR" loop performs three iterations using "e" as a counter. "e" is set to zero (e.g., 0) in the first iteration of the "FOR" loop and is incremented (e.g., "e++") by one (e.g., 1) before each subsequent iteration of the "FOR" loop. The "FOR" loop terminates (e.g., ends) when "e" is greater than or equal to 3 (e.g., "e<element-1").

The pseudo code corresponding to reference number 4.*a* (e.g., "shift_accip(RIGHT, ZERO, ELEMENT_WIDTH)") is associated with performing a right shift operation during each iteration of the "FOR" loop referenced in association with reference number 4. The right shift operation shifts the bits in the Comp_Comp bit-vector 431 towards the LSB in the Comp_Comp bit-vector 431 a quantity of times equal to the ELEMENT_WIDTH, which is equal to eight in this example. For example, in a first iteration of the "FOR" loop the right shift operation associated with reference number 4.*a* shifts the Comp_Comp bit-vector 431 [80,00,00,00] resulting in the bit-vector [00,80,00,00] being stored in the sensing circuitry as Comp_Comp 431. In a second iteration of the "FOR" loop the right shift operation associated with reference number 4.*a* shifts the Comp_Comp bit-vector 431 [80,80,00,00] resulting in the bit-vector [00,80,80,00] being stored in the sensing circuitry as Comp_Comp 431. In a third iteration of the "FOR" loop the right shift operation associated with reference number 4.*a* shifts the Comp_Comp bit-vector 431 [80,80,80,00] resulting in the bit-vector [00, 80,80,80] being stored in the sensing circuitry as Comp_ Comp 431.

The pseudo code corresponding to reference number 4.*b* (e.g., "row_OR_accip(ELEMENT_MASK)") is associated with performing an OR operation on Comp_Comp 431 and ELEMENT_MASK 488. As used herein, performing an OR operation on a first and second bit-vector can include performing, in parallel, the logical operation on each of the respective bits at corresponding bit positions of the bit-vectors. As an example, performing an OR operation can include performing an OR operation on a first bit-vector "a" (e.g., [$a_0$ $a_1$ $a_2$ $a_3$ $a_4$ $a_5$ $a_6$ $a_7$]) and a second bit-vector "b" (e.g., [$b_0$ $b_1$ $b_2$ $b_3$ $b_4$ $b_5$ $b_6$ $b_7$]). Performing an OR operation on "a" and "b" results in a bit-vector "c" (e.g., [$c_0$ $c_1$ $c_2$ $c_3$ $c_4$ $c_5$]), wherein $c_0=a_0$ OR $b_0$, $c_1=a_1$ OR $b_1$, $c_2=a_2$ OR $b_2$, $c_3=a_3$ OR $b_3$, $c_4=a_4$ OR $b_4$, $c_5=a_5$, $c_6=a_6$ OR $b_6$, $c_7=a_7$ OR $b_7$, OR $b_7$. Examples of performing OR and AND operations are described in FIGS. 8-13.

For example, in the first iteration of the "FOR" loop, the OR operation associated with reference number 4.*b* is performed on Comp_Comp bit-vector 431 [00,80,00,00] and ELEMENT_MASK bit-vector 488 [80,00,00,00] resulting in the bit-vector [80,80,00,00] being stored in the sensing circuitry as Comp_Comp 431. In the second iteration of the "FOR" loop, the OR operation associated with reference number 4.*b* is performed on the Comp_Comp bit-vector 431 [00,80,80,00] and the ELEMENT_MASK bit-vector 488 [80,00,00,00] resulting in the bit-vector [80,80,80,00] being stored in the sensing circuitry as Comp_Comp 431. In the third iteration of the "FOR" loop, the OR operation associated with reference number 4.*b* is performed on the Comp_Comp bit-vector 431 [00,80,80,80] and the ELEMENT_ MASK bit-vector 488 [80,00,00,00] resulting in the bit-vector [80,80,80,80] being stored in the sensing circuitry as Comp_Comp 431.

The pseudo code corresponding to reference number 5 (e.g., "row_write(ELEMENT_MASK)") is associated with writing the data pattern stored in the sensing circuitry (e.g., bit-vector 431) to the cells storing the ELEMENT_MASK bit-vector 488. As such, the bit-vector [80,80,80,80] is stored in the memory cells that store the ELEMENT_MASK bit-vector 488.

The pseudo code corresponding to reference number 6 (e.g., "acc_inv_to_row(STATIC_MASK)") is associated with performing an invert operation to create the STATIC_ MASK 478. The invert operation is performed on Comp_ Comp 431. Comp_Comp 431 is a bit-vector [80,80,80,80] before the invert operation. The result of the invert operation is a bit-vector [7F,7F,7F,7F]. The result of the invert operation is stored in the memory cells that store STATIC_MASK 478. The STATIC_MASK 478 is used to prevent bits that are associated with a particular element-pair from the plurality of first elements and the plurality of second elements from being shifted to bits that are associated with a different element-pair.

The pseudo code corresponding to reference number 7 (e.g., "row_to_acc(ELEMENT_MASK)") is associated with writing the ELEMENT_MASK 488 in the sensing circuitry as bit-vector 431. The pseudo code corresponding to reference number 8 (e.g., "shift_accip(RIGHT, ZERO, 1)") is associated with performing a right shift operation on Comp_Comp 431 to indicate a first iteration of the loop structure associated with reference number 10. The Comp_Comp bit-vector 431 is a bit-vector [80,80,80,80] (e.g., binary

[10000000, 10000000, 10000000, 10000000] before performing the right shift operation and a bit-vector [40,40,40, 40] (e.g., binary [01000000, 01000000, 01000000, 01000000] after performing the right shift operation. The result of the right shift operation is stored in the sensing circuitry as bit-vector 431.

The pseudo code corresponding to reference number 9 (e.g., "acc_to_row(ITERATOR_MASK)") is associated with writing the data pattern stored in the sensing circuitry (e.g., bit-vector 431) to the cells storing the ITERATOR_ MASK bit-vector 476 in preparation for performing the loop structure corresponding to reference number 10. The pseudo code corresponding to reference number 10 (e.g., "while (acc_blockor( ))") is associated with performing a loop structure using the Comp_Comp bit-vector 431.

The loop structure associated with reference number 10 can be a "WHILE" loop or a "FOR" loop. However, the loop structure associated with reference number 10 is not limited to a "WHILE" loop and/or a "FOR" loop. In the example given in FIGS. 4A-4B, 5A-5B, 6, and 7A-7B, the loop structure is a "WHILE" loop. The "WHILE" loop is implemented using a BLOCKOR as a conditional statement. For example, a number of operations can be performed repeatedly while a BLOCKOR operation returns a true value (e.g., a "1"). A BLOCKOR operation can be performed on the vector 431 (e.g., vector stored in compute component 331 in FIG. 3).

As used herein, a BLOCKOR operation refers to an operation that can be performed to determine whether one or more (e.g., any) bits of a particular bit-vector (e.g., bit-vector 431) are a particular value (e.g., a "1"). For instance, a BLOCKOR operation can be performed to determine whether one or more bits of a bit-vector stored in the sensing circuitry (e.g., in the compute components and/or sense amplifiers storing bit-vector 431) are a particular value. The BLOCKOR operation can be performed using an I/O line (e.g., 334) and a secondary sense amplifier (e.g., 312 in FIG. 3), for example.

Performing a BLOCKOR operation, can include, for example, activating, in parallel, the column decode lines (e.g., 310-1 to 310-W) coupled to the selected sensing circuitry (e.g., sense amplifiers 306 and/or compute components 331), such that respective transistors 308-1 to 308-V are turned on in order to transfer the voltages of the components of the sensing circuitry (e.g., sense amplifiers 306 and/or compute components 331) to the local I/O line (e.g., 334). The secondary sense amplifier (e.g., SSA 314) can sense whether the precharged voltage of the local I/O line changes (e.g., by more than a threshold amount) responsive to activation of the column decode lines.

For instance, if the I/O line 334 is precharged to a ground voltage and the sensing circuitry (e.g., one or more of the selected compute components 331 and/or sense amplifiers 306) stores a logic 1 (e.g., Vcc), then the SSA 312 can sense a pull up (e.g., increase) of the voltage on I/O line 334 which indicates that at least one of the compute components and/or sense amplifiers (e.g., at least one of the compute components and/or sense amplifiers corresponding to Comp_Comp 431) stores a "1". Alternatively, if the I/O line 334 is precharged to Vcc and one or more of the selected compute components and/or sense amplifiers stores a logic 0 (e.g., 0V), then the SSA 312 can sense a pull down (e.g., decrease) of the voltage on I/O line 334 which indicates that at least one of the compute components and/or sense amplifiers stores a "0". In this manner, voltages corresponding to data stored in sensing circuitry corresponding to bit-vector 431 can be transferred, in parallel, to the local I/O line 334 and sensed by SSA 312 as part of a BLOCKOR operation. Embodiments of the present disclosure are not limited to particular precharge voltages of local I/O line 334 and/or to particular voltage values corresponding to logic 1 or logic 0.

As such, in a number of examples, a BLOCKOR operation results in (e.g., returns) a "1" if any of the bits of the bit-vector on which the operation is being performed are a "1" and results in a "0" if none of the bits of the bit-vector on which the operation is being performed are a "1." In the examples provided in FIGS. 4A-4B, 5A-5B, 6, and 7A-7B, the ITERATOR_MASK 476 includes bits with a value of one (e.g., "1") if additional iterations of the loop structure associated with reference number 10 need to be performed. The ITERATOR_MASK 476 does not include bits with a value "1" if all iterations of the loop structure associated with reference number 10 have been performed.

The pseudo code corresponding to reference number 10.a (e.g., "COMPUTATION Logic requiring Looping") is associated with performing a number of secondary operations that are associated with performing the primary operation. As used herein, computation logic refers to the secondary operations and the control flow executed to perform the primary operation. The computation logic (e.g., the secondary operations and the control flow) can be different for different primary operations. For example, the computation logic executed to perform the multiplication operation can be different than the computation logic executed to perform a division operation. The secondary operations are performed in each iteration of the "WHILE" loop. In a number of examples, the secondary operations do not change the quantity of iterations associated with the "WHILE" loop. However, the secondary operations can be used to update the ITERATOR_MASK 476, which can result in a change to the quantity of iterations associated with the "WHILE" loop structure. The ITERATOR_MASK 476, STATIC_MASK 478, and/or the ELEMENT_MASK 488 can be used in association with performing the secondary operations.

The pseudo code corresponding to reference number 10.b (e.g., "row_to_acc(ITERATOR_MASK)") is associated with writing the data pattern stored in the memory cells that store the ITERATOR_MASK 476 to the sensing circuitry as Comp_Comp 431. For example, in a first iteration of the pseudo code corresponding to reference number 10.b, the ITERATOR_MASK bit-vector 476 [40,40,40,40] is stored in the sensing circuitry as Comp_Comp 431.

The pseudo code corresponding to reference number 10.c (e.g., "acc_shift(RIGHT, ZERO, 1)") is associated with performing a right shift operation on Comp_Comp 431 and storing the result of the right shift operation in the sensing circuitry. In a first iteration of reference number 10.c, the Comp_Comp bit-vector 431 is shifted resulting in the bit-vector [20,20,20,20] being stored in the sensing circuitry. Shifting the bits in Comp_Comp 431 that are associated with the ITERATOR_MASK 476 indicates that an iteration of the "WHILE" loop has been performed. For example, the bits in Comp_Comp 431 that are associated with the ITERATOR_ MASK 476 are shifted as the number of iterations of the "WHILE" loop are performed. The bit pattern corresponding to ITERATOR_MASK 476 can also be used to indicate a particular bit position within the elements on which the secondary operations are performed as the number of iterations of the loop are performed.

The pseudo code corresponding to reference number 10.d (e.g., "acc_AND_row_accip(STATIC_MASK)") is associated with performing an AND operation on Comp_Comp 431 and STATIC_MASK 478 to prevent the right shift operation associated with reference number 10.c from shifting bits from one of the plurality of groups in the ITERATOR_MASK 476 to a different group of the plurality of groups in the ITERATOR_MASK 476. For example, the AND operation is executed to prevent bits in the ITERATOR_MASK 476 that are associated with a particular element pair from being shifted to a bit position, in the ITERATOR_MASK 476, that is associated with a different element pair. The bits in the ITERATOR_MASK 476 can be grouped to correspond with the element pairs from the plurality of first elements and the plurality of second elements. In FIGS. 4A to 7, the grouping of the bits are shown by commas (e.g., ","). For example, the most significant eight bit positions can be associated with a first element pair and the next most significant eight bit positions can be associated with a second element pair. The AND operation prevents bit-values from being shifted from the most significant eight binary bit positions to the next most significant eight binary bit positions. In a first iteration of reference number 10.d, an AND operation is performed on the bit-vector [20,20,20,20] (e.g., Comp_Comp 431) and the bit-vector [7F,7F,7F,7F] (e.g., STATIC_MASK 478) resulting in the bit-vector [20,20,20,20] being stored in the sensing circuitry and the memory cells that store the ITERATOR_MASK 476. In the example of a first iteration of reference number 10.b-10.d the bits in Comp_Comp 431 that are associated with ITERATOR_MASK 476 are not shifted from one group of bits to a different group of bits and as a result performing the AND operation in reference number 10.d does not stop the shifting of bits from one group of bits to a different group of bits. An example of stopping the shifting of bits from one group of bits to a different group of bits is given in the seventh iteration of reference number 10.b-10.d.

In a second iteration of reference number 10 the BLOCKOR operation performed on the bit-vector [20,20,20,20] (e.g., Comp_Comp 431) returns a "1" indicating that additional iterations of the "WHILE" loop need to be performed. In a second iteration of reference number 10.a, the number of secondary operations are performed. In a second iteration of reference number 10.b, the ITERATOR_MASK bit-vector 476 [20,20,20,20] is stored in the sensing circuitry as Comp_Comp 431. In a second iteration of reference number 10.c, the Comp_Comp bit-vector 431 is shifted resulting in the bit-vector [10,10,10,10] being stored in the sensing circuitry. In a second iteration of reference number 10.d, an AND operation is performed on the bit-vector [10,10,10,10] (e.g., Comp_Comp 431) and the bit-vector [7F,7F,7F,7F] resulting in the bit-vector [10,10,10,10] being stored in the sensing circuitry and the memory cells that store the ITERATOR MASK 476.

In a third iteration of reference number 10 the BLOCKOR operation performed on the bit-vector [10,10,10,10] (e.g., Comp_Comp 431) returns a "1" indicating that additional iterations of the "WHILE" loop need to be performed. In a third iteration of reference number 10.a, the number of secondary operations are performed. In the third iteration of reference number 10.b, the ITERATOR_MASK bit-vector 476 [10,10,10,10] is stored in the sensing circuitry as Comp_Comp 431. In the third iteration of reference number 10.c, the Comp_Comp bit-vector 431 is shifted resulting in the bit-vector [08,08,08,08] being stored in the sensing circuitry. In the third iteration of reference number 10.d, an AND operation is performed on the bit-vector [08,08,08,08] (e.g., Comp_Comp 431) and the bit-vector [7F,7F,7F,7F] resulting in the bit-vector [08,08,08,08] being stored in the sensing circuitry and the memory cells that store the ITERATOR MASK 476.

In a fourth iteration, shown in FIG. 4B, of reference number 10 the BLOCKOR operation performed on the bit-vector [08,08,08,08] (e.g., Comp_Comp 431) returns a "1" indicating that additional iterations of the "WHILE" loop need to be performed. In the fourth iteration of reference number 10.a, the number of secondary operations are performed. In the fourth iteration of reference number 10.b, the ITERATOR_MASK bit-vector 476 [08,08,08,08] is stored in the sensing circuitry as Comp_Comp 431. In the fourth iteration of reference number 10.c, the Comp_Comp bit-vector 431 is shifted resulting in the bit-vector [04,04,04,04] being stored in the sensing circuitry. In the fourth iteration of reference number 10.d, an AND operation is performed on the bit-vector [04,04,04,04] (e.g., Comp_Comp 431) and the bit-vector [7F,7F,7F,7F] resulting in the bit-vector [04,04,04,04] being stored in the sensing circuitry and the memory cells that store the ITERATOR MASK 476.

In a fifth iteration, shown in FIG. 4B, of reference number 10 the BLOCKOR operation performed on the bit-vector [04,04,04,04] (e.g., Comp_Comp 431) returns a "1" indicating that additional iterations of the "WHILE" loop need to be performed. In the fifth iteration of reference number 10.a, the number of secondary operations are performed. In the fifth iteration of reference number 10.b, the ITERATOR_MASK bit-vector 476 [04,04,04,04] is stored in the sensing circuitry as Comp_Comp 431. In the fifth iteration of reference number 10.c, the Comp_Comp bit-vector 431 is shifted resulting in the bit-vector [02,02,02,02] being stored in the sensing circuitry. In the fifth iteration of reference number 10.d, an AND operation is performed on the bit-vector [02,02,02,02] (e.g., Comp_Comp 431) and the bit-vector [7F,7F,7F,7F] resulting in the bit-vector [02,02,02,02] being stored in the sensing circuitry and the memory cells that store the ITERATOR MASK 476.

In a sixth iteration, shown in FIG. 4B, of reference number 10 the BLOCKOR operation performed on the bit-vector [02,02,02,02] (e.g., Comp_Comp 431) returns a "1" indicating that additional iterations of the "WHILE" loop need to be performed. In the sixth iteration of reference number 10.a, the number of secondary operations are performed. In the sixth iteration of reference number 10.b, the ITERATOR_MASK bit-vector 476 [02,02,02,02] is stored in the sensing circuitry as Comp_Comp 431. In the sixth iteration of reference number 10.c, the Comp_Comp bit-vector 431 is shifted resulting in the bit-vector [01,01,01,01] being stored in the sensing circuitry. In the sixth iteration of reference number 10.d, an AND operation is performed on the bit-vector [01,01,01,01] (e.g., Comp_Comp 431) and the bit-vector [7F,7F,7F,7F] resulting in the bit-vector [01,01,01,01] being stored in the sensing circuitry and the memory cells that store the ITERATOR MASK 476.

In a seventh iteration, shown in FIG. 4B, of reference number 10 the BLOCKOR operation performed on the bit-vector [01,01,01,01] (e.g., Comp_Comp 431) returns a "1" indicating that additional iterations of the "WHILE" loop need to be performed. In the seventh iteration of reference number 10.a, the number of secondary operations are performed. In the seventh iteration of reference number 10.b, the ITERATOR_MASK bit-vector 476 [01,01,01,01] is stored in the sensing circuitry as Comp_Comp 431. In the seventh iteration of reference number 10.c, the Comp_Comp bit-vector 431 is shifted resulting in the bit-vector [00,80,80,80] being stored in the sensing circuitry. In the seventh iteration of reference number 10.d, an AND operation is performed on the bit-vector [00,80,80,80] (e.g., Comp_Comp 431) and the bit-vector [7F,7F,7F,7F] resulting in the bit-vector [00,00,00,00] being stored in the sensing circuitry and the memory cells that store the ITERATOR_MASK 476.

In an eighth iteration of reference number 10 the BLOCKOR operation performed on the bit-vector [00,00, 00,00] (e.g., Comp_Comp 431) returns a "0" indicating that no additional iterations of the "WHILE" loop need to be performed. The eighth iteration of reference number 10 is not shown because in the eighth iteration the operations performed in association with reference numbers 10.*a*-10.*d* are not performed. The operations performed in association with reference number 10.*a*-10.*d* are not performed in an eighth iteration of reference number 10 because the "WHILE" loop terminates when the BLOCKOR operation returns zero. In a number of examples, the primary operation can conclude after the "WHILE" loop terminates or the primary operation can continue after the "WHILE" loop terminates. For example, the primary operation can continue by returning a value to the host 110 in FIG. 1 among other examples of how the primary operation can continue.

FIGS. 5A-5B illustrate a table showing the states of memory cells of a portion of an array at a number of iterations associated with a loop structure for performing operations in memory in accordance with a number of embodiments of the present disclosure. Column 596 of the table shown in FIGS. 5A and 5B provide reference numbers (e.g., 1-10) for the rows of the table, and the reference numbers shown in the table correspond to the respective reference numbers of the pseudo code described below. The bit-vector values for each of the bit-vectors 576 (ITERATOR_MASK), 578 (STATIC_MASK), 588 (ELEMENT_MASK), are stored in the array at various phases corresponding to reference numbers 1-10.

The example described in association with FIGS. 5A-5B includes performing a primary operation using a loop structure that shifts bits towards a MSB in the ITERATOR_MASK 576 as compared to the example described in association with FIGS. 4A-4B which includes performing a primary operation using a loop structure that shifts bits towards a LSB in the ITERATOR_MASK 476. The ability to shift bits towards a LSB or a MSB is useful when the ITERATOR_MASK 476 is used in the execution of secondary operations. For example, the secondary operations can be executed on a LSB to a MSB or from a MSB to a LSB from the vector arguments (e.g., bit-vectors that represent the plurality of first elements and the plurality of second elements). In the example described in association with FIGS. 5A-5B each of the elements from the plurality of first elements and the plurality of second elements has a same element width of eight bits as described in FIGS. 4A-4B. In contrast, in the examples provide in FIGS. 6 and 7A-7B each of the elements from the plurality of first elements and the plurality of second elements can have variable element widths. Elements from the plurality of first elements and the plurality of second elements have variable element widths if at least one of the elements from the plurality of first elements and the plurality of second elements has an element width that is different than the elements widths of the other elements form the plurality of first elements and the plurality of second elements.

The bit-vectors 531, 567, 578, 588 are analogous to bit-vectors 431, 467, 478, 488 in FIG. 4. The ELEMENT_WIDTH 590 is also analogous to ELEMENT_WIDTH 490 in FIG. 4. A plurality of first elements and a plurality of second elements bit-vectors can correspond to bit-vectors that contain the values (e.g., decimal values) of a plurality of first elements and a plurality of second elements, respectively, as described in FIGS. 4A-4B.

As previously stated, a primary operation can be performed on the first elements and the second elements.

The below pseudo code represents instructions executable to perform a primary operation operations using a loop structure as described in FIGS. 5A-5B in memory in accordance with a number of embodiments of the present disclosure. The example pseudo code is referenced using reference numbers 1-10, which correspond to the respective reference numbers 1-10 shown in column 596 of the table shown in FIGS. 5A-5B. For example, reference number one (1) corresponds to "set_acc( )" in the below pseudo code, and reference number two (2) corresponds to "shift_accip (RIGHT, ZERO, 1)" in the below pseudo code.

```
1.    set_acc( );
2.    shift_accip(RIGHT, ZERO, 1);
3.    inv_to_row_acc(ELEMENT_MASK);
4.    for (len_t e = 0; e < elements – 1; e++) {
4.a       shift_accip(RIGHT, ZERO, ELEMENT_WIDTH);
4.b       row_OR_accip(ELEMENT_MASK);
      }
5.    row_write(ELEMENT_MASK);
6.    acc_inv_to_row(STATIC_MASK);
7.    row_to_acc(ELEMENT_MASK);
8.    shift_accip(RIGHT, ZERO, ELEMENT_WIDTH–1);
9.    acc_to_row(ITERATOR_MASK);
10.   while (acc_blockor( )) {
10.a      [[ COMPUTATION Logic requiring Looping ]]
10.b      row_to_acc(ITERATOR_MASK);
10.c      acc_shift(LEFT, ZERO, 1);
10.d      acc_AND_row_accip(STATIC_MASK);
      }
```

The pseudo code corresponding to reference numbers 1-5 is associated with creating the ELEMENT_MASK 488. The pseudo code corresponding to reference number 1 (e.g., "set_acc( ))") is associated with storing the bit-vector [FF, FF,FF,FF] in the sensing circuitry (e.g., compute components 331 and/or sense amplifiers 306). The pseudo code corresponding to reference number 2 (e.g., "shift_accip (RIGHT, ZERO, 1)") is associated with performing a right shift operation on Comp_Comp 531 that is stored in the sensing circuitry. The result of the rights shift operation is a bit-vector [7F,FF,FF,FF], as shown in FIG. 4A (e.g., COMP_COMP 431 has a value of [7F,FF,FF,FF] as shown at reference number 2 in FIG. 4A). The bit-vector [7F,FF,FF, FF] is stored in the sensing circuitry as bit-vector 531.

The pseudo code corresponding to reference number 3 (e.g., "inv_to_row_acc(ELEMENT_MASK)") is associated with performing an invert operation on Comp_Comp 531 and storing the result of the invert operation in the memory cells that store the ELEMENT_MASK 588. Performing an invert operation on Comp_Comp 531 results in a bit-vector that identifies the most significant bit in the plurality of first elements and the plurality of second elements. In this example, performing an invert operation on bit-vector 531 (e.g., [7F,FF,FF,FF]) results in bit-vector [80,00,00,00], which is stored as binary bit-vector [1000 000, 0000 0000, 0000 0000, 0000 0000] in the memory cells that use to store the ELEMENT_MASK 588. The hexadecimal bit-vector [80,00,00,00] (e.g., binary bit-vector [1000 000, 0000 0000, 0000 0000, 0000 0000]) identifies the most significant bit in the plurality of first elements and the plurality of second elements.

The pseudo code corresponding to reference number 4 (e.g., "for (len_t e=0; e<elements-1; e++)") is associated with performing a "FOR" loop to identify the most significant bit in each element pair from the plurality of first elements and the plurality of second elements using the ELEMENT_MASK 588. The "FOR" loop associated with reference number 5 iterates through the quantity of element pairs (e.g., elements). In a number of examples, the quantity of element pairs (e.g., the quantity of element in the plurality of first elements and/or the plurality of second elements) is provided by a host such as host 110 in FIG. 1. In FIGS. 5A-5B, the quantity of elements is equal to four elements. However, only the most significant bit associated with three element pairs needs to be identified due to the previous identification of the MSB (e.g., [80,00,00,00]) of the plurality of first elements and the plurality of second elements. As such, the "FOR" loop performs three iterations using "e" as a counter. "E" is set to zero (e.g., 0) in the first iteration of the "FOR" loop and is incremented (e.g., "e++") by one (e.g., 1) before each subsequent iteration of the "FOR" loop. The "FOR" loop terminates (e.g., ends) when "e" is greater than or equal to 3 (e.g., "e<element-1").

The pseudo code corresponding to reference number 4.a (e.g., "shift_accip(RIGHT, ZERO, ELEMENT_WIDTH)") is associated with performing a right shift operation during each iteration of the "FOR" loop referenced in association with reference number 4. The right shift operation shifts the bits in the Comp_Comp bit-vector 531 towards the LSB in the Comp_Comp bit-vector 531 a quantity of times equal to the ELEMENT_WIDTH which is equal to eight in this example. For example, in a first iteration of the "FOR" loop the right shift operation associated with reference number 4.a shifts the Comp_Comp bit-vector 531 [80,00,00,00] resulting in the bit-vector [00,80,00,00] being stored in the sensing circuitry as Comp_Comp 531. In a second iteration of the "FOR" loop the right shift operation associated with reference number 4.a shifts the Comp_Comp bit-vector 531 [80,80,00,00] resulting in the bit-vector [00,80,80,00] being stored in the sensing circuitry as Comp_Comp 531. In a third iteration of the "FOR" loop the right shift operation associated with reference number 4.a shifts the Comp_Comp bit-vector 531 [80,80,80,00] resulting in the bit-vector [00, 80,80,80] being stored in the sensing circuitry as Comp_Comp 531.

The pseudo code corresponding to reference number 4.b (e.g., "row_OR_accip(ELEMENT_MASK)") is associated with performing an OR operation on Comp_Comp 531 and ELEMENT_MASK 588. For example, in the first iteration of the "FOR" loop, the OR operation associated with reference number 4.b is performed on Comp_Comp bit-vector 531 [00,80,00,00] and ELEMENT_MASK bit-vector 588 [80,00,00,00] resulting in the bit-vector [80,80,00,00] being stored in the sensing circuitry as Comp_Comp 531. In the second iteration of the "FOR" loop, the OR operation associated with reference number 4.b is performed on the Comp_Comp bit-vector 531 [00,80,80,00] and the ELEMENT_MASK bit-vector 588 [80,00,00,00] resulting in the bit-vector [80,80,80,00] being stored in the sensing circuitry as Comp_Comp 531. In the third iteration of the "FOR" loop, the OR operation associated with reference number 4.b is performed on the Comp_Comp bit-vector 531 [00,80,80,80] and the ELEMENT_MASK bit-vector 588 [80,00,00,00] resulting in the bit-vector [80,80,80,80] being stored in the sensing circuitry as Comp_Comp 531.

The pseudo code corresponding to reference number 5 (e.g., "row_write(ELEMENT_MASK)") is associated with writing the data pattern stored in the sensing circuitry (e.g., bit-vector 531) to the cells storing the ELEMENT_MASK bit-vector 588. As such, the bit-vector [80,80,80,80] is stored in the memory cells that store the ELEMENT_MASK bit-vector 588.

The pseudo code corresponding to reference number 6 (e.g., "acc_inv_to_row(STATIC_MASK)") is associated with performing an invert operation to create the STATIC_MASK 578. The invert operation is performed on Comp_Comp 531. Comp_Comp 531 is a bit-vector [80,80,80,80] before the invert operation. The result of the invert operation is a bit-vector [7F,7F,7F,7F]. The result of the invert operation is stored in the memory cells that store STATIC_MASK 578. The STATIC_MASK 578 is used to prevent bits that are associated with a particular bit-pair from the plurality of first elements and the plurality of second elements from being shifted to bits from a different bit-vector.

The pseudo code corresponding to reference number 7 (e.g., "row_to_acc(ELEMENT_MASK)") is associated with writing the ELEMENT_MASK 588 in the sensing circuitry as bit-vector 431. The pseudo code corresponding to reference number 8 (e.g., "shift_accip(RIGHT, ZERO, ELEMENT_WIDTH-1)") is associated with performing a right shift operation on Comp_Comp 531 to prepare the ITERATOR_MASK 576 to be used in the loop structure associated with reference number 10. The right shift operation shifts the bits in Comp_Comp 531 a quantity of positions equal to the element width minus 1 (e.g., ELEMENT_WIDTH 590-1) associated with the plurality of first element and the plurality of second elements. For example, in the example provided in FIGS. 5A-5B, the right shift operation shifts the bits in Comp_Comp 531 a quantity of positions equal to seven. The Comp_Comp bit-vector 531 is a bit-vector [80,80,80,80] (e.g., binary [10000000, 10000000, 10000000, 10000000]) before performing the right shift operation and a bit-vector [01,01,01,01] (e.g., binary [00000001, 00000001, 00000001, 00000001]) after performing the right shift operation. The result of the right shift operation is stored in the sensing circuitry as bit-vector 531.

The pseudo code corresponding to reference number 9 (e.g., "acc_to_row(ITERATOR_MASK)") is associated with writing the data pattern stored in the sensing circuitry (e.g., bit-vector 531) to the cells storing the ITERATOR_MASK bit-vector 576 in preparation for performing the loop structure corresponding to reference number 10. The pseudo code corresponding to reference number 10 (e.g., "while (acc_blockor( ))") is associated with performing a loop structure using the Comp_Comp bit-vector 531. In a first iteration of the "WHILE" loop associated with reference number 10, the BLOCKOR operation returns true because the ITERATOR_MASK 576 contains one-bits.

The pseudo code corresponding to reference number 10.a (e.g., "COMPUTATION Logic requiring Looping") is associated with performing a number of secondary operations that are associated with performing the primary operation. The secondary operations are performed in each iteration of the "WHILE" loop. In a number of examples, the secondary operations do not change the quantity of iterations associated with the "WHILE" loop. However, the secondary operations can be used to update the ITERATOR_MASK 576 which can result in a change to the quantity of iterations associated with the "WHILE" loop structure. The ITERATOR_MASK 576, STATIC_MASK 578, and/or the ELEMENT_MASK 588 can be used in association with performing the secondary operations.

The pseudo code corresponding to reference number 10.b (e.g., "row_to_acc(ITERATOR_MASK)") is associated with writing the data pattern stored in the memory cells that store the ITERATOR_MASK 576 to the sensing circuitry as Comp_Comp 531. For example, in a first iteration of the pseudo code corresponding to reference number 10.b, the ITERATOR_MASK bit-vector 576 [01,01,01,01] is stored in the sensing circuitry as Comp_Comp 531.

The pseudo code corresponding to reference number 10.d (e.g., "acc_shift(LEFT, ZERO, 1)") is associated with performing a left shift operation on Comp_Comp 531 and storing the result of the right shift operation in the sensing circuitry. In a first iteration of reference number 10.c, the Comp_Comp bit-vector 531 is shifted resulting in the bit-vector [02,02,02,02] being stored in the sensing circuitry. Shifting the bits in Comp_Comp 451 that are associated with the ITERATOR_MASK 476 indicates that an iteration of the "WHILE" loop has been performed.

The pseudo code corresponding to reference number 10.d (e.g., "acc_AND_row_accip(STATIC_MASK)") is associated with performing an AND operation on Comp_Comp 531 and STATIC_MASK 578 to prevent the left shift operation associated with reference number 10.c from shifting bits from one of the plurality of groups in the ITERATOR_MASK 576 to a different group of the plurality of groups in the ITERATOR_MASK 576. The bits in the ITERATOR_MASK 576 can be grouped to correspond with the element pairs from the plurality of first elements and the plurality of second elements as discussed in FIGS. 4a-4B. In a first iteration of reference number 10.d, an AND operation is performed on the bit-vector [02,02,02,02] (e.g., Comp_Comp 531) and the bit-vector [7F,7F,7F,7F] (e.g., STATIC_MASK 478) resulting in the bit-vector [02,02,02,02] being stored in the sensing circuitry and the memory cells that store the ITERATOR MASK 576.

In a second iteration of reference number 10, the BLOCKOR operation performed on the bit-vector [02,02,02,02] (e.g., Comp_Comp 531) returns a "1" indicating that additional iterations of the "WHILE" loop need to be performed. In a second iteration of reference number 10.a, the number of secondary operations are performed. In the second iteration of reference number 10.b, the ITERATOR_MASK bit-vector 576 [02,02,02,02] is stored in the sensing circuitry as Comp_Comp 531. In the second iteration of reference number 10.c, the Comp_Comp bit-vector 531 is shifted resulting in the bit-vector [04,04,04,04] being stored in the sensing circuitry. In the second iteration of reference number 10.d, an AND operation is performed on the bit-vector [04,04,04,04] (e.g., Comp_Comp 531) and the bit-vector [7F,7F,7F,7F] resulting in the bit-vector [04,04,04,04] being stored in the sensing circuitry and the memory cells that store the ITERATOR MASK 576.

In a third iteration of reference number 10 the BLOCKOR operation performed on the bit-vector [04,04,04,04] (e.g., Comp_Comp 531) returns a "1" indicating that additional iterations of the "WHILE" loop need to be performed. In the third iteration of reference number 10.a, the number of secondary operations are performed. In the third iteration of reference number 10.b, the ITERATOR_MASK bit-vector 576 [04,04,04,04] is stored in the sensing circuitry as Comp_Comp 531. In the third iteration of reference number 10.c, the Comp_Comp bit-vector 531 is shifted resulting in the bit-vector [08,08,08,08] being stored in the sensing circuitry. In the third iteration of reference number 10.d, an AND operation is performed on the bit-vector [08,08,08,08] (e.g., Comp_Comp 531) and the bit-vector [7F,7F,7F,7F] resulting in the bit-vector [08,08,08,08] being stored in the sensing circuitry and the memory cells that store the ITERATOR MASK 576.

In a fourth iteration, shown in FIG. 5B, of reference number 10 the BLOCKOR operation performed on the bit-vector [08,08,08,08] (e.g., Comp_Comp 531) returns a "1" indicating that additional iterations of the "WHILE" loop need to be performed. In the fourth iteration of reference number 10.a, the number of secondary operations are performed. In the fourth iteration of reference number 10.b, the ITERATOR_MASK bit-vector 576 [08,08,08,08] is stored in the sensing circuitry as Comp_Comp 531. In the fourth iteration of reference number 10.c, the Comp_Comp bit-vector 531 is shifted resulting in the bit-vector [10,10,10,10] being stored in the sensing circuitry. In the fourth iteration of reference number 10.d, an AND operation is performed on the bit-vector [10,10,10,10] (e.g., Comp_Comp 531) and the bit-vector [7F,7F,7F,7F] resulting in the bit-vector [04,04,04,04] being stored in the sensing circuitry and the memory cells that store the ITERATOR MASK 576.

In a fifth iteration, shown in FIG. 5B, of reference number 10 the BLOCKOR operation performed on the bit-vector [10,10,10,10] (e.g., Comp_Comp 531) returns a "1" indicating that additional iterations of the "WHILE" loop need to be performed. In the fifth iteration of reference number 10.a, the number of secondary operations are performed. In the fifth iteration of reference number 10.b, the ITERATOR_MASK bit-vector 576 [10,10,10,10] is stored in the sensing circuitry as Comp_Comp 531. In the fifth iteration of reference number 10.c, the Comp_Comp bit-vector 531 is shifted resulting in the bit-vector [20,20,20,20] being stored in the sensing circuitry. In the fifth iteration of reference number 10.d, an AND operation is performed on the bit-vector [20,20,20,20] (e.g., Comp_Comp 531) and the bit-vector [7F,7F,7F,7F] resulting in the bit-vector [20,20,20,20] being stored in the sensing circuitry and the memory cells that store the ITERATOR MASK 576.

In a sixth iteration, shown in FIG. 5B, of reference number 10 the BLOCKOR operation performed on the bit-vector [20,20,20,20] (e.g., Comp_Comp 531) returns a "1" indicating that additional iterations of the "WHILE" loop need to be performed. In the sixth iteration of reference number 10.a, the number of secondary operations are performed. In the sixth iteration of reference number 10.b, the ITERATOR_MASK bit-vector 576 [20,20,20,20] is stored in the sensing circuitry as Comp_Comp 531. In the sixth iteration of reference number 10.c, the Comp_Comp bit-vector 531 is shifted resulting in the bit-vector [40,40,40,40] being stored in the sensing circuitry. In the sixth iteration of reference number 10.d, an AND operation is performed on the bit-vector [40,40,40,40] (e.g., Comp_Comp 531) and the bit-vector [7F,7F,7F,7F] resulting in the bit-vector [40,40,40,40] being stored in the sensing circuitry and the memory cells that store the ITERATOR MASK 576.

In a seventh iteration, shown in FIG. 5B, of reference number 10 the BLOCKOR operation performed on the bit-vector [40,40,40,40] (e.g., Comp_Comp 531) returns a "1" indicating that additional iterations of the "WHILE" loop need to be performed. In the seventh iteration of reference number 10.a, the number of secondary operations are performed. In the seventh iteration of reference number 10.b, the ITERATOR_MASK bit-vector 576 [40,40,40,40] is stored in the sensing circuitry as Comp_Comp 531. In the seventh iteration of reference number 10.c, the Comp_Comp bit-vector 531 is shifted resulting in the bit-vector [80,80,80,80] being stored in the sensing circuitry. In the seventh iteration of reference number 10.d, an AND operation is performed on the bit-vector [80,80,80,80] (e.g., Comp_Comp 531) and the bit-vector [7F,7F,7F,7F] resulting in the bit-vector [00,00,00,00] being stored in the sensing circuitry and the memory cells that store the ITERATOR MASK 576.

In an eight iteration (e.g., not shown) of reference number 10 the BLOCKOR operation performed on the bit-vector [00,00,00,00] (e.g., Comp_Comp 531) returns a "0" indicating that no additional iterations of the "WHILE" loop need to be performed. The "WHILE" loop terminates when the BLOCKOR operation returns zero.

FIG. 6 illustrate a table showing the states of memory cells of a portion of an array at a number of iterations associated with a loop structure for performing operations in memory in accordance with a number of embodiments of the present disclosure. Column 696 of the table shown in FIG. 6 provides reference numbers (e.g., 1-10) for the rows of the table, and the reference numbers shown in the table correspond to the respective reference numbers of the pseudo code described below. The bit-vector values for each of the bit-vectors 676 (ITERATOR_MASK), 678 (STATIC_MASK), 688 (ELEMENT_MASK), are stored in the array at various phases corresponding to reference numbers 1-10.

The example described in association with FIG. 6 includes performing a primary operation using a loop structure that shifts bits towards a LSB in the ITERATOR_MASK 676 as compared to the example described in association with FIGS. 7A-7B which includes performing a primary operation using a loop structure that shifts bits towards a MSB in the ITERATOR_MASK 676. In the example described in association with FIGS. 6 and 7A-7B each of the elements from the plurality of first elements and the plurality of second elements can have a variable element width. In contrast, in the examples provide in FIGS. 4A-4B and 5A-5B each of the elements from the plurality of first elements and the plurality of second elements have a same element width.

The bit-vectors 631, 667, 678, 688 are analogous to bit-vectors 431, 467, 478, 488 in FIG. 4. In FIG. 6 no element width is provided by a host because the element associated with the plurality of first elements and the elements associated with the plurality of second elements have variable element widths. Instead of receiving an element width from a host as described in FIGS. 4A, 4B and FIGS. 5A, 5B, a host such as host 110 in FIG. 1 can provide an ELEMENT_MASK 688 that defines the boundaries of element pairs from the plurality of first elements and the plurality of second elements that are associated with the grouping of bits in the ITERATOR_MASK 676.

In the example shown in FIGS. 6 and 7A-7B, each of plurality of first elements and the plurality of second elements are comprised of five elements with variable element widths. For example, two elements in each of the plurality of first elements and the plurality of second elements are represented by a bit-vectors that are composed of four bits (e.g., elements width equal to four) while three elements in each of the plurality of first elements and the plurality of second elements are represented by a bit-vectors that are composed of eight bits (e.g., element width equal to eight).

For example, the five elements of the plurality of first elements can be stored in the first group of memory cells. A fifth element of the plurality of first elements can be stored in memory cells that are coupled to access line 304-0 and sense lines 305-28 to 305-31 in FIG. 3, a fourth element of the plurality of first elements can be stored in memory cells that are coupled to access line 304-0 and sense lines 305-24 to 305-27 in FIG. 3, a third element can be stored in memory cells that are coupled to access line 304-0 and sense lines 305-16 to 305-23 in FIG. 3, a second element can be stored in memory cells that are coupled to access line 304-0 and sense lines 305-8 to 305-15 in FIG. 3, and a first element can be stored in memory cells that are coupled to access line 304-0 and sense lines 305-0 to 305-7 in FIG. 3.

The five elements of the plurality of second elements can be stored in the second group of memory cells. For example, a fifth element of the plurality of second elements can be stored in memory cells that are coupled to access line 304-1 and sense lines 305-28 to 305-31, a fourth element of the plurality of second elements can be stored in memory cells that are coupled to access line 304-1 and sense lines 305-24 to 305-27, a third element can be stored in memory cells that are coupled to access line 304-1 and sense lines 305-16 to 305-23, a second element can be stored in memory cells that are coupled to access line 304-1 and sense lines 305-8 to 305-15, and a first element can be stored in memory cells that are coupled to access line 304-1 and sense lines 305-0 to 305-7.

The ITERATOR_MASK 676 is used by a loop structure associated with the primary operation to determine a quantity of iterations that are to be performed in a loop structure used to perform a primary operation. In a number of examples, the ITERATOR_MASK 676 includes a plurality of groups of bits that are associated with plurality of element pairs from the plurality of first elements and the plurality of second elements. Each of the plurality of groups of bits that are associated with ITERATOR_MASK 676 can be composed of different quantities of bits. For example, a first group of bits, a second group of bits, and a third group of bits that are associated with a first element pair, a second element pair, and a third element pair, respectively, of the plurality of first elements and the plurality of second elements can include eights bits while the fourth group of bits and the fifth group of bits that is associated with a fourth element pair and fifth element pair, respectively, of the plurality of first elements and the plurality of second elements can include four bits.

Each of the plurality of groups of bits in the ITERATOR_MASK 676 can be used to identify quantity of iterations of a loop structure that need to be performed to perform a primary operation. For example, a first group of bits, a second group of bits, and a third group of bits (e.g., eight binary bits per group) can indicate that seven iterations are needed to perform the primary operation while a fourth group of bits and a fifth group of bits (e.g., four binary bits per group) can indicate that three iterations are needed to perform the primary operation. The quantity of bits in a group with the highest quantity of bits from the plurality of groups can identify the quantity of iterations associated with a loop structure used to perform the primary operation on all the element pairs from the plurality of first bits and the plurality of second bits. In the examples provided in FIGS. 6 and 7A-7B, the loop structure used to perform the primary operation can implement the primary operation using seven iterations because the quantity of bits in the first, second, and third group of bits from the ITERATOR_MASK 676 are equal to eight bits which is greater than the quantity of bits in the fourth and fourth group of bits from the ITERATOR_MASK 676.

The below pseudo code represents instructions executable to perform a primary operation by executing a loop structure as described herein in a memory in accordance with a number of embodiments of the present disclosure. The example pseudo code is referenced using reference numbers 1-10, which correspond to the respective reference numbers 1-10 shown in column 696 of the table shown in FIG. 6. For example, reference number one (1) corresponds to "row_to_row(ELEMENT_MASK, ITERATOR_MASK)" in the below pseudo code, and reference number two (2) corresponds to "inv_to_acc(ELEMENT_MASK)" in the below pseudo code.

```
1.      row_to_row(ELEMENT_MASK, ITERATOR_MASK);
2.      inv_to_acc(ELEMENT_MASK);
3.      shift_accip(LEFT, ZERO,1);
4.      row_write(STATIC_MASK);
5.      acc_to_row(ITERATOR_MASK);
6.      while (acc_blockor( )) {
6.a         [[ COMPUTATION Logic requiring Looping ]]
6.b         row_to_acc(ITERATOR_MASK);
6.c         acc_shift(RIGHT, ZERO, 1);
6.d         acc_AND_row_accip(STATIC_MASK);
        }
```

The pseudo code corresponding to reference number 1 (e.g., "row_to_row(ELEMENT_MASK, ITERATOR_MASK)") is associated with storing the ELEMENT_MASK bit-vector 688 [8,8,80,80,80] in the memory cells that store the ITERATOR_MASK 676. The pseudo code corresponding to reference number 2 (e.g., "inv_to_acc(ELEMENT_MASK)") is associated with performing an invert operation on the ELEMENT_MASK 688 and storing the result of the invert operation in the sensing circuitry as Comp_Comp 631. Performing an invert operation on Comp_Comp 631 results in a bit-vector that identifies all of the bits except the MSB in the plurality of first elements and the plurality of second elements. In this example, performing an invert operation on bit-vector 688 (e.g., [8,8,80,80,80]) results in bit-vector [7,7,7F,7F,7F], which is stored in the sensing circuitry The pseudo code corresponding to reference number 3 (e.g., "shift_accip(LEFT, ZERO, 1)") is associated with performing a left shift operation on Comp_Comp 631 to identify all of the bits except the LSB in the plurality of first elements and the plurality of second elements. Before the left shift operation is performed the Comp_Comp 631 can be bit-vector [7,7,7F,7F,7F]. After the left shift operation is performed the Comp_Comp 631 can be a bit-vector [E,E,FE,FE,FE]. The pseudo code corresponding to reference number 4 (e.g., "acc_to_row(ITERATOR_MASK)") is associated with writing the data pattern stored in the sensing circuitry (e.g., bit-vector 631) to the cells storing the ITERATOR_MASK bit-vector 676. Identifying all of the bit-vectors except the LSB in the STATIC_MASK 678 provides the ability to use the STATIC_MASK 678 to prevent the shifting of bits in the ITERATOR_MASK from one group to a different group of the plurality of groups that are associated with the plurality of element pairs from the plurality of first elements and the plurality of second elements.

The pseudo code corresponding to reference number 5 (e.g., "row_to_acc(ITERATOR_MASK)") is associated with writing the ITERATOR_MASK 676 to the sensing circuitry as Comp_Comp 631 in preparation for performing the loop structure reference in reference number 6. The pseudo code corresponding to reference number 6 (e.g., "while (acc_blockor( ))") is associated with performing a loop structure using the Comp_Comp bit-vector 631. As previously described, the loop structure associated with reference number 6 can be a "WHILE" loop or a "FOR" loop. The "WHILE" loop is implemented using a BLOCKOR as a conditional statement. For example, a number of operations can be performed repeatedly while a BLOCKOR operation returns a true value (e.g., a "1"). A BLOCKOR operation can be performed on the vector 631 (e.g., vector stored in compute component 331 in FIG. 3). In a first iteration of the "WHILE" loop the BLOCKOR operation returns a true value because Comp_Comp bit-vector 631 [8,8,80,80,80] includes at least one one-bit which indicates that additional iterations of the "WHILE" loop are needed to perform the primary operation.

The pseudo code corresponding to reference number 6.a (e.g., "COMPUTATION Logic requiring Looping") is associated with performing a number of secondary operations that are associated with performing the primary operation. The secondary operations are performed in each iteration of the "WHILE" loop.

The pseudo code corresponding to reference number 6.b (e.g., "row_to_acc(ITERATOR_MASK)") is associated with writing the data pattern stored in the memory cells that store the ITERATOR_MASK 676 to the sensing circuitry as Comp_Comp 631. For example, in a first iteration of the pseudo code corresponding to reference number 6.b, the ITERATOR_MASK bit-vector 676 [8,8,80,80,80] is stored in the sensing circuitry as Comp_Comp 631.

The pseudo code corresponding to reference number 6.c (e.g., "acc_shift(RIGHT, ZERO, 1)") is associated with performing a right shift operation on Comp_Comp 631 and storing the result of the right shift operation in the sensing circuitry. In a first iteration of reference number 6.c, the Comp_Comp bit-vector 631 is shifted resulting in the bit-vector [4,4,40,40,40] being stored in the sensing circuitry. Shifting the bits in Comp_Comp 631 that are associated with the ITERATOR_MASK 676 indicates that an iteration of the "WHILE" loop has been performed.

The pseudo code corresponding to reference number 6.d (e.g., "acc_AND_row_accip(STATIC_MASK)") is associated with performing an AND operation on Comp_Comp 631 and STATIC_MASK 678 to prevent the right shift operation associated with reference number 6.c from shifting bits from one of the plurality of groups in the ITERATOR_MASK 676 to a different group of the plurality of groups in the ITERATOR_MASK 676. In a first iteration of reference number 6.d, an AND operation is performed on the bit-vector [4,4,40,40,40] (e.g., Comp_Comp 631) and the bit-vector [E,E,FE,FE,FE] resulting in the bit-vector [4,4,40,40, 40] being stored in the sensing circuitry and the memory cells that store the ITERATOR MASK 676.

In a second iteration of reference number 6 the BLOCKOR operation performed on the bit-vector [4,4,40,40,40] (e.g., Comp_Comp 631) returns a "1" indicating that additional iterations of the "WHILE" loop need to be performed. In a second iteration of reference number 6.a, the number of secondary operations are performed. In a second iteration of reference number 6.b, the ITERATOR_MASK bit-vector 676 [4,4,40,40,40] is stored in the sensing circuitry as Comp_Comp 631. In a second iteration of reference number 6.c, the Comp_Comp bit-vector 631 is shifted resulting in the bit-vector [2,2,20,20,20] being stored in the sensing circuitry. In a second iteration of reference number 6.d, an AND operation is performed on the bit-vector [2,2,20,20,20] (e.g., Comp_Comp 631) and the bit-vector [E,E,FE,FE,FE] resulting in the bit-vector [2,2,20,20,20] being stored in the sensing circuitry and the memory cells that store the ITERATOR MASK 676.

In a third iteration of reference number 6 the BLOCKOR operation performed on the bit-vector [2,2,20,20,20] (e.g., Comp_Comp 631) returns a "1" indicating that additional iterations of the "WHILE" loop need to be performed. In a third iteration of reference number 6.a, the number of secondary operations are performed. In the third iteration of reference number 6.b, the ITERATOR_MASK bit-vector 676 [2,2,20,20,20] is stored in the sensing circuitry as Comp_Comp 631. In the third iteration of reference number 6.c, the Comp_Comp bit-vector 631 is shifted resulting in the bit-vector [1,1,10,10, 10] being stored in the sensing circuitry. In the third iteration of reference number 6.d, an AND operation is performed on the bit-vector [1,1,10,10,10] (e.g., Comp_Comp 631) and the bit-vector [E,E,FE,FE,FE] resulting in the bit-vector [0,0,10,10,10] being stored in the sensing circuitry and the memory cells that store the ITERATOR_MASK 676.

In a fourth iteration of reference number 6 the BLOCKOR operation performed on the bit-vector [0,0,10,10,10] (e.g., Comp_Comp 631) returns a "1" indicating that additional iterations of the "WHILE" loop need to be performed. The ITERATOR_MASK 676 that is store as Comp_Comp 631 indicates that the number of secondary operations do not need to be performed on the fourth and fifth element pairs from the plurality of first elements and the plurality of second elements because the fourth and fifth groups of bits in the ITERATOR_MASK 676 do not include at least one one-bit (e.g., a binary bit-vector [0000, 0000, 0001 0000, 0001 0000, 0001 0000], However, the ITERATOR_MASK 676 also indicates that additional iterations of the second operations need to be performed on the first, second, and third element pars from the plurality of first elements and the plurality of second elements because the first, second, and third groups of bits in the ITERATOR_MASK 676 include at least one one-bit (e.g., a binary bit-vector [0000, 0000, 0001 0000, 0001 0000, 0001 0000]. In the fourth iteration of reference number 6.a, the number of secondary operations are performed. The number of second operations can utilize the ITERATOR_MASK 676 to only implement the number of second operation on the first, second, and third element pairs from the plurality of first elements and the plurality of second elements. In the fourth iteration of reference number 6.b, the ITERATOR_MASK bit-vector 676 [0,0,10,10,10] is stored in the sensing circuitry as Comp_Comp 631. In the fourth iteration of reference number 6.c, the Comp_Comp bit-vector 631 is shifted resulting in the bit-vector [0,0,08,08,08] being stored in the sensing circuitry. In the fourth iteration of reference number 6.d, an AND operation is performed on the bit-vector [0,0,08,08,08] (e.g., Comp_Comp 631) and the bit-vector [E,E,FE,FE,FE] resulting in the bit-vector [0,0,08,08,08] being stored in the sensing circuitry and the memory cells that store the ITERATOR MASK 676.

In a fifth iteration of reference number 6 the BLOCKOR operation performed on the bit-vector [0,0,08,08,08] (e.g., Comp_Comp 631) returns a "1" indicating that additional iterations of the "WHILE" loop need to be performed. In the fifth iteration of reference number 6.a, the number of secondary operations are performed on the first, second, and third element pairs from the plurality of first elements and the plurality of second elements. In the fifth iteration of reference number 6.b, the ITERATOR_MASK bit-vector 476 [0,0,08,08,08] is stored in the sensing circuitry as Comp_Comp 631. In the fifth iteration of reference number 6.c, the Comp_Comp bit-vector 631 is shifted resulting in the bit-vector [0,0,04,04,04] being stored in the sensing circuitry. In the fifth iteration of reference number 6.d, an AND operation is performed on the bit-vector [0,0,04,04,04] (e.g., Comp_Comp 631) and the bit-vector [E,E,FE,FE,FE] resulting in the bit-vector [0,0,04,04,04] being stored in the sensing circuitry and the memory cells that store the ITERATOR MASK 676.

In a sixth iteration of reference number 6 the BLOCKOR operation performed on the bit-vector [0,0,04,04,04] (e.g., Comp_Comp 631) returns a "1" indicating that additional iterations of the "WHILE" loop need to be performed. In the sixth iteration of reference number 6.a, the number of secondary operations are performed on the first, second, and third element pairs from the plurality of first elements and the plurality of second elements. In the sixth iteration of reference number 6.b, the ITERATOR_MASK bit-vector 676 [0,0,04,04,04] is stored in the sensing circuitry as Comp_Comp 631. In the sixth iteration of reference number 6.c, the Comp_Comp bit-vector 631 is shifted resulting in the bit-vector [0,0,02,02,02] being stored in the sensing circuitry. In the sixth iteration of reference number 6.d, an AND operation is performed on the bit-vector [0,0,02,02,02] (e.g., Comp_Comp 631) and the bit-vector [E,E,FE,FE,FE] resulting in the bit-vector [0,0,02,02,02] being stored in the sensing circuitry and the memory cells that store the ITERATOR MASK 676.

In a seventh iteration of reference number 6 the BLOCKOR operation performed on the bit-vector [0,0,02,02,02] (e.g., Comp_Comp 631) returns a "1" indicating that additional iterations of the "WHILE" loop need to be performed. In the seventh iteration of reference number 6.a, the number of secondary operations are performed on the first, second, and third element pairs from the plurality of first elements and the plurality of second elements. In the seventh iteration of reference number 6.b, the ITERATOR_MASK bit-vector 676 [0,0,02,02,02] is stored in the sensing circuitry as Comp_Comp 631. In the seventh iteration of reference number 6.c, the Comp_Comp bit-vector 631 is shifted resulting in the bit-vector [0,0,01,01,01] being stored in the sensing circuitry. In the seventh iteration of reference number 6.d, an AND operation is performed on the bit-vector [0,0,01,01,01] (e.g., Comp_Comp 631) and the bit-vector [E,E,FE,FE,FE] resulting in the bit-vector [0,0,00,00,00] being stored in the sensing circuitry and the memory cells that store the ITERATOR MASK 676.

In an eight iteration (e.g., not shown) of reference number 6 the BLOCKOR operation performed on the bit-vector [0,0,00,00,00] (e.g., Comp_Comp 631) returns a "0" indicating that no additional iterations of the "WHILE" loop need to be performed. The "WHILE" loop terminates when the BLOCKOR operation returns zero. In a number of examples, the primary operation can conclude after the "WHILE" loop terminates or the primary operation can continue after the "WHILE" loop terminates. For example, the primary operation can continue by returning a value to the host 110 in FIG. 1 among other examples of how the primary operation can continue.

FIGS. 7A-7B illustrate a table showing the states of memory cells of a portion of an array at a number of iterations associated with a loop structure for performing operations in memory in accordance with a number of embodiments of the present disclosure. Column 796 of the table shown in FIGS. 7A-7B provide reference numbers (e.g., 1-10) for the rows of the table, and the reference numbers shown in the table correspond to the respective reference numbers of the pseudo code described below. The bit-vector values for each of the bit-vectors 776 (ITERATOR_MASK), 778 (STATIC_MASK), 788 (ELEMENT_MASK), are stored in the array at various phases corresponding to reference numbers 1-10.

The example described in association with FIGS. 7A-7B includes performing a primary operation using a loop structure that shifts bits towards a MSB in the ITERATOR_MASK 776 as compared to the example described in association with FIG. 6 which includes performing a primary operation using a loop structure that shifts bits towards a LSB in the ITERATOR_MASK 676. In the example described in association with FIGS. 7A-7B each of the elements from the plurality of first elements and the plurality of second elements can have a variable element widths. In contrast, in the examples provide in FIGS. 4A-4B and 5A-5B each of the elements from the plurality of first elements and the plurality of second elements have a same element width.

The bit-vectors 731, 767, 778, 788 are analogous to bit-vectors 631, 667, 678, 688 in FIG. 6. In FIGS. 7A-7B no element width is provided by a host because the element associated with the plurality of first elements and the elements associated with the plurality of second elements have variable element widths. Instead of receiving an element width from a host as described in FIGS. 4A, 4B and FIGS. 5A, 5B, a host such as host 110 in FIG. 1 can provide an ELEMENT_MASK 788 that defines the boundaries of element pairs from the plurality of first elements and the plurality of second elements that are associated with the grouping of bits in the ITERATOR_MASK 776.

In the example shown in FIGS. 7A-7B, each of plurality of first elements and the plurality of second elements are comprised of five elements with variable element widths. For example, two elements in each of the plurality of first elements and the plurality of second elements are represented by a bit-vectors that are composed of four bits (e.g., elements width equal to four) while three elements in each of the plurality of first elements and the plurality of second elements are represented by a bit-vectors that are composed of eight bits (e.g., element width equal to eight).

The below pseudo code represents instructions executable to perform a primary operation by executing a loop structure as described herein in a memory in accordance with a number of embodiments of the present disclosure. The example pseudo code is referenced using reference numbers 1-10, which correspond to the respective reference numbers 1-10 shown in column 796 of the table shown in FIG. 7. For example, reference number one (1) corresponds to "row_to_row(ELEMENT_MASK, ITERATOR_MASK)" in the below pseudo code, and reference number two (2) corresponds to "inv_to_acc(ELEMENT_MASK)" in the below pseudo code.

```
1.    row_to_row(ELEMENT_MASK, ITERATOR_MASK);
2.    inv_to_acc(ELEMENT_MASK);
3.    row_write(STATIC_MASK);
4.    acc_shift(LEFT, ZERO, 1);
5.    ace_inv_to_row(ITERATOR_MASK);
6.    while (acc_blockor( )) {
6.a       [[ COMPUTATION Logic requiring Looping ]]
6.b       row_to_acc(ITERATOR_MASK);
6.c       acc_shift(LEFT, ZERO, 1);
6.d       acc_AND_row_accip(STATIC_MASK);
      }
```

The pseudo code corresponding to reference number 1 (e.g., "row_to_row(ELEMENT_MASK, ITERATOR_MASK)") is associated with storing the ELEMENT_MASK bit-vector 788 [8,8,80,80,80] in the memory cells that store the ITERATOR_MASK 776. In a number of examples, the ELEMENT_MASK 788 and the ELEMENT_WIDTH 790 are perceived from a host 110 in FIG. 1. The ELEMENT_WIDTH 790 can be the greatest element width from the plurality of first elements and the plurality of second elements on which the primary operation is performed.

The pseudo code corresponding to reference number 2 (e.g., "inv_to_acc(ELEMENT_MASK)") is associated with performing an invert operation on the ELEMENT_MASK 788 and storing the result of the invert operation in the sensing circuitry as Comp_Comp 731. Performing an invert operation on Comp_Comp 731 identifies all of the bits except the MSB in the plurality of first elements and the plurality of second elements. Performing an invert operation on bit-vector 688 [8,8,80,80,80] results in bit-vector [7,7,7F,7F,7F] being stored as bit-vector 731 in the sensing circuitry.

The pseudo code corresponding to reference number 3 (e.g., "row_write(STATIC_MASK)") writing the data pattern stored in the sensing circuitry (e.g., bit-vector 631) to the cells storing STATIC_MASK 778. For example, the bit-vector [7,7,7F,7F,7F] is stored to the memory cells that store STATIC_MASK 778.

The pseudo code corresponding to reference number 4 (e.g., "acc_shift(LEFT, ZERO, 1)") is associated with performing a left shift operation on Comp_Comp 731 and storing the result of the left shift operation in the sensing circuitry. The Comp_Comp bit-vector 731 is shifted towards a MSB resulting in the bit-vector [E,E,FE,FE,FE] being stored in the sensing circuitry.

The pseudo code corresponding to reference number 5 (e.g., "acc_inv_to_row(ITERATOR_MASK)") is associated with performing a invert operation on Comp_Comp 731 and storing the result in the ITERATOR_MASK 776. Inverting the Comp_Comp 731 results in the bit-vector [1, 1, 01, 01, 01] being stored in the sensing circuitry. The bit-vector [1, 1, 01, 01, 01] is then stored to the memory cells that store ITERATOR_MASK 776.

The pseudo code corresponding to reference number 6 (e.g., "while (acc_blockor( ))") is associated with performing a loop structure using the Comp_Comp bit-vector 731. The loop structure associated with reference number 6 is a "WHILE" loop in the example provided in FIGS. 7A-7B. The "WHILE" loop is implemented using a BLOCKOR as a conditional statement. For example, a number of operations can be performed repeatedly while a BLOCKOR operation returns a true value (e.g., a "1"). A BLOCKOR operation can be performed on the vector 731 (e.g., vector stored in compute component 331 in FIG. 3). In a first iteration of the "WHILE" loop the BLOCKOR operation returns a true value because Comp_Comp bit-vector 731 [1,1,01,01,01] includes at least one one-bit which indicates that additional iterations of the "WHILE" loop are needed to perform the primary operation.

The pseudo code corresponding to reference number 6.a (e.g., "COMPUTATION Logic requiring Looping") is associated with performing a number of secondary operations that are associated with performing the primary operation. The secondary operations are performed in each iteration of the "WHILE" loop.

The pseudo code corresponding to reference number 6.b (e.g., "row_to_acc(ITERATOR_MASK)") is associated with writing the data pattern stored in the memory cells that store the ITERATOR_MASK 776 to the sensing circuitry as Comp_Comp 731. For example, in a first iteration of reference number 6.b, the ITERATOR_MASK bit-vector 776 [1,1,01,01,01] is stored in the sensing circuitry as Comp_Comp 731.

The pseudo code corresponding to reference number 6.b (e.g., "acc_shift(LEFT, ZERO, 1)") is associated with performing a left shift operation on Comp_Comp 731 and storing the result of the left shift operation in the sensing circuitry. In the first iteration of reference number 6.c, the Comp_Comp bit-vector 731 is shifted resulting in the bit-vector [2,2,02,02,02] being stored in the sensing circuitry. Shifting the bits in Comp_Comp 731 that are associated with the ITERATOR_MASK 776 indicates that an iteration of the "WHILE" loop has been performed.

The pseudo code corresponding to reference number 6.*d* (e.g., "acc_AND_row_accip(STATIC_MASK)") is associated with performing an AND operation on Comp_Comp 731 and STATIC_MASK 778 to prevent the left shift operation associated with reference number 6.*c* from shifting bits from one of the plurality of groups in the ITERATOR_MASK 776 to a different group of the plurality of groups in the ITERATOR_MASK 776. In the first iteration of reference number 6.*d*, an AND operation is performed on the bit-vector [2,2,02,02,02] (e.g., Comp_Comp 731) and the bit-vector [7,7,7F,7F,7F] resulting in the bit-vector [2,2,02,02,02] being stored in the sensing circuitry and the memory cells that store the ITERATOR MASK 776.

In a second iteration of reference number 6 the BLOCKOR operation performed on the bit-vector [2,2,02,02,02] (e.g., Comp_Comp 731) returns a "1" indicating that additional iterations of the "WHILE" loop need to be performed. In the second iteration of reference number 6.*a*, the number of secondary operations are performed. In the second iteration of reference number 6.*b*, the ITERATOR_MASK bit-vector 776 [2,2,02,02,02] is stored in the sensing circuitry as Comp_Comp 731. In the second iteration of reference number 6.*c*, the Comp_Comp bit-vector 731 is shifted resulting in the bit-vector [4,4,04,04,04] being stored in the sensing circuitry. In the second iteration of reference number 6.*d*, an AND operation is performed on the bit-vector [4,4,04,04,04] (e.g., Comp_Comp 731) and the bit-vector [7,7,7F,7F,7F] resulting in the bit-vector [4,4,04,04,04] being stored in the sensing circuitry and the memory cells that store the ITERATOR MASK 776.

In a third iteration of reference number 6 the BLOCKOR operation performed on the bit-vector [4,4,04,04,04] (e.g., Comp_Comp 731) returns a "1" indicating that additional iterations of the "WHILE" loop need to be performed. In a third iteration of reference number 6.*a*, the number of secondary operations are performed. In the third iteration of reference number 6.*b*, the ITERATOR_MASK bit-vector 776 [4,4,04,04,04] is stored in the sensing circuitry as Comp_Comp 731. In the third iteration of reference number 6.*c*, the Comp_Comp bit-vector 731 is shifted resulting in the bit-vector [8,8,08,08,08] being stored in the sensing circuitry. In the third iteration of reference number 6.*d*, an AND operation is performed on the bit-vector [8,8,08,08,08] (e.g., Comp_Comp 731) and the bit-vector [7,7,7F,7F,7F] resulting in the bit-vector [0,0,08,08,08] being stored in the sensing circuitry and the memory cells that store the ITERATOR MASK 776.

In a fourth iteration of reference number 6 the BLOCKOR operation performed on the bit-vector [0,0,08,08,08] (e.g., Comp_Comp 731) returns a "1" indicating that additional iterations of the "WHILE" loop need to be performed. The ITERATOR_MASK 776 that is store as Comp_Comp 731 indicates that the number of secondary operations do not need to be performed on the fourth and fifth element pairs from the plurality of first elements and the plurality of second elements because the fourth and fifth groups of bits in the ITERATOR_MASK 776 do not include at least one one-bit (e.g., a binary bit-vector [0000, 0000, 0000 1000, 0000 1000, 0000 1000]. However, the ITERATOR_MASK 776 also indicates that additional iterations of the second operations need to be performed on the first, second, and third element pars from the plurality of first elements and the plurality of second elements because the first, second, and third groups of bits in the ITERATOR_MASK 776 include at least one one-bit (e.g., a binary bit-vector [0000, 0000, 0000 1000, 0000 1000, 0000 1000]. In the fourth iteration of reference number 6.*a*, the number of secondary operations are performed. The number of second operations can utilize the ITERATOR_MASK 776 to only perform the number of second operation on the first, second, and third element pairs from the plurality of first elements and the plurality of second elements. In the fourth iteration of reference number 6.*b*, the ITERATOR_MASK bit-vector 776 [0,0,08,08,08] is stored in the sensing circuitry as Comp_Comp 731. In the fourth iteration of reference number 6.*c*, the Comp_Comp bit-vector 731 is shifted resulting in the bit-vector [0,0,10,10,10] being stored in the sensing circuitry. In the fourth iteration of reference number 6.*d*, an AND operation is performed on the bit-vector [0,0,10,10,10] (e.g., Comp_Comp 731) and the bit-vector [7,7,7F,7F,7F] resulting in the bit-vector [0,0,10,10,10] being stored in the sensing circuitry and the memory cells that store the ITERATOR MASK 776.

In a fifth iteration of reference number 7 the BLOCKOR operation performed on the bit-vector [0,0,10,10,10] (e.g., Comp_Comp 731) returns a "1" indicating that additional iterations of the "WHILE" loop need to be performed. In the fifth iteration of reference number 7.*a*, the number of secondary operations are performed on the first, second, and third element pairs from the plurality of first elements and the plurality of second elements. In the fifth iteration of reference number 7.*b*, the ITERATOR_MASK bit-vector 776 [0,0,10,10,10] is stored in the sensing circuitry as Comp_Comp 731. In the fifth iteration of reference number 7.*c*, the Comp_Comp bit-vector 731 is shifted resulting in the bit-vector [0,0,20,20,20] being stored in the sensing circuitry. In the fifth iteration of reference number 7.*d*, an AND operation is performed on the bit-vector [0,0,20,20,20] (e.g., Comp_Comp 731) and the bit-vector [7,7,7F,7F,7F] resulting in the bit-vector [0,0,20,20,20] being stored in the sensing circuitry and the memory cells that store the ITERATOR MASK 776.

In a sixth iteration of reference number 7 the BLOCKOR operation performed on the bit-vector [0,0,20,20,20] (e.g., Comp_Comp 731) returns a "1" indicating that additional iterations of the "WHILE" loop need to be performed. In the sixth iteration of reference number 7.*a*, the number of secondary operations are performed on the first, second, and third element pairs from the plurality of first elements and the plurality of second elements. In the sixth iteration of reference number 7.*b*, the ITERATOR_MASK bit-vector 776 [0,0,20,20,20] is stored in the sensing circuitry as Comp_Comp 731. In the sixth iteration of reference number 7.*c*, the Comp_Comp bit-vector 731 is shifted resulting in the bit-vector [0,0,40,40,40] being stored in the sensing circuitry. In the sixth iteration of reference number 7.*d*, an AND operation is performed on the bit-vector [0,0,40,40,40] (e.g., Comp_Comp 731) and the bit-vector [7,7,7F,7F,7F] resulting in the bit-vector [0,0,40,40,40] being stored in the sensing circuitry and the memory cells that store the ITERATOR MASK 776.

In a seventh iteration of reference number 7 the BLOCKOR operation performed on the bit-vector [0,0,40,40,40] (e.g., Comp_Comp 731) returns a "1" indicating that additional iterations of the "WHILE" loop need to be performed. In the seventh iteration of reference number 7.*a*, the number of secondary operations are performed on the first, second, and third element pairs from the plurality of first elements and the plurality of second elements. In the seventh iteration of reference number 7.*b*, the ITERATOR_MASK bit-vector 776 [0,0,40,40,40] is stored in the sensing circuitry as Comp_Comp 731. In the seventh iteration of reference number 7.*c*, the Comp_Comp bit-vector 731 is shifted resulting in the bit-vector [0,0,80,80,80] being stored in the sensing circuitry. In the seventh iteration of reference number 7.d, an AND operation is performed on the bit-vector [0,0,80,80,80] (e.g., Comp_Comp 731) and the bit-vector [7,7,7F,7F,7F] resulting in the bit-vector [0,0,00,00, 00] being stored in the sensing circuitry and the memory cells that store the ITERATOR MASK 776.

In an eight iteration (e.g., not shown) of reference number 7 the BLOCKOR operation performed on the bit-vector [0,0,00,00,00] (e.g., Comp_Comp 731) returns a "0" indicating that no additional iterations of the "WHILE" loop need to be performed. The "WHILE" loop terminates when the BLOCKOR operation returns zero. In a number of examples, the primary operation can conclude after the "WHILE" loop terminates or the primary operation can continue after the "WHILE" loop terminates. For example, the primary operation can continue by returning a value to the host 110 in FIG. 1 among other examples of how the primary operation can continue.

Embodiments however, are not limited to the order of the sequence of instructions in the pseudo code in this example. For example, a number of operations reference in particular reference number can be performed before a number of operations reference in different reference number are performed.

Example functionality of the sensing circuitry 250 of FIG. 2A is described below and summarized in Table 1 below with respect to performing logical operations and initially storing a result in the sense amplifier 206. Initially storing the result of a particular logical operation in the primary latch of sense amplifier 206 can provide improved versatility as compared to previous approaches in which the result may initially reside in a secondary latch (e.g., accumulator) of a compute component 231, and then be subsequently transferred to the sense amplifier 206, for instance.

TABLE 1

| Operation | Accumulator | Sense Amp |
|---|---|---|
| AND | Unchanged | Result |
| OR | Unchanged | Result |
| NOT | Unchanged | Result |
| SHIFT | Unchanged | Shifted Data |

Initially storing the result of a particular operation in the sense amplifier 206 (e.g., without having to perform an additional operation to move the result from the compute component 231 (e.g., accumulator) to the sense amplifier 206) is advantageous because, for instance, the result can be written to a row (of the array of memory cells) or back into the accumulator without performing a precharge cycle (e.g., on the complementary data lines 205-1 (D) and/or 205-2 (D_)).

Figure 8:
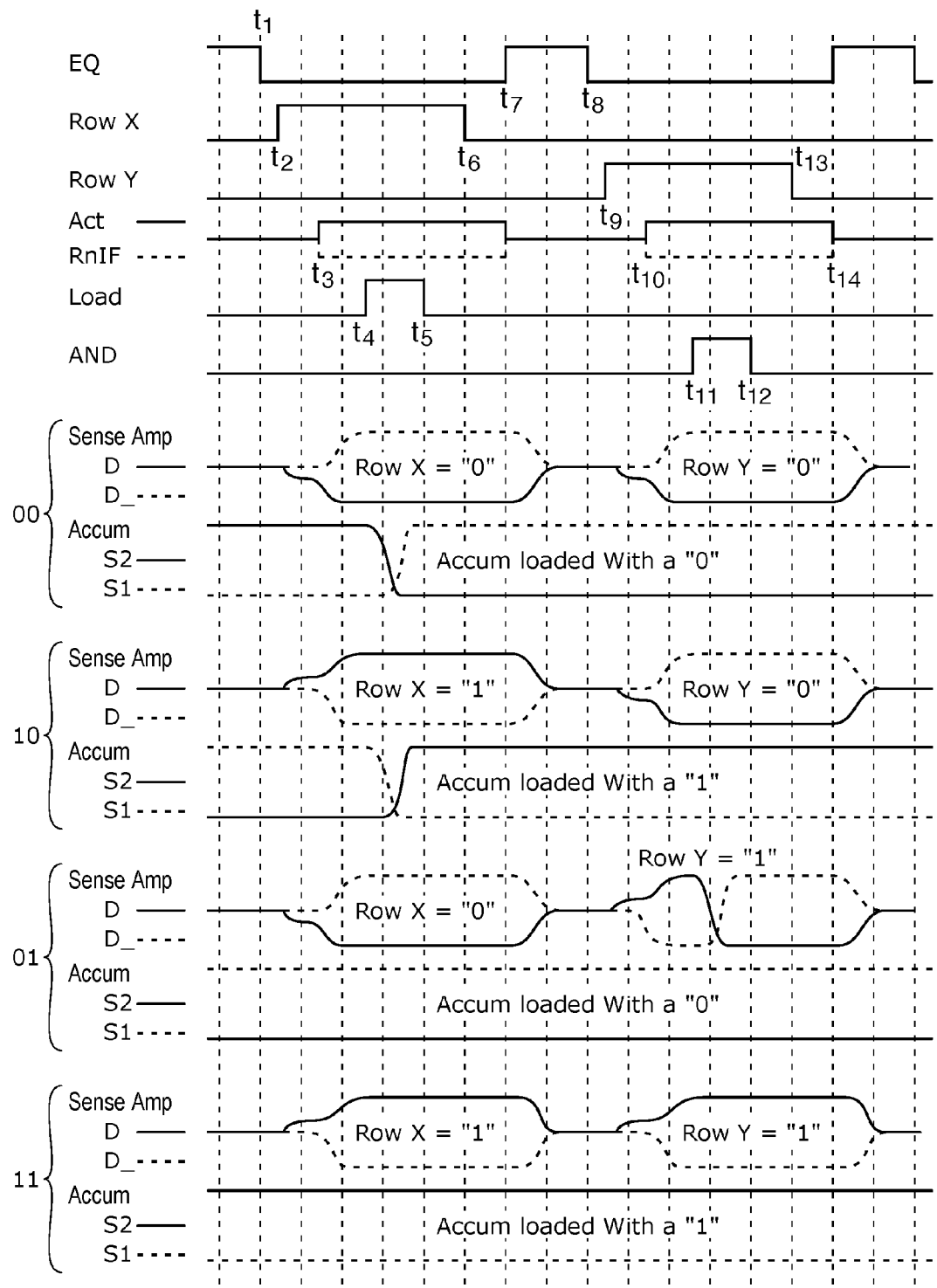
FIG. 8 illustrates a timing diagram associated with performing a number of logical operations using sensing circuitry in accordance with a number of embodiments of the present disclosure.

FIG. 8 illustrates a timing diagram associated with performing a number of logical operations using sensing circuitry in accordance with a number of embodiments of the present disclosure. FIG. 8 illustrates a timing diagram associated with initiating an AND logical operation on a first operand and a second operand. In this example, the first operand is stored in a memory cell coupled to a first access line (e.g., ROW X) and the second operand is stored in a memory cell coupled to a second access line (e.g., ROW Y). Although the example refers to performing an AND on data stored in cells corresponding to one particular column, embodiments are not so limited. For instance, an entire row of data values can be ANDed, in parallel, with a different row of data values. For example, if an array comprises 2,048 columns, then 2,048 AND operations could be performed in parallel.

FIG. 8 illustrates a number of control signals associated with operating sensing circuitry (e.g., 250) to perform the AND logical operation. "EQ" corresponds to an equilibrate signal applied to the sense amp 206, "ROW X" corresponds to an activation signal applied to access line 204-X, "ROW Y" corresponds to an activation signal applied to access line 204-Y, "Act" and "RnIF" correspond to a respective active positive and negative control signal applied to the sense amp 206, "LOAD" corresponds to a load control signal (e.g., LOAD/PASSD and LOAD/PASSDb shown in FIG. 2A), and "AND" corresponds to the AND control signal shown in FIG. 2A. FIG. 8 also illustrates the waveform diagrams showing the signals (e.g., voltage signals) on the digit lines D and D_ corresponding to sense amp 206 and on the nodes S1 and S2 corresponding to the compute component 231 (e.g., Accum) during an AND logical operation for the various data value combinations of the Row X and Row Y data values (e.g., diagrams correspond to respective data value combinations 00, 10, 01, 11). The particular timing diagram waveforms are discussed below with respect to the pseudo code associated with an AND operation of the circuit shown in FIG. 2A.

An example of pseudo code associated with loading (e.g., copying) a first data value stored in a cell coupled to row 204-X into the accumulator can be summarized as follows:
  Copy Row X into the Accumulator:
  Deactivate EQ
  Open Row X
  Fire Sense Amps (after which Row X data resides in the sense amps)
  Activate LOAD (sense amplifier data (Row X) is transferred to nodes S1 and S2 of the Accumulator and resides there dynamically)
  Deactivate LOAD
  Close Row X
  Precharge In the pseudo code above, "Deactivate EQ" indicates that an equilibration signal (EQ signal shown in FIG. 8) corresponding to the sense amplifier 206 is disabled at $t_1$ as shown in FIG. 8 (e.g., such that the complementary data lines (e.g., 205-1 (D) and 205-2 (D_) are no longer shorted to $V_{DD}/2$). After equilibration is disabled, a selected row (e.g., ROW X) is enabled (e.g., selected, opened such as by activating a signal to select a particular row) as indicated by "Open Row X" in the pseudo code and shown at $t_2$ for signal Row X in FIG. 8. When the voltage signal applied to ROW X reaches the threshold voltage (Vt) of the access transistor (e.g., 202-2) corresponding to the selected cell, the access transistor turns on and couples the data line (e.g., 205-2 (D_)) to the selected cell (e.g., to capacitor 203-2) which creates a differential voltage signal between the data lines.

After Row X is enabled (e.g., activated), in the pseudo code above, "Fire Sense Amps" indicates that the sense amplifier 206 is enabled to set the primary latch and subsequently disabled. For example, as shown at $t_3$ in FIG. 8, the ACT positive control signal (e.g., 265 shown in FIG. 2B) goes high and the RnIF negative control signal (e.g., 228 shown in FIG. 2B) goes low, which amplifies the differential signal between 205-1 (D) and D_ 205-2, resulting in a voltage (e.g., VDD) corresponding to a logic 1 or a voltage (e.g., GND) corresponding to a logic 0 being on data line 205-1 (D) (and the voltage corresponding to the other logic state being on complementary data line 205-2 (D_)). The sensed data value is stored in the primary latch of sense amplifier 206. The primary energy consumption occurs in charging the data lines (e.g., 205-1 (D) or 205-2 (D_)) from the equilibration voltage $V_{DD}/2$ to the rail voltage $V_{DD}$.

The four sets of possible sense amplifier and accumulator signals illustrated in FIG. 8 (e.g., one for each combination of Row X and Row Y data values) shows the behavior of signals on data lines D and D_. The Row X data value is stored in the primary latch of the sense amp. It should be noted that FIG. 2A shows that the memory cell including storage element 202-2, corresponding to Row X, is coupled to the complementary data line D_, while the memory cell including storage element 202-1, corresponding to Row Y, is coupled to data line D. However, as can be seen in FIG. 2A, the charge stored in memory cell 202-2 (corresponding to Row X) corresponding to a "0" data value causes the voltage on data line D_ (to which memory cell 202-2 is coupled) to go high and the charge stored in memory cell 202-2 corresponding to a "1" data value causes the voltage on data line D_ to go low, which is opposite correspondence between data states and charge stored in memory cell 202-2, corresponding to Row Y, that is coupled to data line D. These differences in storing charge in memory cells coupled to different data lines is appropriately accounted for when writing data values to the respective memory cells.

After firing the sense amps, in the pseudo code above, "Activate LOAD" indicates that the LOAD control signal goes high as shown at $t_4$ in FIG. 8, causing load/pass transistors 218-1 and 218-2 to conduct. In this manner, activating the LOAD control signal enables the secondary latch in the accumulator of the compute component 231. The sensed data value stored in the sense amplifier 206 is transferred (e.g., copied) to the secondary latch. As shown for each of the four sets of possible sense amplifier and accumulator signals illustrated in FIG. 8, the behavior at inputs of the secondary latch of the accumulator indicates the secondary latch is loaded with the Row X data value. As shown in FIG. 8, the secondary latch of the accumulator may flip (e.g., see accumulator signals for Row X="0" and Row Y="0" and for Row X="1" and Row Y="0"), or not flip (e.g., see accumulator signals for Row X="0" and Row Y="1" and for Row X="1" and Row Y="1"), depending on the data value previously stored in the dynamic latch.

After setting the secondary latch from the data values stored in the sense amplifier (and present on the data lines 205-1 (D) and 205-2 (D_), in the pseudo code above, "Deactivate LOAD" indicates that the LOAD control signal goes back low as shown at $t_5$ in FIG. 8 to cause the load/pass transistors 218-1 and 218-2 to stop conducting and thereby isolate the dynamic latch from the complementary data lines. However, the data value remains dynamically stored in secondary latch of the accumulator.

After storing the data value on the secondary latch, the selected row (e.g., ROW X) is disabled (e.g., deselected, closed such as by deactivating a select signal for a particular row) as indicated by "Close Row X" and indicated at $t_6$ in FIG. 8, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as indicated in FIG. 8 by the EQ signal going high at $t_7$. As shown in each of the four sets of possible sense amplifier and accumulator signals illustrated in FIG. 8 at $t_7$, the equilibrate operation causes the voltage on data lines D and D_ to each return to $V_{DD}/2$.

Equilibration can occur, for instance, prior to a memory cell sensing operation or the logical operations (described below).

A subsequent operation phase associated with performing the AND or the OR operation on the first data value (now stored in the sense amplifier 206 and the secondary latch of the compute component 231) and the second data value (stored in a memory cell 202-1 coupled to Row Y 204-Y) includes performing particular steps which depend on the whether an AND or an OR is to be performed. Examples of pseudo code associated with "ANDing" and "ORing" the data value residing in the accumulator (e.g., the first data value stored in the memory cell 202-2 coupled to Row X 204-X) and the second data value (e.g., the data value stored in the memory cell 202-1 coupled to Row Y 204-Y) are summarized below. Example pseudo code associated with "ANDing" the data values can include:

Deactivate EQ
Open Row Y
Fire Sense Amps (after which Row Y data resides in the sense amps)
Close Row Y
The result of the logic operation, in the next operation, will be placed on the sense amp, which will overwrite any row that is active.
Even when Row Y is closed, the sense amplifier still contains the Row Y data value.
Activate AND
This results in the sense amplifier being written to the value of the function (e.g., Row X AND Row Y)
If the accumulator contains a "0" (i.e., a voltage corresponding to a "0" on node S2 and a voltage corresponding to a "1" on node S1), the sense amplifier data is written to a "0"
If the accumulator contains a "1" (i.e., a voltage corresponding to a "1" on node S2 and a voltage corresponding to a "0" on node S1), the sense amplifier data remains unchanged (Row Y data)
This operation leaves the data in the accumulator unchanged.
Deactivate AND
Precharge In the pseudo code above, "Deactivate EQ" indicates that an equilibration signal corresponding to the sense amplifier 206 is disabled (e.g., such that the complementary data lines 205-1 (D) and 205-2 (D_) are no longer shorted to $V_{DD}/2$), which is illustrated in FIG. 8 at $t_8$. After equilibration is disabled, a selected row (e.g., ROW Y) is enabled as indicated in the pseudo code above by "Open Row Y" and shown in FIG. 8 at $t_9$. When the voltage signal applied to ROW Y reaches the threshold voltage (Vt) of the access transistor (e.g., 202-1) corresponding to the selected cell, the access transistor turns on and couples the data line (e.g., D_ 205-1) to the selected cell (e.g., to capacitor 203-1) which creates a differential voltage signal between the data lines.

After Row Y is enabled, in the pseudo code above, "Fire Sense Amps" indicates that the sense amplifier 206 is enabled to amplify the differential signal between 205-1 (D) and 205-2 (D_), resulting in a voltage (e.g., $V_{DD}$) corresponding to a logic 1 or a voltage (e.g., GND) corresponding to a logic 0 being on data line 205-1 (D) (and the voltage corresponding to the other logic state being on complementary data line 205-2 (D_)). As shown at $t_{10}$ in FIG. 8, the ACT positive control signal (e.g., 265 shown in FIG. 2B) goes high and the RnIF negative control signal (e.g., 228 shown in FIG. 2B) goes low to fire the sense amps. The sensed data value from memory cell 202-1 is stored in the primary latch of sense amplifier 206, as previously described. The secondary latch still corresponds to the data value from memory cell 202-2 since the dynamic latch is unchanged.

After the second data value sensed from the memory cell 202-1 coupled to Row Y is stored in the primary latch of sense amplifier 206, in the pseudo code above, "Close Row Y" indicates that the selected row (e.g., ROW Y) can be disabled if it is not desired to store the result of the AND logical operation back in the memory cell corresponding to Row Y. However, FIG. 8 shows that Row Y is left enabled such that the result of the logical operation can be stored back in the memory cell corresponding to Row Y. Isolating the memory cell corresponding to Row Y can be accomplished by the access transistor turning off to decouple the selected cell 202-1 from the data line 205-1 (D). After the selected Row Y is configured (e.g., to isolate the memory cell or not isolate the memory cell), "Activate AND" in the pseudo code above indicates that the AND control signal goes high as shown in FIG. 8 at $t_{11}$, causing pass transistor 207-1 to conduct. In this manner, activating the AND control signal causes the value of the function (e.g., Row X AND Row Y) to be written to the sense amp.

With the first data value (e.g., Row X) stored in the dynamic latch of the accumulator 231 and the second data value (e.g., Row Y) stored in the sense amplifier 206, if the dynamic latch of the compute component 231 contains a "0" (i.e., a voltage corresponding to a "0" on node S2 and a voltage corresponding to a "1" on node S1), the sense amplifier data is written to a "0" (regardless of the data value previously stored in the sense amp) since the voltage corresponding to a "1" on node S1 causes transistor 209-1 to conduct thereby coupling the sense amplifier 206 to ground through transistor 209-1, pass transistor 207-1 and data line 205-1 (D). When either data value of an AND operation is "0," the result is a "0." Here, when the second data value (in the dynamic latch) is a "0," the result of the AND operation is a "0" regardless of the state of the first data value, and so the configuration of the sensing circuitry causes the "0" result to be written and initially stored in the sense amplifier 206. This operation leaves the data value in the accumulator unchanged (e.g., from Row X).

If the secondary latch of the accumulator contains a "1" (e.g., from Row X), then the result of the AND operation depends on the data value stored in the sense amplifier 206 (e.g., from Row Y). The result of the AND operation should be a "1" if the data value stored in the sense amplifier 206 (e.g., from Row Y) is also a "1," but the result of the AND operation should be a "0" if the data value stored in the sense amplifier 206 (e.g., from Row Y) is also a "0." The sensing circuitry 250 is configured such that if the dynamic latch of the accumulator contains a "1" (i.e., a voltage corresponding to a "1" on node S2 and a voltage corresponding to a "0" on node S1), transistor 209-1 does not conduct, the sense amplifier is not coupled to ground (as described above), and the data value previously stored in the sense amplifier 206 remains unchanged (e.g., Row Y data value so the AND operation result is a "1" if the Row Y data value is a "1" and the AND operation result is a "0" if the Row Y data value is a "0"). This operation leaves the data value in the accumulator unchanged (e.g., from Row X).

After the result of the AND operation is initially stored in the sense amplifier 206, "Deactivate AND" in the pseudo code above indicates that the AND control signal goes low as shown at $t_{12}$ in FIG. 8, causing pass transistor 207-1 to stop conducting to isolate the sense amplifier 206 (and data line 205-1 (D)) from ground. If not previously done, Row Y can be closed (as shown at $t_{13}$ in FIG. 8) and the sense amplifier can be disabled (as shown at $t_{14}$ in FIG. 8 by the ACT positive control signal going low and the RnIF negative control signal goes high). With the data lines isolated, "Precharge" in the pseudo code above can cause a precharge of the data lines by an equilibrate operation, as described previously (e.g., commencing at $t_{14}$ shown in FIG. 8).

FIG. 8 shows, in the alternative, the behavior of voltage signals on the data lines (e.g., 205-1 (D) and 205-2 (D_) shown in FIG. 2A) coupled to the sense amplifier (e.g., 206 shown in FIG. 2A) and the behavior of voltage signals on nodes S1 and S1 of the secondary latch of the compute component (e.g., 231 shown in FIG. 2A) for an AND logical operation involving each of the possible combination of operands (e.g., Row X/Row Y data values 00, 10, 01, and 11).

Although the timing diagrams illustrated in FIG. 8 and the pseudo code described above indicate initiating the AND logical operation after starting to load the second operand (e.g., Row Y data value) into the sense amplifier, the circuit shown in FIG. 2A can be successfully operated by initiating the AND logical operation before starting to load the second operand (e.g., Row Y data value) into the sense amplifier.

Figure 9:
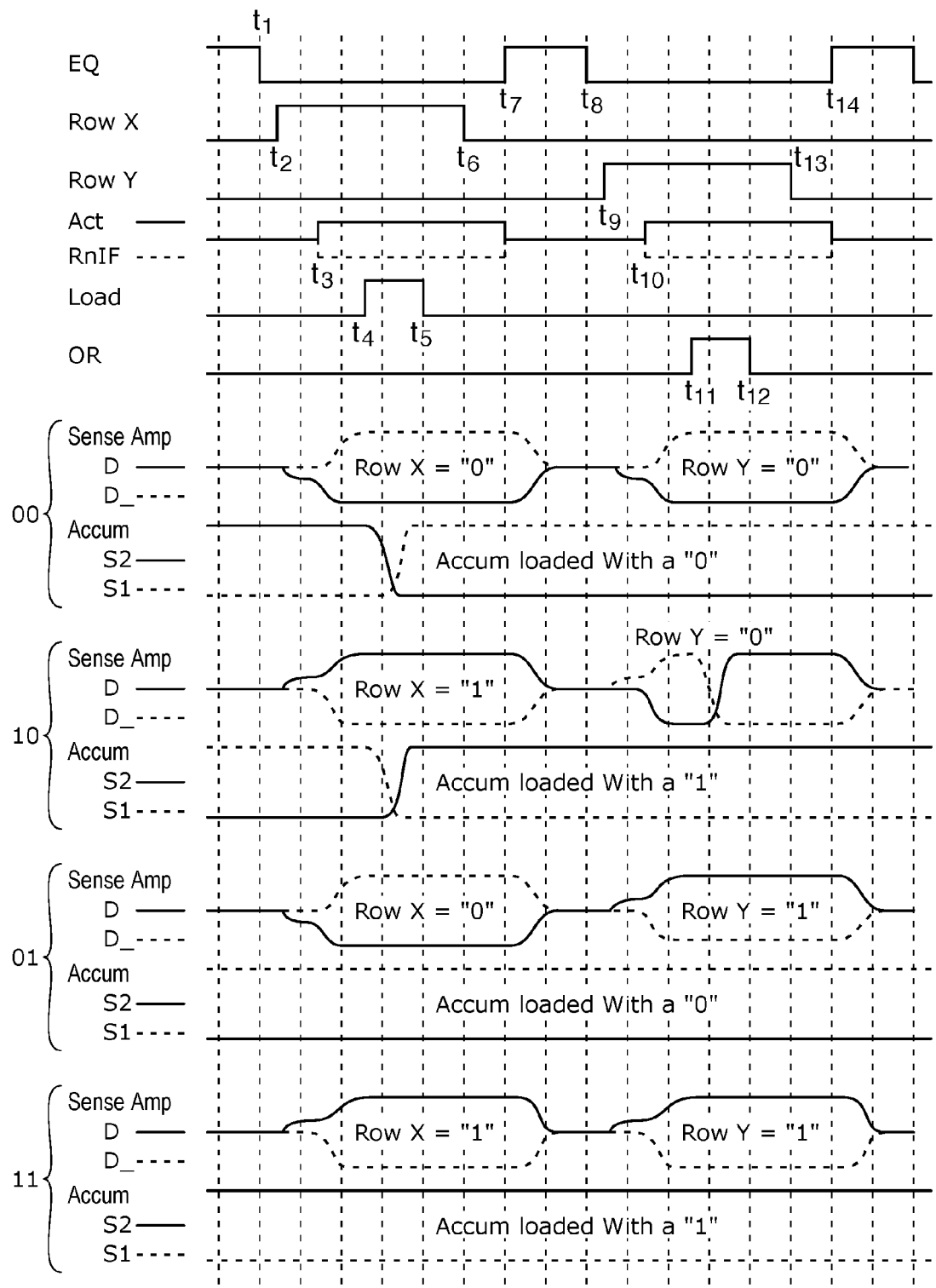
FIG. 9 illustrates a timing diagram associated with performing a number of logical operations using sensing circuitry in accordance with a number of embodiments of the present disclosure.

FIG. 9 illustrates a timing diagram associated with performing a number of logical operations using sensing circuitry in accordance with a number of embodiments of the present disclosure. FIG. 9 illustrates a timing diagram associated with initiating an OR logical operation after starting to load the second operand (e.g., Row Y data value) into the sense amplifier. FIG. 9 illustrates the sense amplifier and accumulator signals for various combinations of first and second operand data values. The particular timing diagram signals are discussed below with respect to the pseudo code associated with an AND logical operation of the circuit shown in FIG. 2A.

A subsequent operation phase can alternately be associated with performing the OR operation on the first data value (now stored in the sense amplifier 206 and the secondary latch of the compute component 231) and the second data value (stored in a memory cell 202-1 coupled to Row Y 204-Y). The operations to load the Row X data into the sense amplifier and accumulator that were previously described with respect to times $t_1$-$t_7$ shown in FIG. 8 are not repeated with respect to FIG. 9. Example pseudo code associated with "ORing" the data values can include:

Deactivate EQ
Open Row Y
Fire Sense Amps (after which Row Y data resides in the sense amps)
Close Row Y
When Row Y is closed, the sense amplifier still contains the Row Y data value.
Activate OR
This results in the sense amplifier being written to the value of the function (e.g., Row X OR Row Y), which may overwrite the data value from Row Y previously stored in the sense amplifier as follows:
If the accumulator contains a "0" (i.e., a voltage corresponding to a "0" on node S2 and a voltage corresponding to a "1" on node S1), the sense amplifier data remains unchanged (Row Y data)
If the accumulator contains a "1" (i.e., a voltage corresponding to a "1" on node S2 and a voltage corresponding to a "0" on node S1), the sense amplifier data is written to a "1"
This operation leaves the data in the accumulator unchanged.

Deactivate OR

Precharge

The "Deactivate EQ" (shown at $t_8$ in FIG. 9), "Open Row Y" (shown at $t_9$ in FIG. 9), "Fire Sense Amps" (shown at $t_{10}$ in FIG. 9), and "Close Row Y" (shown at $t_{13}$ in FIG. 9, which may occur prior to initiating the particular logical function control signal), shown in the pseudo code above indicate the same functionality as previously described with respect to the AND operation pseudo code. Once the configuration of selected Row Y is appropriately configured (e.g., enabled if logical operation result is to be stored in memory cell corresponding to Row Y or closed to isolate memory cell if result if logical operation result is not to be stored in memory cell corresponding to Row Y), "Activate OR" in the pseudo code above indicates that the OR control signal goes high as shown at $t_{11}$ in FIG. 9, which causes pass transistor 207-2 to conduct. In this manner, activating the OR control signal causes the value of the function (e.g., Row X OR Row Y) to be written to the sense amp.

With the first data value (e.g., Row X) stored in the secondary latch of the compute component 231 and the second data value (e.g., Row Y) stored in the sense amplifier 206, if the dynamic latch of the accumulator contains a "0" (i.e., a voltage corresponding to a "0" on node S2 and a voltage corresponding to a "1" on node S1), then the result of the OR operation depends on the data value stored in the sense amplifier 206 (e.g., from Row Y). The result of the OR operation should be a "1" if the data value stored in the sense amplifier 206 (e.g., from Row Y) is a "1," but the result of the OR operation should be a "0" if the data value stored in the sense amplifier 206 (e.g., from Row Y) is also a "0." The sensing circuitry 250 is configured such that if the dynamic latch of the accumulator contains a "0," with the voltage corresponding to a "0" on node S2, transistor 209-2 is off and does not conduct (and pass transistor 207-1 is also off since the AND control signal is not asserted) so the sense amplifier 206 is not coupled to ground (either side), and the data value previously stored in the sense amplifier 206 remains unchanged (e.g., Row Y data value such that the OR operation result is a "1" if the Row Y data value is a "1" and the OR operation result is a "0" if the Row Y data value is a "0").

If the dynamic latch of the accumulator contains a "1" (i.e., a voltage corresponding to a "1" on node S2 and a voltage corresponding to a "0" on node S1), transistor 209-2 does conduct (as does pass transistor 207-2 since the OR control signal is asserted), and the sense amplifier 206 input coupled to data line 205-2 (D_) is coupled to ground since the voltage corresponding to a "1" on node S2 causes transistor 209-2 to conduct along with pass transistor 207-2 (which also conducts since the OR control signal is asserted). In this manner, a "1" is initially stored in the sense amplifier 206 as a result of the OR operation when the secondary latch of the accumulator contains a "1" regardless of the data value previously stored in the sense amp. This operation leaves the data in the accumulator unchanged. FIG. 9 shows, in the alternative, the behavior of voltage signals on the data lines (e.g., 205-1 (D) and 205-2 (D_)) shown in FIG. 2A) coupled to the sense amplifier (e.g., 206 shown in FIG. 2A) and the behavior of voltage signals on nodes S1 and S2 of the secondary latch of the compute component 231 for an OR logical operation involving each of the possible combination of operands (e.g., Row X/Row Y data values 00, 10, 01, and 11).

After the result of the OR operation is initially stored in the sense amplifier 206, "Deactivate OR" in the pseudo code above indicates that the OR control signal goes low as shown at $t_{12}$ in FIG. 9, causing pass transistor 207-2 to stop conducting to isolate the sense amplifier 206 (and data line D 205-2) from ground. If not previously done, Row Y can be closed (as shown at $t_{13}$ in FIG. 9) and the sense amplifier can be disabled (as shown at $t_{14}$ in FIG. 9 by the ACT positive control signal going low and the RnIF negative control signal going high). With the data lines isolated, "Precharge" in the pseudo code above can cause a precharge of the data lines by an equilibrate operation, as described previously and shown at $t_{14}$ in FIG. 9.

The sensing circuitry 250 illustrated in FIG. 2A can provide additional logical operations flexibility as follows. By substituting operation of the ANDinv control signal for operation of the AND control signal, and/or substituting operation of the ORinv control signal for operation of the OR control signal in the AND and OR operations described above, the logical operations can be changed from {Row X AND Row Y} to {~Row X AND Row Y} (where "~Row X" indicates an opposite of the Row X data value, e.g., NOT Row X) and can be changed from {Row X OR Row Y} to {~Row X OR Row Y}. For example, during an AND operation involving the inverted data values, the ANDinv control signal can be asserted instead of the AND control signal, and during an OR operation involving the inverted data values, the ORInv control signal can be asserted instead of the OR control signal. Activating the ORinv control signal causes transistor 214-1 to conduct and activating the ANDinv control signal causes transistor 214-2 to conduct. In each case, asserting the appropriate inverted control signal can flip the sense amplifier and cause the result initially stored in the sense amplifier 206 to be that of the AND operation using inverted Row X and true Row Y data values or that of the OR operation using the inverted Row X and true Row Y data values. A true or compliment version of one data value can be used in the accumulator to perform the logical operation (e.g., AND, OR), for example, by loading a data value to be inverted first and a data value that is not to be inverted second.

In a similar approach to that described above with respect to inverting the data values for the AND and OR operations described above, the sensing circuitry shown in FIG. 2A can perform a NOT (e.g., invert) operation by putting the non-inverted data value into the dynamic latch of the accumulator and using that data to invert the data value in the sense amplifier 206. As previously mentioned, activating the ORinv control signal causes transistor 214-1 to conduct and activating the ANDinv control signal causes transistor 214-2 to conduct. The ORinv and/or ANDinv control signals are used in implementing the NOT function, as described further below:

Copy Row X into the Accumulator

Deactivate EQ

Open Row X

Fire Sense Amps (after which Row X data resides in the sense amps)

Activate LOAD (sense amplifier data (Row X) is transferred to nodes S1 and S2 of the Accumulator and resides there dynamically Deactivate LOAD Activate ANDinv and ORinv (which puts the compliment data value on the data lines)

This results in the data value in the sense amplifier being inverted (e.g., the sense amplifier latch is flipped)

This operation leaves the data in the accumulator unchanged

Deactivate ANDinv and ORinv
Close Row X
Precharge

The "Deactivate EQ," "Open Row X," "Fire Sense Amps," "Activate LOAD," and "Deactivate LOAD" shown in the pseudo code above indicate the same functionality as the same operations in the pseudo code for the "Copy Row X into the Accumulator" initial operation phase described above prior to pseudo code for the AND operation and OR operation. However, rather than closing the Row X and Precharging after the Row X data is loaded into the sense amplifier 206 and copied into the dynamic latch, a compliment version of the data value in the dynamic latch of the accumulator can be placed on the data line and thus transferred to the sense amplifier 206 by enabling (e.g., causing transistor to conduct) and disabling the invert transistors (e.g., ANDinv and ORinv). This results in the sense amplifier 206 being flipped from the true data value that was previously stored in the sense amplifier to a compliment data value (e.g., inverted data value) stored in the sense amp. For example, a true or compliment version of the data value in the accumulator can be transferred to the sense amplifier by activating and deactivating ANDinv and ORinv. This operation leaves the data in the accumulator unchanged.

Because the sensing circuitry 250 shown in FIG. 2A initially stores the result of the AND, OR, and NOT logical operations in the sense amplifier 206 (e.g., on the sense amplifier nodes), these logical operation results can be communicated easily and quickly to any enabled row, any row activated after the logical operation is complete, and/or into the secondary latch of the compute component 231. The sense amplifier 206 and sequencing for the AND, OR, and/or NOT logical operations can also be interchanged by appropriate firing of the AND, OR, ANDinv, and/or ORinv control signals (and operation of corresponding transistors having a gate coupled to the particular control signal) before the sense amplifier 206 fires.

When performing logical operations in this manner, the sense amplifier 206 can be pre-seeded with a data value from the dynamic latch of the accumulator to reduce overall current utilized because the sense amps 206 are not at full rail voltages (e.g., supply voltage or ground/reference voltage) when accumulator function is copied to the sense amplifier 206. An operation sequence with a pre-seeded sense amplifier 206 either forces one of the data lines to the reference voltage (leaving the complementary data line at $V_{DD}/2$, or leaves the complementary data lines unchanged. The sense amplifier 206 pulls the respective data lines to full rails when the sense amplifier 206 fires. Using this sequence of operations will overwrite data in an enabled row.

A SHIFT operation can be accomplished by multiplexing ("muxing") two neighboring data line complementary pairs using a traditional DRAM isolation (ISO) scheme. According to embodiments of the present disclosure, the shift circuitry 223 can be used for shifting data values stored in memory cells coupled to a particular pair of complementary data lines to the sensing circuitry 250 (e.g., sense amplifier 206) corresponding to a different pair of complementary data lines (e.g., such as a sense amplifier 206 corresponding to a left or right adjacent pair of complementary data lines. As used herein, a sense amplifier 206 corresponds to the pair of complementary data lines to which the sense amplifier is coupled when isolation transistors 221-1 and 221-2 are conducting. The SHIFT operations (right or left) do not pre-copy the Row X data value into the accumulator. Operations to shift right Row X can be summarized as follows:

Deactivate Norm and Activate Shift
Deactivate EQ
Open Row X
Fire Sense Amps (after which shifted Row X data resides in the sense amps)
Activate Norm and Deactivate Shift
Close Row X
Precharge In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines). The SHIFT control signal goes high causing isolation transistors 221-3 and 221-4 to conduct, thereby coupling the sense amplifier 206 to the left adjacent pair of complementary data lines (e.g., on the memory array side of non-conducting isolation transistors 221-1 and 221-2 for the left adjacent pair of complementary data lines).

After the shift circuitry 223 is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the left adjacent pair of complementary data lines is shifted right and stored in the sense amplifier 206.

In the pseudo code above, "Activate Norm and Deactivate Shift" indicates that a NORM control signal goes high causing isolation transistors 221-1 and 221-2 of the shift circuitry 223 to conduct (e.g., coupling the sense amplifier to the corresponding pair of complementary data lines), and the SHIFT control signal goes low causing isolation transistors 221-3 and 221-4 to not conduct and isolating the sense amplifier 206 from the left adjacent pair of complementary data lines (e.g., on the memory array side of non-conducting isolation transistors 221-1 and 221-2 for the left adjacent pair of complementary data lines). Since Row X is still active, the Row X data value that has been shifted right is transferred to Row X of the corresponding pair of complementary data lines through isolation transistors 221-1 and 221-2.

After the Row X data values are shifted right to the corresponding pair of complementary data lines, the selected row (e.g., ROW X) is disabled as indicated by "Close Row X" in the pseudo code above, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above. Operations to shift left Row X can be summarized as follows:

Activate Norm and Deactivate Shift
Deactivate EQ
Open Row X
Fire Sense Amps (after which Row X data resides in the sense amps)
Deactivate Norm and Activate Shift
    Sense amplifier data (shifted left Row X) is transferred to Row X
Close Row X
Precharge In the pseudo code above, "Activate Norm and Deactivate Shift" indicates that a NORM control signal goes high causing isolation transistors 221-1 and 221-2 of the shift circuitry 223 to conduct, and the SHIFT control signal goes low causing isolation transistors 221-3 and 221-4 to not conduct. This configuration couples the sense amplifier 206 to a corresponding pair of complementary data lines and isolates the sense amplifier from the right adjacent pair of complementary data lines.

After the shift circuitry is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the pair of complementary data lines corresponding to the sense circuitry 250 is stored in the sense amplifier 206.

In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines), and the SHIFT control signal goes high causing isolation transistors 221-3 and 221-4 to conduct coupling the sense amplifier to the left adjacent pair of complementary data lines (e.g., on the memory array side of non-conducting isolation transistors 221-1 and 221-2 for the left adjacent pair of complementary data lines. Since Row X is still active, the Row X data value that has been shifted left is transferred to Row X of the left adjacent pair of complementary data lines.

After the Row X data values are shifted left to the left adjacent pair of complementary data lines, the selected row (e.g., ROW X) is disabled as indicated by "Close Row X," which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

According to various embodiments, general computing can be enabled in a memory array core of a processor-in-memory (PIM) device such as a DRAM one transistor per memory cell (e.g., 1T1C) configuration at 6F^2 or 4F^2 memory cell sizes, for example. The advantage of the apparatuses and methods described herein is not realized in terms of single instruction speed, but rather the cumulative speed that can be achieved by an entire bank of data being computed in parallel without ever transferring data out of the memory array (e.g., DRAM) or firing a column decode. In other words, data transfer time can be eliminated. For example, apparatus of the present disclosure can perform ANDS or ORs simultaneously using data values in memory cells coupled to a data line (e.g., a column of 16K memory cells).

In previous approach sensing circuits where data is moved out for logical operation processing (e.g., using 32 or 64 bit registers), fewer operations can be performed in parallel compared to the apparatus of the present disclosure. In this manner, significantly higher throughput is effectively provided in contrast to conventional configurations involving a central processing unit (CPU) discrete from the memory such that data must be transferred therebetween. An apparatus and/or methods according to the present disclosure can also use less energy/area than configurations where the CPU is discrete from the memory. Furthermore, an apparatus and/or methods of the present disclosure can improve upon the smaller energy/area advantages since the in-memory-array logical operations save energy by eliminating certain data value transfers.

Figure 10:
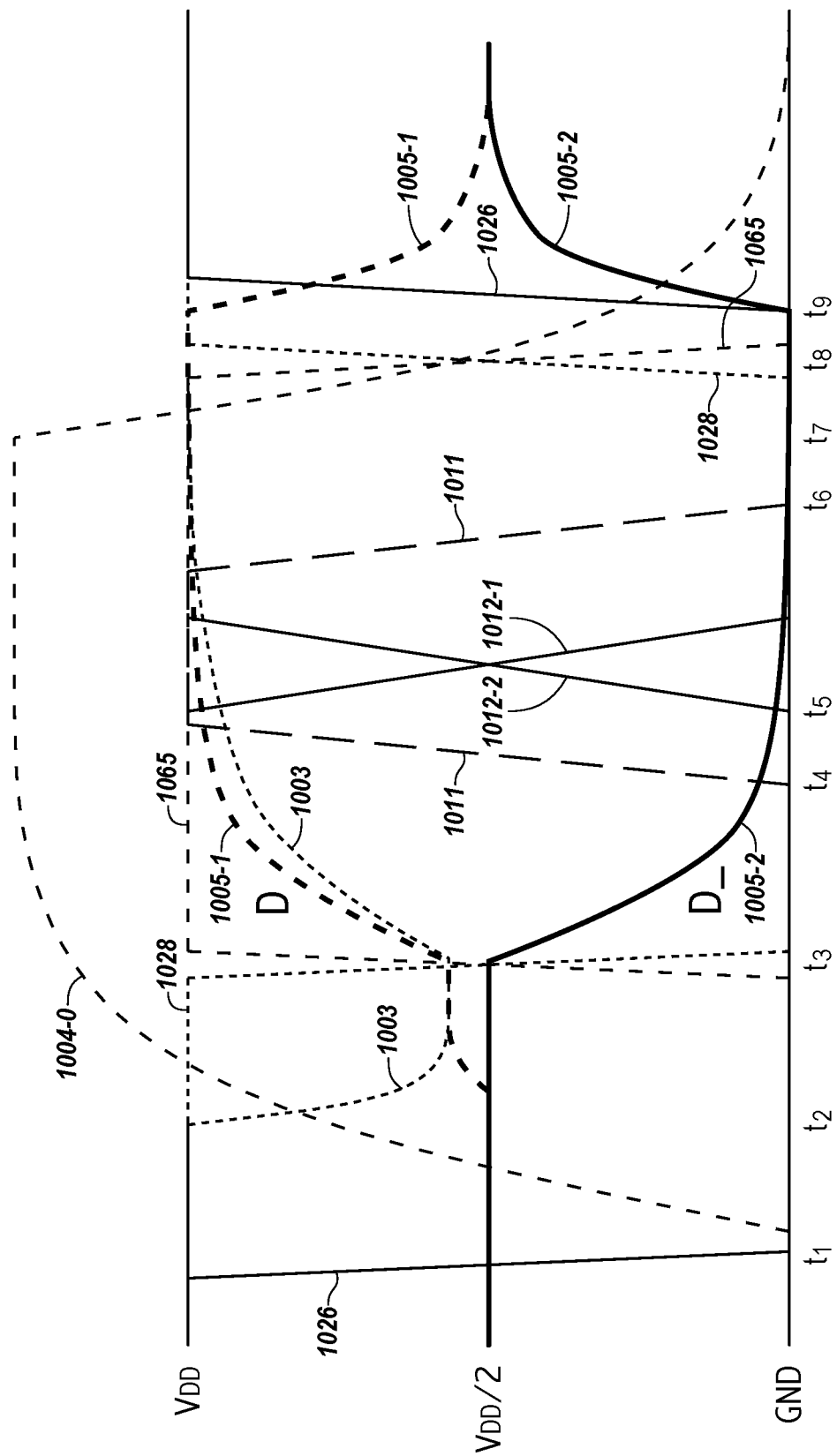
FIG. 10 illustrates a timing diagram associated with performing a number of logical operations using sensing circuitry in accordance with a number of embodiments of the present disclosure.

FIG. 10 illustrates a timing diagram associated with performing a number of logical operations using sensing circuitry in accordance with a number of embodiments of the present disclosure. The functionality of the sensing circuitry 250 of FIG. 2A is described below with respect to performing logical operations and initially storing a result in the compute component 231 (e.g., secondary latch of the accumulator). The timing diagram shown in FIG. 10 illustrates signals (e.g., voltage signals) associated with performing a first operation phase of a logical operation (e.g., an R-input logical operation) using the sensing circuitry illustrated in FIG. 2A. The first operation phase described with respect to FIG. 10 can be a first operation phase of an AND, NAND, OR, or NOR operation, for instance. Performing the operation phase illustrated in FIG. 10 can involve consuming significantly less energy (e.g., about half) than previous processing approaches that may involve providing a full swing between voltage rails (e.g., between a supply and ground).

In the example illustrated in FIG. 10, the voltage rails corresponding to complementary logic values (e.g., "1" and "0") are a supply voltage (VDD) and a reference voltage (e.g., ground (Gnd)). Prior to performing a logical operation, an equilibration can occur such that the complementary data lines D and D_ are shorted together at an equilibration voltage ($V_{DD}/2$), as previously described.

The first operation phase of a logical operation described below involves loading a first operand of the logical operation into the accumulator. The time references (e.g., $t_1$, etc.) shown in FIG. 10 do not necessarily represent a same absolute or relative time as similar time references in other timing diagrams.

At time $t_1$, the equilibration signal 1026 is deactivated, and then a selected row is enabled (e.g., the row corresponding to a memory cell whose data value is to be sensed and used as a first input). Signal 1004-0 represents the voltage signal applied to the selected row (e.g., Row Y 204-Y shown in FIG. 2A). When row signal 1004-0 reaches the threshold voltage (Vt) of the access transistor (e.g., 202-1 shown in FIG. 2A) corresponding to the selected cell, the access transistor turns on and couples the data line D to the selected memory cell (e.g., to the capacitor 203-1 shown in FIG. 2A if the cell is a 1T1C DRAM cell), which creates a differential voltage signal between the data lines D and D_ (e.g., as indicated by signals 1005-1 and 1005-2 on the data lines, respectively) between times $t_2$ and $t_3$. The voltage of the selected cell is represented by signal 1003. Due to conservation of energy, creating the differential signal between data lines D and D_ (e.g., by coupling the cell to data line D) does not consume energy, since the energy associated with enabling/disabling the row signal 1004-0 can be amortized over the plurality of memory cells coupled to the row.

At time $t_3$, the sense amplifier (e.g., 206 shown in FIG. 2A) is activated (e.g., a positive control signal 1065 (e.g., corresponding to ACT 265 shown in FIG. 2B) goes high and the negative control signal 1028 (e.g., corresponding to RnIF 228 shown in FIG. 2B) goes low), which amplifies the differential signal between data lines D and D_, resulting in a voltage (e.g., $V_{DD}$) corresponding to a logic "1" or a voltage (e.g., ground) corresponding to a logic "0" being on data line D (and the other voltage being on complementary data line D_), such that the sensed data value is stored in the primary latch of sense amplifier 206. The primary energy consumption occurs in charging the data line D (205-1) from the equilibration voltage $V_{DD}/2$ to the rail voltage $V_{DD}$. FIG. 10 shows, in example, the data line voltages 1005-1 and 1005-2 that correspond to a logic "1" being on data line D.

According to some embodiments, the primary latch of sense amplifier 206 can be coupled to the complementary data lines D and D_ through respective pass transistors (not shown in FIG. 2B but in a similar configuration as the manner in which latch 264 is coupled to the data lines D and D_ through load/pass transistors 218-1 and 218-2 shown in FIG. 2A). The Passd control signal 1011 controls one pass transistor. The Passdb control signal controls the other pass transistor, and here the Passdb control signal can behave here the same as the Passd control signal.

At time $t_4$, the pass transistors (if present) can be enabled (e.g., via respective Passd and Passdb control signals 1011 applied to control lines coupled to the respective gates of the pass transistors going high). At time $t_5$, the accumulator positive control signal 1012-1 (e.g., Accumb) and the accumulator positive control signal 1012-2 (e.g., Accum) are activated via respective control lines 212-1 and 212-2 shown in FIG. 2A. As described below, the accumulator control signals ACCUMB 1012-1 and ACCUM 1012-2 may remain activated for subsequent operation phases. As such, in this example, activating the control signals ACCUMB 1012-1 and ACCUM 1012-2 enables the secondary latch (e.g., accumulator) of compute component 231-6 shown in FIG. 2A. The sensed data value stored in sense amplifier 206 is transferred (e.g., copied) to the secondary latch, including the dynamic latch and latch 264.

At time $t_6$, the Passd control signal 1011 (and the Passdb control signal) goes low thereby turning off the pass transistors (if present). However, since the accumulator control signals ACCUMB 1012-1 and ACCUM 1012-2 remain activated, an accumulated result is stored (e.g., latched) in the secondary latches (e.g., accumulator). At time $t_7$, the row signal 1004-0 is deactivated, and the array sense amps are disabled at time $t_8$ (e.g., sense amplifier control signals 1028 and 1065 are deactivated).

At time $t_9$, the data lines D and D_ are equilibrated (e.g., equilibration signal 1026 is activated), as illustrated by data line voltage signals 1005-1 and 1005-2 moving from their respective rail values to the equilibration voltage ($V_{DD}/2$). The equilibration consumes little energy due to the law of conservation of energy. As described below in association with FIG. 2B, equilibration can involve shorting the complementary data lines D and D_ together at an equilibration voltage, which is $V_{DD}/2$, in this example. Equilibration can occur, for instance, prior to a memory cell sensing operation.

Figure 11:
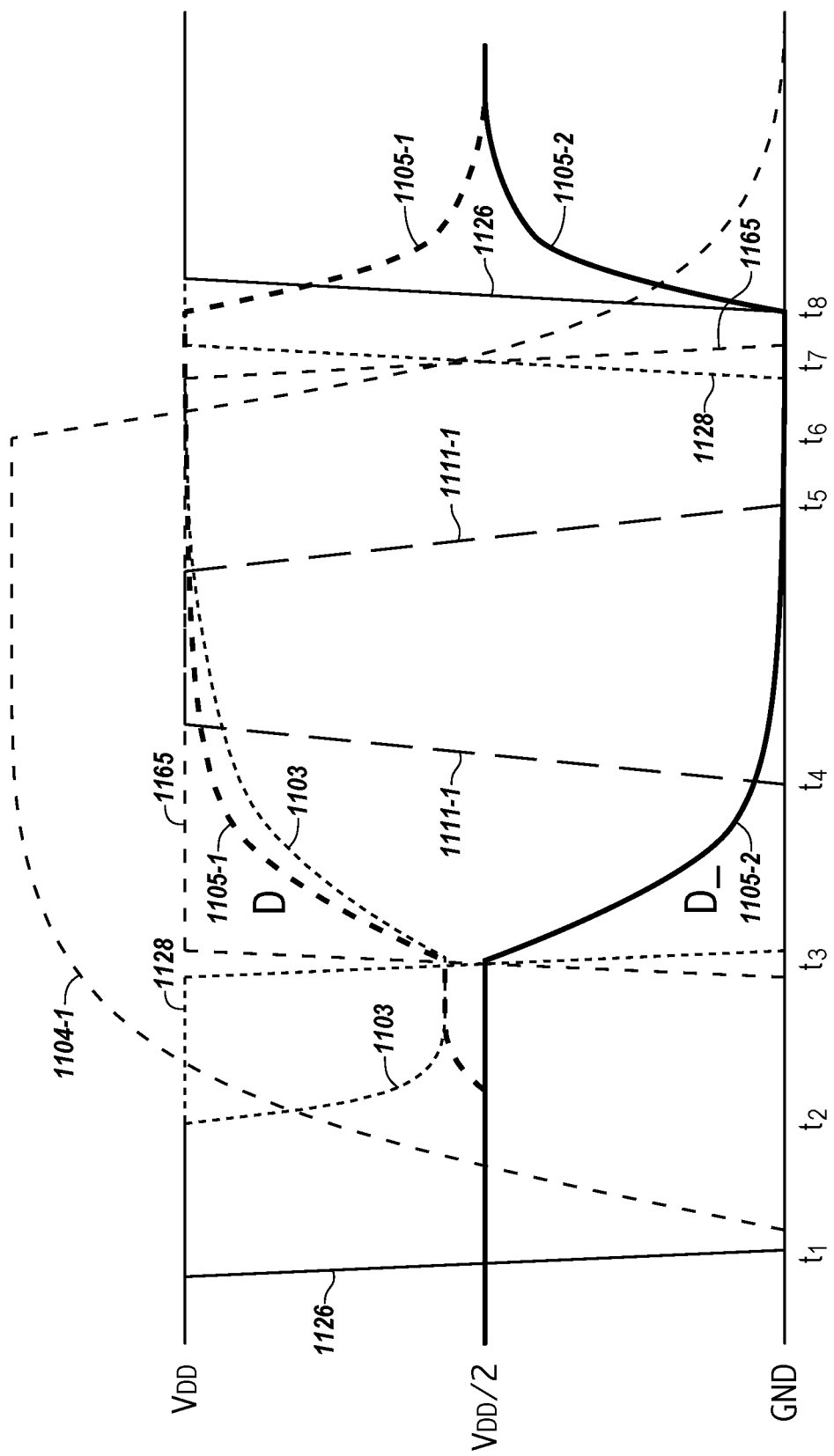
FIG. 11 illustrates a timing diagram associated with performing a number of logical operations using sensing circuitry in accordance with a number of embodiments of the present disclosure.
Figure 12:
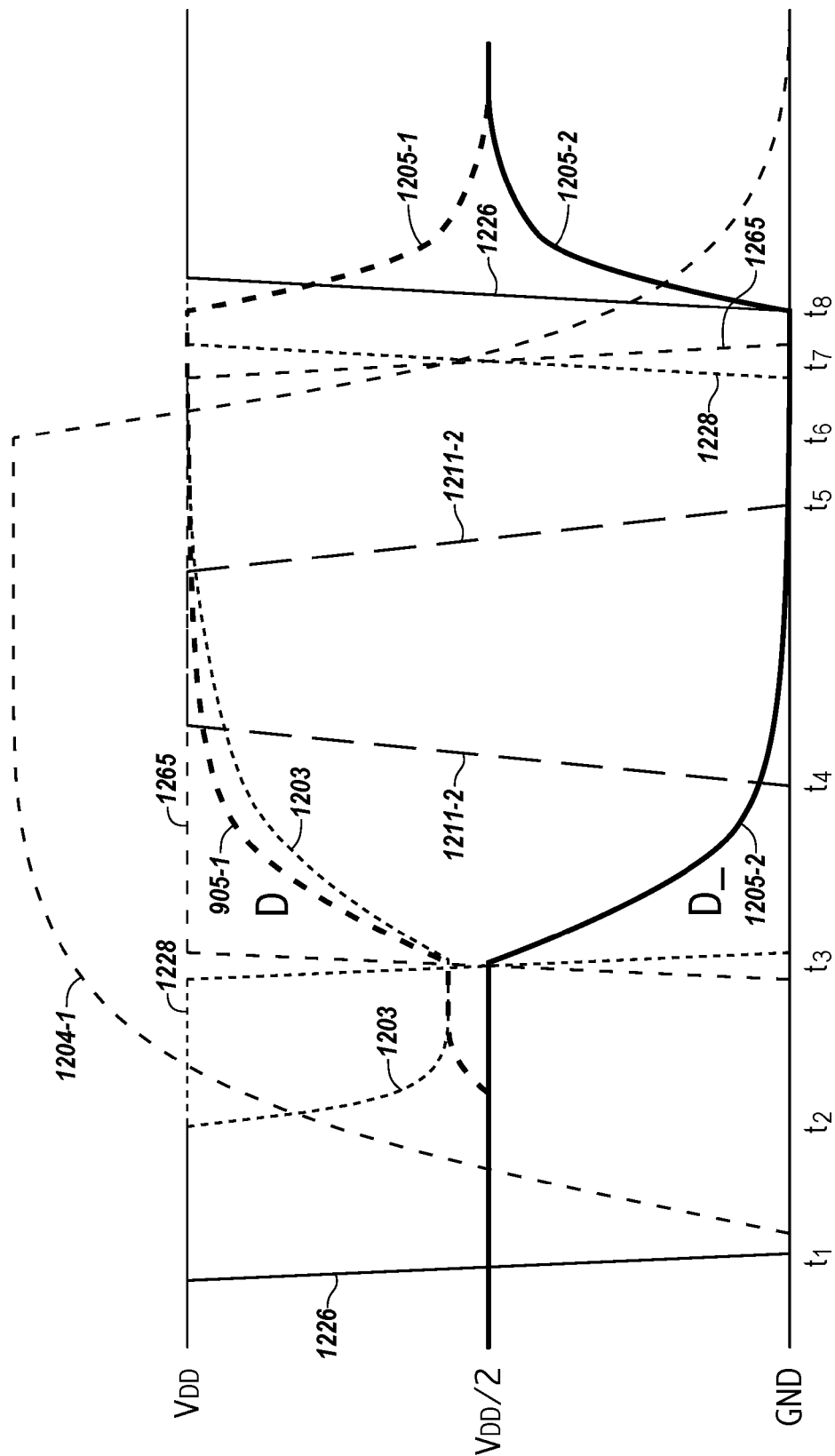
FIG. 12 illustrate a timing diagram associated with performing a number of logical operations using sensing circuitry in accordance with a number of embodiments of the present disclosure.

FIGS. 11 and 12 respectively illustrate timing diagrams associated with performing a number of logical operations using sensing circuitry in accordance with a number of embodiments of the present disclosure. Timing diagrams shown in FIGS. 11 and 12 illustrate signals (e.g., voltage signals) associated with performing a number of intermediate operation phases of a logical operation (e.g., an R-input logical operation). For instance, timing diagram shown in FIG. 11 corresponds to a number of intermediate operation phases of an R-input NAND operation or an R-input AND operation, and timing diagram shown in FIG. 12 corresponds to a number of intermediate operation phases of an R-input NOR operation or an R-input OR operation. For example, performing an AND or NAND operation can include performing the operation phase shown in FIG. 11 one or more times subsequent to an initial operation phase such as that described with respect to FIG. 10. Similarly, performing an OR or NOR operation can include performing the operation phase shown and described with respect to FIG. 12 one or more times subsequent to an initial operation phase such as that described with respect to FIG. 10.

As shown in the timing diagrams illustrated in FIGS. 11 and 12, at time $t_1$, equilibration is disabled (e.g., the equilibration signal 1126/1226 is deactivated), and then a selected row is enabled (e.g., the row corresponding to a memory cell whose data value is to be sensed and used as an input such as a second input, third input, etc.). Signal 1104-1/1204-1 represents the voltage signal applied to the selected row (e.g., Row Y 204-Y shown in FIG. 2A). When row signal 1104-1 reaches the threshold voltage (Vt) of the access transistor (e.g., 202-1 shown in FIG. 2A) corresponding to the selected cell, the access transistor turns on and couples the data line D to the selected memory cell (e.g., to the capacitor 203-1 if the cell is a 1T1C DRAM cell), which creates a differential voltage signal between the data lines D and D_ (e.g., as indicated by signals 1105-1/1205-1 and 1105-2/1205-2, respectively) between times $t_2$ and $t_3$. The voltage of the selected cell is represented by signal 1103/1203. Due to conservation of energy, creating the differential signal between D and D_ (e.g., by coupling the cell to data line D) does not consume energy, since the energy associated with activating/deactivating the row signal 1104-1/1204-1 can be amortized over the plurality of memory cells coupled to the row.

At time $t_3$, the sense amplifier (e.g., 206 shown in FIG. 2A) is enabled (e.g., a positive control signal 1165/1265 (e.g., corresponding to ACT 233 shown in FIG. 2B) goes high, and the negative control signal 1128/1228 (e.g., RnIF 228 shown in FIG. 2B) goes low), which amplifies the differential signal between D and D_, resulting in a voltage (e.g., $V_{DD}$) corresponding to a logic 1 or a voltage (e.g., ground) corresponding to a logic 0 being on data line D (and the other voltage being on complementary data line D_), such that the sensed data value is stored in the primary latch of sense amplifier 206. The primary energy consumption occurs in charging the data line D (205-1) from the equilibration voltage $V_{DD}/2$ to the rail voltage $V_{DD}$.

As shown in timing diagrams illustrated in FIGS. 11 and 12, at time $t_4$ (e.g., after the selected cell is sensed), only one of control signals 1111-1 (Passd) shown in FIGS. 11 and 1211-2 (Passdb) shown in FIG. 12 is activated (e.g., only one of pass transistors (if present) is enabled), depending on the particular logic operation. For example, since the timing diagram illustrated in FIG. 11 corresponds to an intermediate phase of a NAND or AND operation, control signal 1111-1 (Passd) is activated at time t4 to turn on the pass transistor coupling the primary latch to data line D and the Passdb control signal remains deactivated leaving the pass transistor coupling the primary latch to data line D_ turned off. Conversely, since the timing diagram illustrated in FIG. 12 corresponds to an intermediate phase of a NOR or OR operation, control signal 1211-2 (Passdb) is activated at time t4 to turn on the pass transistor coupling the primary latch to data line D_ and control signal Passd remains deactivated leaving the pass transistor coupling the primary latch to data line D turned off. Recall from above that the accumulator control signals 1012-1 (Accumb) and 1012-2 (Accum) were activated during the initial operation phase described with respect to FIG. 10, and they remain activated during the intermediate operation phase(s).

Since the accumulator was previously enabled, activating only Passd (1111-1 as shown in FIG. 11) results in accumulating the data value corresponding to the voltage signal 1105-1 shown in FIG. 11 corresponding to data line D. Similarly, activating only Passdb (1211-2 as shown in FIG. 12) results in accumulating the data value corresponding to the voltage signal 1205-2 corresponding to data line D_. For instance, in an example AND/NAND operation shown in the timing diagram illustrated in FIG. 11 in which only Passd (1111-1) is activated, if the data value stored in the second selected memory cell is a logic "0," then the accumulated value associated with the secondary latch is asserted low such that the secondary latch stores logic "0." If the data value stored in the second selected memory cell is not a logic"0," then the secondary latch retains its stored first selected memory cell data value (e.g., a logic "1" or a logic "0"). As such, in this AND/NAND operation example, the secondary latch is serving as a zeroes (0s) accumulator.

Similarly, in an example OR/NOR operation shown in the timing diagram illustrated in FIG. 12 in which only Passdb 1211-2 is activated, if the data value stored in the second selected memory cell is a logic "1," then the accumulated value associated with the secondary latch is asserted high such that the secondary latch stores logic "1." If the data value stored in the second selected memory cell is not a logic "1," then the secondary latch retains its stored first selected memory cell data value (e.g., a logic "1" or a logic "0"). As such, in this OR/NOR operation example, the secondary latch is effectively serving as a ones (1s) accumulator since voltage signal 1205-2 on D_ is setting the true data value of the accumulator.

At the conclusion of an intermediate operation phase such as that shown in FIG. 11 or 12, the Passd signal 1111-1 (e.g., for AND/NAND) or the Passdb signal 1211-2 (e.g., for OR/NOR) is deactivated (e.g., at time t5), the selected row is disabled (e.g., at time t6), the sense amplifier is disabled (e.g., at time t7), and equilibration occurs (e.g., at time t8). An intermediate operation phase such as that illustrated in FIG. 11 or 12 can be repeated in order to accumulate results from a number of additional rows. As an example, the sequence of timing diagram illustrated in FIGS. 11 and/or 12 can be performed a subsequent (e.g., second) time for a third memory cell, a subsequent (e.g., third) time for a fourth memory cell, etc. For instance, for a 10-input NOR operation, the intermediate phase shown in FIG. 12 can occur 9 times to provide 9 inputs of the 10-input logical operation, with the tenth input being determined during the initial operation phase (e.g., as described with respect to FIG. 10).

Figure 13:
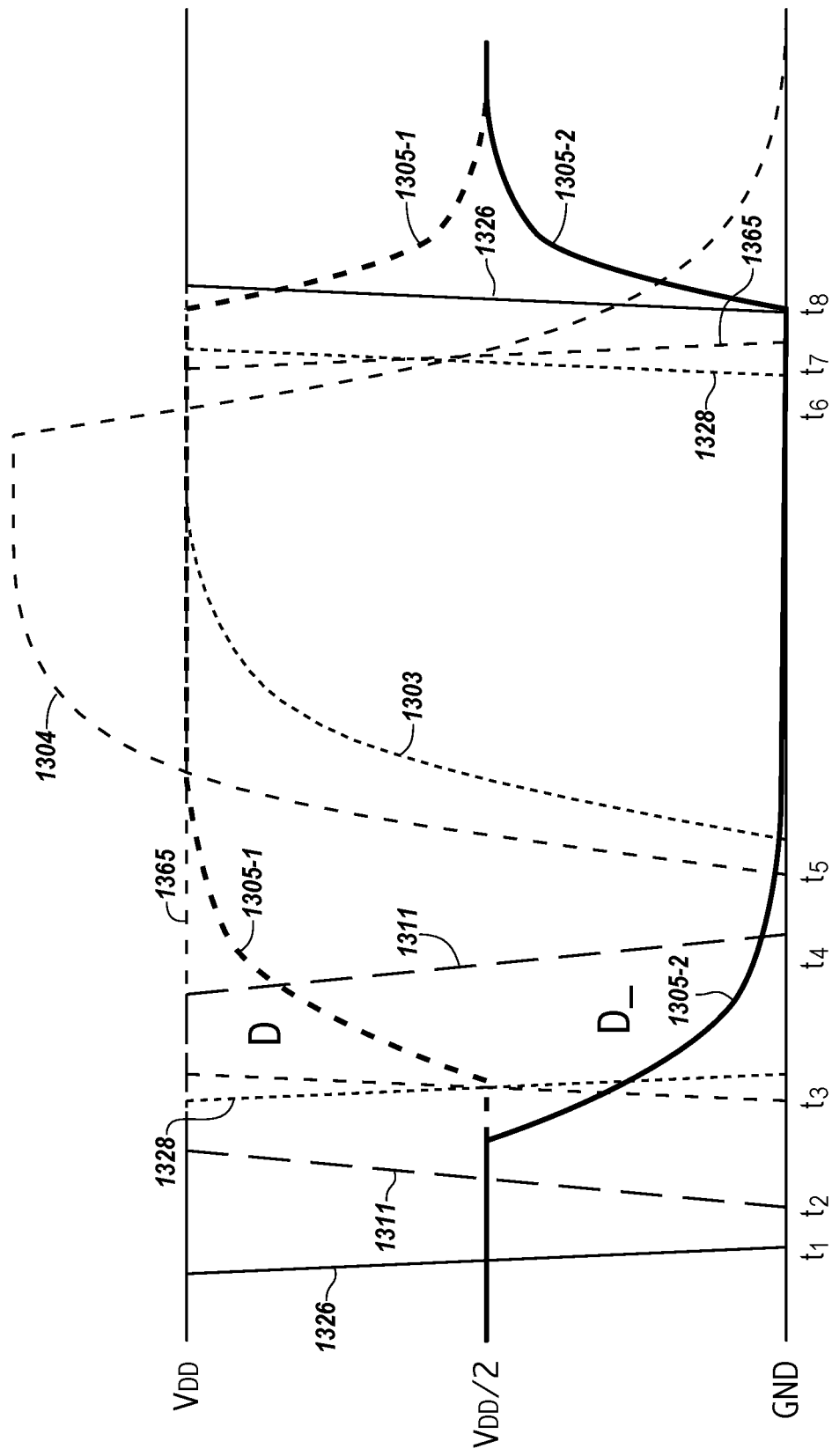
FIG. 13 illustrates a timing diagram associated with performing a number of logical operations using sensing circuitry in accordance with a number of embodiments of the present disclosure.

FIG. 13 illustrates a timing diagram associated with performing a number of logical operations using sensing circuitry in accordance with a number of embodiments of the present disclosure. The timing diagram illustrated in FIG. 13 shows signals (e.g., voltage signals) associated with performing a last operation phase of a logical operation (e.g., an R-input logical operation). For instance, the timing diagram illustrated in FIG. 13 corresponds to a last operation phase of an R-input AND operation or an R-input OR operation.

For example, performing a last operation phase of an R-input can include performing the operation phase shown in FIG. 13 subsequent to a number of iterations of the intermediate operation phase(s) described in association with FIGS. 11 and/or 12. Table 2 shown below indicates the Figures corresponding to the sequence of operation phases associated with performing a number of R-input logical operations in accordance with a number of embodiments described herein.

TABLE 2

| Operation | FIG. 10 | FIG. 11 | FIG. 12 | FIG. 13 |
|---|---|---|---|---|
| AND | First phase | R-1 iterations | | Last phase |
| NAND | First phase | R-1 iterations | | |
| OR | First phase | | R-1 iterations | Last phase |
| NOR | First phase | | R-1 iterations | |

A NAND operation can be implemented, for example, by storing the result of the R-1 iterations for an AND operation in the sense amplifier, then inverting the sense amplifier before conducting the last operation phase to store the result (described below). A NOR operation can be implemented, for example, by storing the result of the R-1 iterations for an OR operation in the sense amplifier, then inverting the sense amplifier before conducting the last operation phase to store the result (described below).

The last operation phase illustrated in the timing diagram of FIG. 13 is described in association with storing a result of an R-input logical operation to a row of the array (e.g., array 230 shown in FIG. 2A). However, as described above, in a number of embodiments, the result can be stored to a suitable location other than back to the array (e.g., to an external register associated with a controller and/or host processor, to a memory array of a different memory device, etc., via I/O lines).

As shown in timing diagram illustrated in FIG. 13, at time $t_1$, equilibration is disabled (e.g., the equilibration signal 1326 is deactivated) such that data lines D and D_ are floating. At time t2, the Passd control signal 1311 (and Passdb signal) is activated for an AND or OR operation.

Activating the Passd control signal 1311 (and Passdb signal) (e.g., in association with an AND or OR operation) transfers the accumulated output stored in the secondary latch of compute component 231-6 shown in FIG. 2A to the primary latch of sense amplifier 206. For instance, for an AND operation, if any of the memory cells sensed in the prior operation phases (e.g., the first operation phase illustrated in FIG. 10 and one or more iterations of the intermediate operation phase illustrated in FIG. 11) stored a logic "0" (e.g., if any of the R-inputs of the AND operation were a logic "0"), then the data line D_ will carry a voltage corresponding to logic "1" (e.g., $V_{DD}$) and data line D will carry a voltage corresponding to logic "0" (e.g., ground). For this AND operation example, if all of the memory cells sensed in the prior operation phases stored a logic "1" (e.g., all of the R-inputs of the AND operation were logic "1"), then the data line D_ will carry a voltage corresponding to logic "0" and data line D will carry a voltage corresponding to logic "1". At time t3, the primary latch of sense amplifier 206 is then enabled (e.g., a positive control signal 1365 (e.g., corresponding to ACT 265 shown in FIG. 2B) goes high and the negative control signal 1328 (e.g., corresponding to RnIF 228 shown in FIG. 2B) goes low), which amplifies the differential signal between data lines D and D_ such that the data line D now carries the ANDed result of the respective input data values as determined from the memory cells sensed during the prior operation phases. As such, data line D will be at ground if any of the input data values are a logic "0" and data line D will be at $V_{DD}$ if all of the input data values are a logic "1."

For an OR operation, if any of the memory cells sensed in the prior operation phases (e.g., the first operation phase of FIG. 10 and one or more iterations of the intermediate operation phase shown in FIG. 12) stored a logic "1" (e.g., if any of the R-inputs of the OR operation were a logic "1"), then the data line D_ will carry a voltage corresponding to logic "0" (e.g., ground) and data line D will carry a voltage corresponding to logic "1" (e.g., $V_{DD}$). For this OR example, if all of the memory cells sensed in the prior operation phases stored a logic "0" (e.g., all of the R-inputs of the OR operation were logic "0"), then the data line D will carry a voltage corresponding to logic "0" and data line D_ will carry a voltage corresponding to logic "1." At time t3, the primary latch of sense amplifier 206 is then enabled and the data line D now carries the ORed result of the respective input data values as determined from the memory cells sensed during the prior operation phases. As such, data line D will be at $V_{DD}$ if any of the input data values are a logic "1" and data line D will be at ground if all of the input data values are a logic "0."

The result of the R-input AND or OR logical operations can then be stored back to a memory cell of array 230 shown in FIG. 2A. In the examples shown in FIG. 13, the result of the R-input logical operation is stored to a memory cell coupled to the last row enabled (e.g., row of the last logical operation operand). Storing the result of the logical operation to a memory cell simply involves enabling the associated row access transistor by enabling the particular row. The capacitor of the memory cell will be driven to a voltage corresponding to the data value on the data line D (e.g., logic "1" or logic "0"), which essentially overwrites whatever data value was previously stored in the selected memory cell. It is noted that the selected memory cell can be a same memory cell that stored a data value used as an input for the logical operation. For instance, the result of the logical operation can be stored back to a memory cell that stored an operand of the logical operation.

The timing diagram illustrated in FIG. 13 show, at time t3, the positive control signal 1365 and the negative control signal 1328 being deactivated (e.g., signal 1365 goes high and signal 1328 goes low) to disable the sense amplifier 206 shown in FIG. 2A. At time t4 the Passd control signal 1311 (and Passdb signal) that was activated at time t2 is deactivated. Embodiments are not limited to this example. For instance, in a number of embodiments, the sense amplifier 206 shown in FIG. 2A may be enabled subsequent to time t4 (e.g., after the Passd control signal 1311 (and Passdb signal) are deactivated).

As shown in FIG. 13, at time t5, a selected row is enabled (e.g., by row activation signal 1304 going high, which drives the capacitor of the selected cell to the voltage corresponding to the logic value stored in the accumulator. At time t6 the selected row is disabled. At time t7 the sense amplifier 206 shown in FIG. 2A is disabled (e.g., positive control signal 1328 and negative control signal 1365 are deactivated), and at time t8 equilibration occurs (e.g., signal 1326 is activated and the voltages on the complementary data lines 1305-1 (D) and 1305-2 (D_) are brought to the equilibration voltage).

Although the example of performing a last operation phase of an R-input was discussed above with respect to FIG. 13 for performing AND and OR logical operations, embodiments are not limited to these logical operations. For example, the NAND and NOR operations can also involve a last operation phase of an R-input that is stored back to a memory cell of array 230 using control signals to operate the sensing circuitry illustrated in FIG. 2A.

Figure 14:
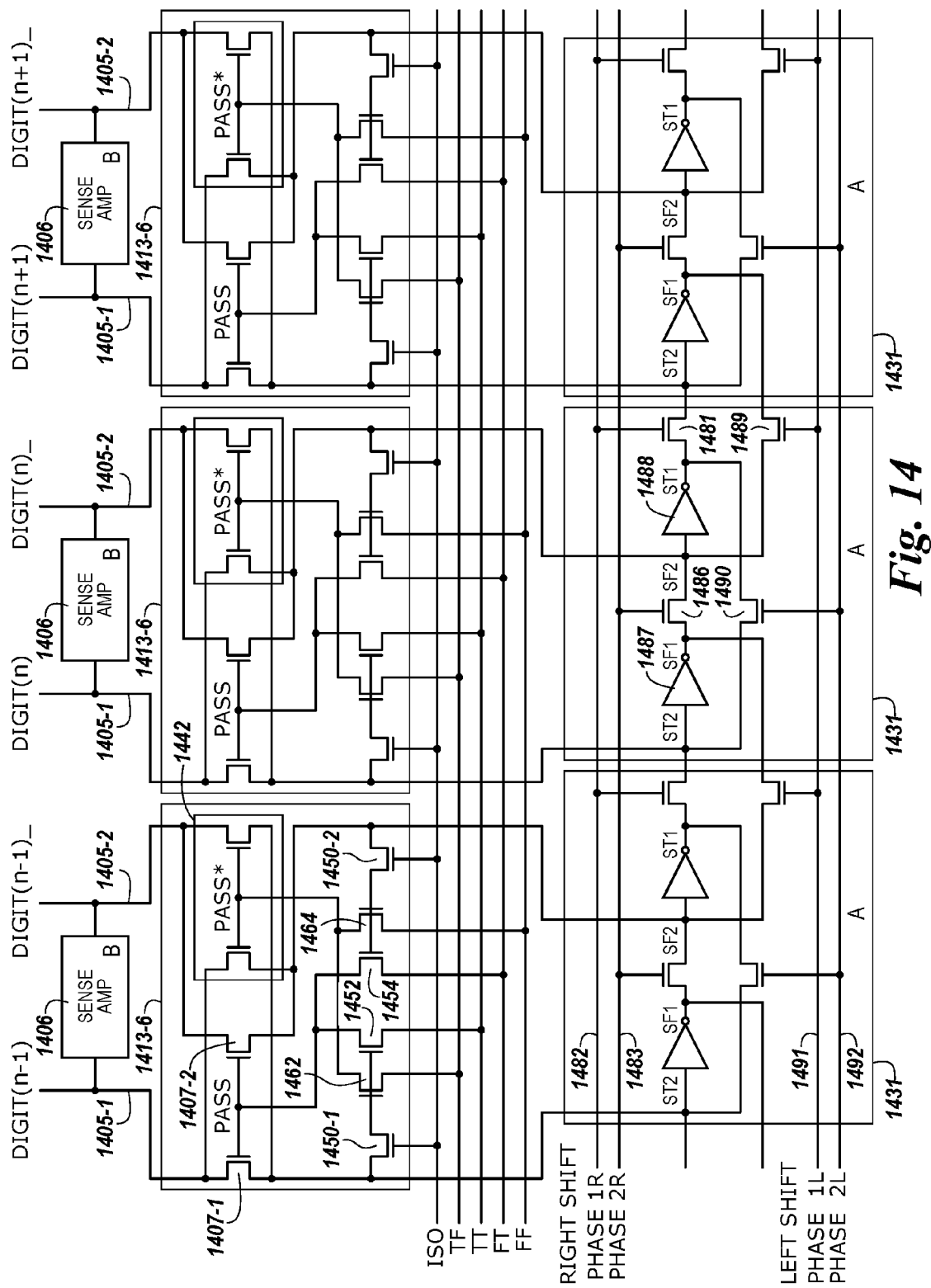
FIG. 14 is a schematic diagram illustrating sensing circuitry having selectable logical operation selection logic in accordance with a number of embodiments of the present disclosure.

FIG. 14 is a schematic diagram illustrating sensing circuitry having selectable logical operation selection logic in accordance with a number of embodiments of the present disclosure. FIG. 14 shows a number of sense amplifiers 1406 coupled to respective pairs of complementary sense lines 1405-1 and 1405-2, and a corresponding number of compute component 1431 coupled to the sense amplifiers 1406 via pass gates 1407-1 and 1407-2 (which can correspond to sense amplifiers 206, sense lines 205-1 and 205-2, compute components 231 coupled to sense amplifiers 206 via pass gates 207-1 and 207-2 in FIG. 2A). The gates of the pass gates 1407-1 and 1407-2 can be controlled by a logical operation selection logic signal, PASS. For example, an output of the logical operation selection logic 1413-6 can be coupled to the gates of the pass gates 1407-1 and 1407-2.

According to the embodiment illustrated in FIG. 14, the compute components 1431 can comprise respective stages (e.g., shift cells) of a loadable shift register configured to shift data values left and right. For example, as illustrated in FIG. 14, each compute component 1431 (e.g., stage) of the shift register comprises a pair of right-shift transistors 1481 and 1486, a pair of left-shift transistors 1489 and 1490, and a pair of inverters 1487 and 1488. The signals PHASE 1R, PHASE 2R, PHASE 1L, and PHASE 2L can be applied to respective control lines 1482, 1483, 1491 and 1492 to enable/disable feedback on the latches of the corresponding compute components 1431 in association with performing logical operations and/or shifting data in accordance with embodiments described herein. Examples of shifting data (e.g., from a particular compute component 1431 to an adjacent compute component 1431) is described further below with respect to FIGS. 16 and 10.

Figure 16:
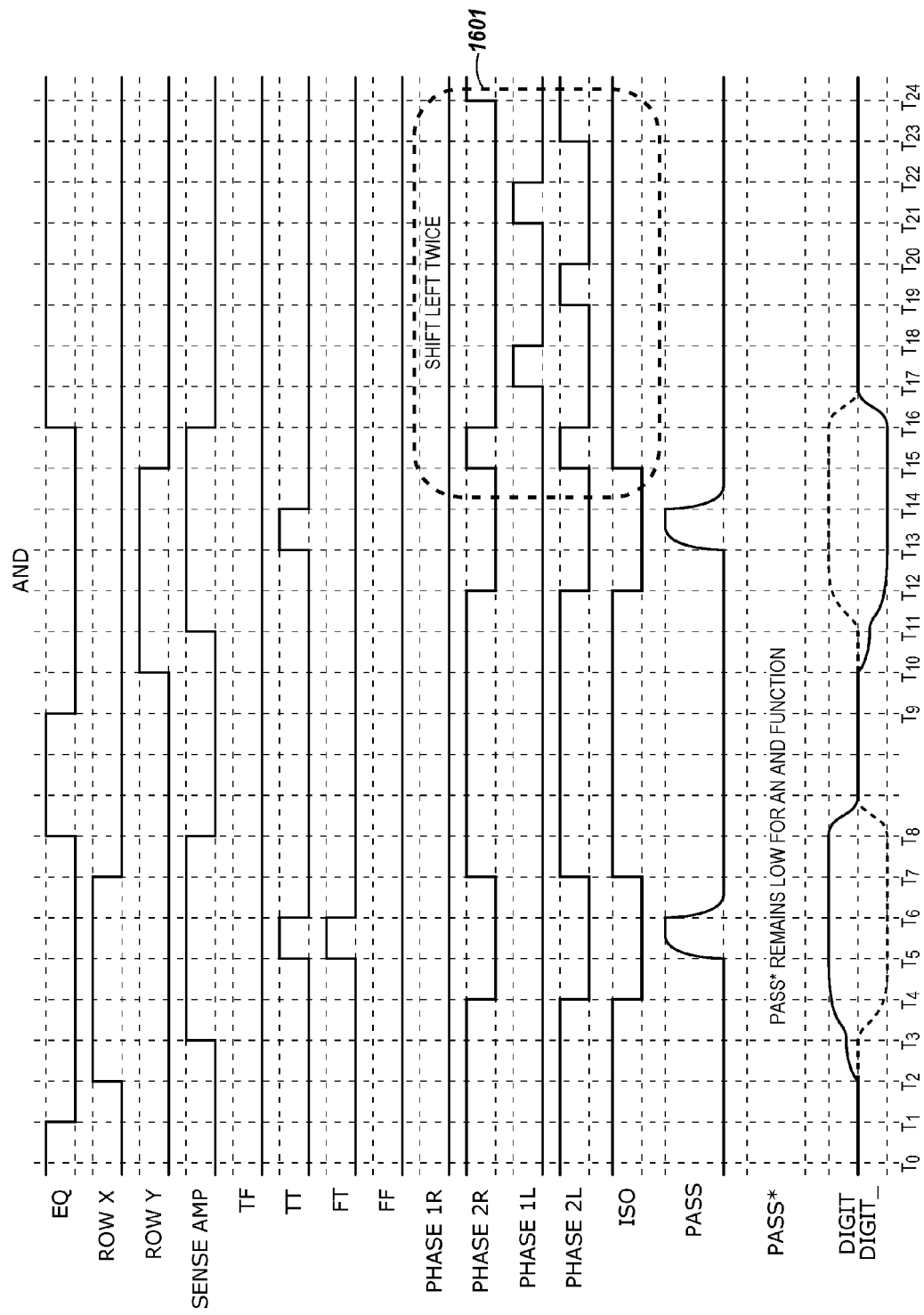
FIG. 16 illustrates a timing diagram associated with performing a logical AND operation and a shifting operation using the sensing circuitry in accordance with a number of embodiments of the present disclosure.
Figure 17:
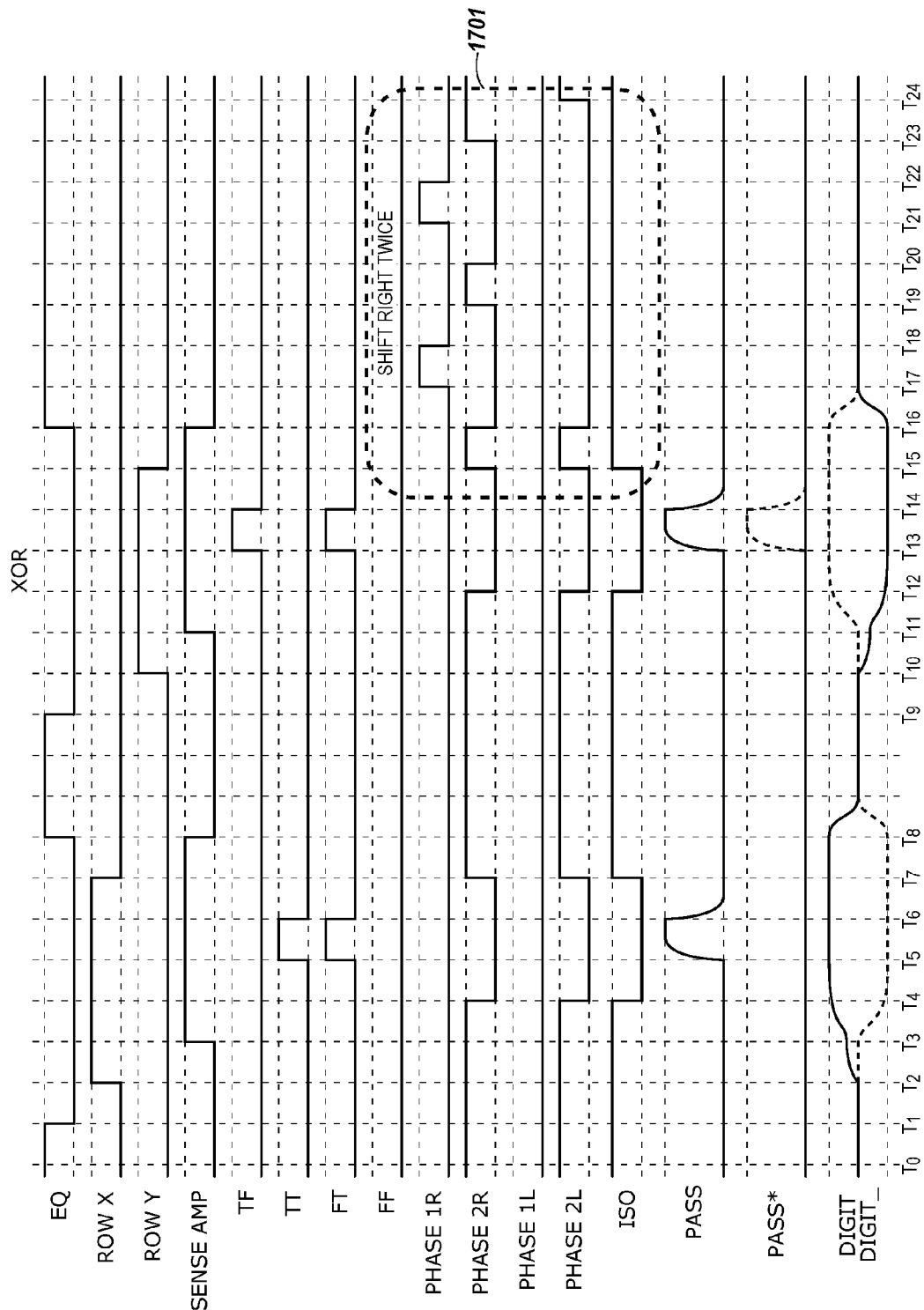
FIG. 17 illustrates a timing diagram associated with performing a logical XOR operation and a shifting operation using the sensing circuitry in accordance with a number of embodiments of the present disclosure.

The logical operation selection logic 1413-6 includes the swap gates 1442, as well as logic to control the pass gates 1407-1 and 1407-2 and the swap gates 1442. The logical operation selection logic 1413-6 includes four logic selection transistors: logic selection transistor 1462 coupled between the gates of the swap transistors 1442 and a TF signal control line, logic selection transistor 1452 coupled between the gates of the pass gates 1407-1 and 1407-2 and a TT signal control line, logic selection transistor 1454 coupled between the gates of the pass gates 1407-1 and 1407-2 and a FT signal control line, and logic selection transistor 1464 coupled between the gates of the swap transistors 1442 and a FF signal control line. Gates of logic selection transistors 1462 and 1452 are coupled to the true sense line through isolation transistor 1450-1 (having a gate coupled to an ISO signal control line). Gates of logic selection transistors 1464 and 1454 are coupled to the complementary sense line through isolation transistor 1450-2 (also having a gate coupled to an ISO signal control line). FIGS. 16 and 17 illustrate timing diagrams associated with performing logical operations and shifting operations using the sensing circuitry shown in FIG. 14.

Figure 15:
FIG. 15 is a logic table illustrating selectable logic operation results implemented by a sensing circuitry in accordance with a number of embodiments of the present disclosure.

FIG. 15 is a logic table illustrating selectable logic operation results implemented by a sensing circuitry (e.g., sensing circuitry 1450 shown in FIG. 14) in accordance with a number of embodiments of the present disclosure. The four logic selection control signals (e.g., TF, TT, FT, and FF), in conjunction with a particular data value present on the complementary sense lines, can be used to select one of a plurality of logical operations to implement involving the starting data values stored in the sense amplifier 1406 and compute component 1431. The four control signals (e.g., TF, TT, FT, and FF), in conjunction with a particular data value present on the complementary sense lines (e.g., on nodes S and S*), controls the pass gates 1407-1 and 1407-2 and swap transistors 1442, which in turn affects the data value in the compute component 1431 and/or sense amplifier 1406 before/after firing. The capability to selectably control the swap transistors 1442 facilitates implementing logical operations involving inverse data values (e.g., inverse operands and/or inverse result), among others.

Similar to the logic tables illustrated in FIG. 17, Logic Table 15-1 illustrated in FIG. 15 shows the starting data value stored in the compute component 1431 shown in column A at 1544, and the starting data value stored in the sense amplifier 1406 shown in column B at 1545. The other 3 column headings in Logic Table 15-1 refer to the state of the pass gates 1407-1 and 1407-2 and the swap transistors 1442, which can respectively be controlled to be OPEN or CLOSED depending on the state of the four logic selection control signals (e.g., TF, TT, FT, and FF), in conjunction with a particular data value present on the pair of complementary sense lines 1405-1 and 1405-2 when the ISO control signal is asserted. The "NOT OPEN" column 1556 corresponds to the pass gates 1407-1 and 1407-2 and the swap transistors 1442 both being in a non-conducting condition, the "OPEN TRUE" column 1570 corresponds to the pass gates 1407-1 and 1407-2 being in a conducting condition, and the "OPEN INVERT" column 1571 corresponds to the swap transistors 1442 being in a conducting condition. The configuration corresponding to the pass gates 1407-1 and 1407-2 and the swap transistors 1442 both being in a conducting condition is not reflected in Logic Table 15-1 since this results in the sense lines being shorted together.

Via selective control of the pass gates 1407-1 and 1407-2 and the swap transistors 1442, each of the three columns of the upper portion of Logic Table 15-1 can be combined with each of the three columns of the lower portion of Logic Table 15-1 to provide nine (e.g., 3×3) different result combinations, corresponding to nine different logical operations, as indicated by the various connecting paths shown at 1575. The nine different selectable logical operations that can be implemented by the sensing circuitry 1450 are summarized in Logic Table 15-2.

The columns of Logic Table 15-2 show a heading 1580 that includes the states of logic selection control signals (e.g., FF, FT, TF, TT). For example, the state of a first logic selection control signal (e.g., FF) is provided in row 1576, the state of a second logic selection control signal (e.g., FT) is provided in row 1577, the state of a third logic selection control signal (e.g., TF) is provided in row 1578, and the state of a fourth logic selection control signal (e.g., TT) is provided in row 1579. The particular logical operation corresponding to the results is summarized in row 1547.

FIG. 16 illustrates a timing diagram associated with performing a logical AND operation and a shifting operation using the sensing circuitry in accordance with a number of embodiments of the present disclosure. FIG. 16 includes waveforms corresponding to signals EQ, ROW X, ROW Y, SENSE AMP, TF, TT, FT, FF, PHASE 1R, PHASE 2R, PHASE 1L, PHASE 2L, ISO, Pass, Pass*, DIGIT, and DIGIT_. The EQ signal corresponds to an equilibrate signal associated with a sense amplifier (e.g., EQ 226 shown in FIG. 2). The ROW X and ROW Y signals correspond to signals applied to respective access line (e.g., access lines 204-X and 204-Y shown in FIG. 2) to access a selected cell (or row of cells). The SENSE AMP signal corresponds to a signal used to enable/disable a sense amplifier (e.g., sense amplifier 1406). The TF, TT, FT, and FF signals correspond to logic selection control signals such as those shown in FIG. 14 (e.g., signals coupled to logic selection transistors 1462, 1452, 1454, and 1464). The PHASE 1R, PHASE 2R, PHASE 1L, and PHASE 2L signals correspond to the control signals (e.g., clock signals) provided to respective control lines 1482, 1483, 1491 and 1492 shown in FIG. 14. The ISO signal corresponds to the signal coupled to the gates of the isolation transistors 1450-1 and 1450-2 shown in FIG. 14. The PASS signal corresponds to the signal coupled to the gates of pass transistors 1407-1 and 1407-2 shown in FIG. 14, and the PASS* signal corresponds to the signal coupled to the gates of the swap transistors 1442. The DIGIT and DIGIT_signals correspond to the signals present on the respective sense lines 1405-1 (e.g., DIGIT (n)) and 1405-2 (e.g., DIGIT (n)_).

The timing diagram shown in FIG. 16 is associated with performing a logical AND operation on a data value stored in a first memory cell and a data value stored in a second memory cell of an array. The memory cells can correspond to a particular column of an array (e.g., a column comprising a complementary pair of sense lines) and can be coupled to respective access lines (e.g., ROW X and ROW Y). In describing the logical AND operation shown in FIG. 16, reference will be made to the sensing circuitry described in FIG. 14. For example, the logical operation described in FIG. 16 can include storing the data value of the ROW X memory cell (e.g., the "ROW X data value) in the latch of the corresponding compute component 1431 (e.g., the "A" data value), which can be referred to as the accumulator 1431, storing the data value of the ROW Y memory cell (e.g., the "ROW Y data value") in the latch of the corresponding sense amplifier 1406 (e.g., the "B" data value), and performing a selected logical operation (e.g., a logical AND operation in this example) on the ROW X data value and the ROW Y data value, with the result of the selected logical operation being stored in the latch of the compute component 1431.

As shown in FIG. 16, at time $T_1$, equilibration of the sense amplifier 1406 is disabled (e.g., EQ goes low). At time $T_2$, ROW X goes high to access (e.g., select) the ROW X memory cell. At time $T_3$, the sense amplifier 1406 is enabled (e.g., SENSE AMP goes high), which drives the complementary sense lines 1405-1 and 1405-2 to the appropriate rail voltages (e.g., $V_{DD}$ and GND) responsive to the ROW X data value (e.g., as shown by the DIGIT and DIGIT_ signals), and the ROW X data value is latched in the sense amplifier 1406. At time $T_4$, the PHASE 2R and PHASE 2L signals go low, which disables feedback on the latch of the compute component 1431 (e.g., by turning off transistors 1486 and 1490, respectively) such that the value stored in the compute component may be overwritten during the logical operation. Also, at time $T_4$, ISO goes low, which disables isolation transistors 1450-1 and 1450-2. At time $T_5$, TT and FT are enabled (e.g., go high), which results in PASS going high (e.g., since either transistor 1452 or 1454 will conduct depending on which of node ST2 or node SF2 was high when ISO was disabled at time $T_4$ (recall that when ISO is disabled, the voltages of the nodes ST2 and SF2 reside dynamically on the gates of the respective enable transistors 1452 and 1454). PASS going high enables the pass transistors 1407-1 and 1407-2 such that the DIGIT and DIGIT_signals, which correspond to the ROW X data value, are provided to the respective compute component nodes ST2 and SF2. At time $T_6$, TT and FT are disabled, which results in PASS going low, which disables the pass transistors 1407-1 and 1407-2. It is noted that PASS* remains low between time $T_5$ and $T_6$ since the TF and FF signals remain low. At time $T_7$, ROW X is disabled, and PHASE 2R, PHASE 2L, and ISO are enabled. Enabling PHASE 2R and PHASE 2L at time $T_7$ enables feedback on the latch of the compute component 1431 such that the ROW X data value is latched therein. Enabling ISO at time $T_7$ again couples nodes ST2 and SF2 to the gates of the enable transistors 1452, 1454, 1462, and 1464. At time $T_8$, equilibration is enabled (e.g., EQ goes high such that DIGIT and DIGIT are driven to an equilibrate voltage such as $V_{DD}/2$) and the sense amplifier 1406 is disabled (e.g., SENSE AMP goes low).

With the ROW X data value latched in the compute component 1431, equilibration is disabled (e.g., EQ goes low at time $T_9$). At time $T_{10}$, ROW Y goes high to access (e.g., select) the ROW Y memory cell. At time $T_{11}$, the sense amplifier 1406 is enabled (e.g., SENSE AMP goes high), which drives the complementary sense lines 1405-1 and 1405-2 to the appropriate rail voltages (e.g., VDD and GND) responsive to the ROW Y data value (e.g., as shown by the DIGIT and DIGIT_signals), and the ROW Y data value is latched in the sense amplifier 1406. At time $T_{12}$, the PHASE 2R and PHASE 2L signals go low, which disables feedback on the latch of the compute component 1431 (e.g., by turning off transistors 1486 and 1490, respectively) such that the value stored in the compute component may be overwritten during the logical operation. Also, at time $T_{12}$, ISO goes low, which disables isolation transistors 1450-1 and 1450-2. Since the desired logical operation in this example is an AND operation, at time $T_{13}$, TT is enabled while TF, FT and FF remain disabled (as shown in TABLE 15-2, FF=0, FT=0, TF=0, and TT=1 corresponds to a logical AND operation). Whether enabling TT results in PASS going high depends on the value stored in the compute component 1431 when ISO is disabled at time $T_{12}$. For example, enable transistor 1452 will conduct if node ST2 was high when ISO is disabled, and enable transistor will not conduct if node ST2 was low when ISO was disabled at time $T_{12}$.

In this example, if PASS goes high at time $T_{13}$, the pass transistors 1407-1 and 1407-2 are enabled such that the DIGIT and DIGIT_signals, which correspond to the ROW Y data value, are provided to the respective compute component nodes ST2 and SF2. As such, the value stored in the compute component 1431 (e.g., the ROW X data value) may be flipped, depending on the value of DIGIT and DIGIT_ (e.g., the ROW Y data value). In this example, if PASS stays low at time $T_{13}$, the pass transistors 1407-1 and 1407-2 are not enabled such that the DIGIT and DIGIT_signals, which correspond to the ROW Y data value, remain isolated from the nodes ST2 and SF2 of the compute component 1431. As such, the data value in the compute component (e.g., the ROW X data value) would remain the same.

At time $T_{14}$, TT is disabled, which results in PASS going (or remaining) low, such that the pass transistors 1407-1 and 1407-2 are disabled. It is noted that PASS* remains low between time $T_{13}$ and $T_{14}$ since the TF and FF signals remain low. At time $T_{15}$, ROW Y is disabled, and PHASE 2R, PHASE 2L, and ISO are enabled. Enabling PHASE 2R and PHASE 2L at time $T_{15}$ enables feedback on the latch of the compute component 1431 such that the result of the AND operation (e.g., "A" AND "B") is latched therein. Enabling ISO at time $T_{15}$ again couples nodes ST2 and SF2 to the gates of the enable transistors 1452, 1454, 1462, and 1464. At time $T_{16}$, equilibration is enabled (e.g., EQ goes high such that DIGIT and DIGIT_ are driven to an equilibrate voltage) and the sense amplifier 1406 is disabled (e.g., SENSE AMP goes low).

The result of the AND operation, which is initially stored in the compute component 1431 in this example, can be transferred back to the memory array (e.g., to a memory cell coupled to ROW X, ROW Y, and/or a different row via the complementary sense lines) and/or to an external location (e.g., an external processing component) via I/O lines.

FIG. 16 also includes (e.g., at 1601) signaling associated with shifting data (e.g., from a compute component 1431 to an adjacent compute component 1431). The example shown in FIG. 16 illustrates two left shifts such that a data value stored in a compute component corresponding to column "N" is shifted left to a compute component corresponding to column "N-2". As shown at time $T_{16}$, PHASE 2R and PHASE 2L are disabled, which disables feedback on the compute component latches, as described above. To perform a first left shift, PHASE 1L is enabled at time $T_{17}$ and disabled at time $T_{18}$. Enabling PHASE 1L causes transistor 1489 to conduct, which causes the data value at node SF1 to move left to node SF2 of a left-adjacent compute component 1431. PHASE 2L is subsequently enabled at time $T_{19}$ and disabled at time $T_{20}$. Enabling PHASE 2L causes transistor 1490 to conduct, which causes the data value from node ST1 to move left to node ST2 completing a left shift.

The above sequence (e.g., enabling/disabling PHASE 1L and subsequently enabling/disabling PHASE 2L) can be repeated to achieve a desired number of left shifts. For instance, in this example, a second left shift is performed by enabling PHASE 1L at time $T_{21}$ and disabling PHASE 1L at time $T_{22}$. PHASE 2L is subsequently enabled at time $T_{23}$ to complete the second left shift. Subsequent to the second left shift, PHASE 2L remains enabled and PHASE 2R is enabled (e.g., at time $T_{24}$) such that feedback is enabled to latch the data values in the compute component latches.

FIG. 17 illustrates a timing diagram associated with performing a logical XOR operation and a shifting operation using the sensing circuitry in accordance with a number of embodiments of the present disclosure. FIG. 17 includes the same waveforms described in FIG. 16 above. However, the timing diagram shown in FIG. 17 is associated with performing a logical XOR operation on a ROW X data value and a ROW Y data value (e.g., as opposed to a logical AND operation). Reference will again be made to the sensing circuitry described in FIG. 14.

The signaling indicated at times $T_0$ through $T_9$ for FIG. 17 are the same as for FIG. 16 and will not be repeated here. As such, at time T9, EQ is disabled with the ROW X data value being latched in the compute component 1431. At time $T_{10}$, ROW Y goes high to access (e.g., select) the ROW Y memory cell. At time $T_{11}$, the sense amplifier 1406 is enabled (e.g., SENSE AMP goes high), which drives the complementary sense lines 1405-1 and 1405-2 to the appropriate rail voltages (e.g., $V_{DD}$ and GND) responsive to the ROW Y data value (e.g., as shown by the DIGIT and DIGIT_signals), and the ROW Y data value is latched in the sense amplifier 1406. At time $T_{12}$, the PHASE 2R and PHASE 2L signals go low, which disables feedback on the latch of the compute component 1431 (e.g., by turning off transistors 1486 and 1490, respectively) such that the value stored in the compute component 1431 may be overwritten during the logical operation. Also, at time $T_{12}$, ISO goes low, which disables isolation transistors 1450-1 and 1450-2. Since the desired logical operation in this example is an XOR operation, at time $T_{13}$, TF and FT are enabled while TT and FF remain disabled (as shown in TABLE 15-2, FF=0, FT=1, TF=1, and TT=0 corresponds to a logical XOR (e.g., "AXB") operation). Whether enabling TF and FT results in PASS or PASS* going high depends on the value stored in the compute component 1431 when ISO is disabled at time $T_{12}$. For example, enable transistor 1462 will conduct if node ST2 was high when ISO is disabled, and enable transistor 1462 will not conduct if node ST2 was low when ISO was disabled at time $T_{12}$. Similarly, enable transistor 1454 will conduct if node SF2 was high when ISO is disabled, and enable transistor 1454 will not conduct if node SF2 was low when ISO is disabled.

In this example, if PASS goes high at time $T_{13}$, the pass transistors 1407-1 and 1407-2 are enabled such that the DIGIT and DIGIT_signals, which correspond to the ROW Y data value, are provided to the respective compute component nodes ST2 and SF2. As such, the value stored in the compute component 1431 (e.g., the ROW X data value) may be flipped, depending on the value of DIGIT and DIGIT_ (e.g., the ROW Y data value). In this example, if PASS stays low at time $T_{13}$, the pass transistors 1407-1 and 1407-2 are not enabled such that the DIGIT and DIGIT_signals, which correspond to the ROW Y data value, remain isolated from the nodes ST2 and SF2 of the compute component 1431. As such, the data value in the compute component (e.g., the ROW X data value) would remain the same. In this example, if PASS* goes high at time $T_{13}$, the swap transistors 1442 are enabled such that the DIGIT and DIGIT_signals, which correspond to the ROW Y data value, are provided to the respective compute component nodes ST2 and SF2 in a transposed manner (e.g., the "true" data value on DIGIT(n) would be provided to node SF2 and the "complement" data value on DIGIT(n)_ would be provided to node ST2). As such, the value stored in the compute component 1431 (e.g., the ROW X data value) may be flipped, depending on the value of DIGIT and DIGIT_ (e.g., the ROW Y data value). In this example, if PASS* stays low at time $T_{13}$, the swap transistors 1442 are not enabled such that the DIGIT and DIGIT_signals, which correspond to the ROW Y data value, remain isolated from the nodes ST2 and SF2 of the compute component 1431. As such, the data value in the compute component (e.g., the ROW X data value) would remain the same.

At time $T_{14}$, TF and FT are disabled, which results in PASS and PASS* going (or remaining) low, such that the pass transistors 1407-1 and 1407-2 and swap transistors 1442 are disabled. At time $T_{15}$, ROW Y is disabled, and PHASE 2R, PHASE 2L, and ISO are enabled. Enabling PHASE 2R and PHASE 2L at time $T_{15}$ enables feedback on the latch of the compute component 1431 such that the result of the XOR operation (e.g., "A" XOR "B") is latched therein. Enabling ISO at time $T_{15}$ again couples nodes ST2 and SF2 to the gates of the enable transistors 1452, 1454, 1462, and 1464. At time $T_{16}$, equilibration is enabled (e.g., EQ goes high such that DIGIT and DIGIT_ are driven to an equilibrate voltage) and the sense amplifier 1406 is disabled (e.g., SENSE AMP goes low).

The result of the XOR operation, which is initially stored in the compute component 1431 in this example, can be transferred back to the memory array (e.g., to a memory cell coupled to ROW X, ROW Y, and/or a different row via the complementary sense lines) and/or to an external location (e.g., an external processing component) via I/O lines.

FIG. 17 also includes (e.g., at 1701) signaling associated with shifting data (e.g., from a compute component 1431 to an adjacent compute component 1431). The example shown in FIG. 17 illustrates two right shifts such that a data value stored in a compute component corresponding to column "N" is shifted right to a compute component corresponding to column "N+2". As shown at time $T_{16}$, PHASE 2R and PHASE 2L are disabled, which disables feedback on the compute component latches, as described above. To perform a first right shift, PHASE 1R is enabled at time $T_{17}$ and disabled at time $T_{18}$. Enabling PHASE 1R causes transistor 1481 to conduct, which causes the data value at node ST1 to move right to node ST2 of a right-adjacent compute component 1431. PHASE 2R is subsequently enabled at time $T_{19}$ and disabled at time $T_{20}$. Enabling PHASE 2R causes transistor 1486 to conduct, which causes the data value from node SF1 to move right to node SF2 completing a right shift.

The above sequence (e.g., enabling/disabling PHASE 1R and subsequently enabling/disabling PHASE 2R) can be repeated to achieve a desired number of right shifts. For instance, in this example, a second right shift is performed by enabling PHASE 1R at time $T_{21}$ and disabling PHASE 1R at time $T_{22}$. PHASE 2R is subsequently enabled at time $T_{23}$ to complete the second right shift. Subsequent to the second right shift, PHASE 1R remains disabled, PHASE 2R remains enabled, and PHASE 2L is enabled (e.g., at time $T_{24}$) such that feedback is enabled to latch the data values in the compute component latches.

Although the examples described in FIGS. 16 and 17 include the logical operation result being stored in the compute component (e.g., 1431), sensing circuitry in accordance with embodiments described herein can be operated to perform logical operations with the result being initially stored in the sense amplifier (e.g., as illustrated in FIG. 15). Also, embodiments are not limited to the "AND" and "XOR" logical operation examples described in FIGS. 16 and 17, respectively. For example, sensing circuitry in accordance with embodiments of the present disclosure (e.g., 1450 shown in FIG. 14) can be controlled to perform various other logical operations such as those shown in Table 15-2.

CONCLUSION

The present disclosure includes apparatuses and methods related to performing sort operations in memory. An example apparatus might include a first group of memory cells coupled to a first sense line and configured to store a first element. An example apparatus might include a second group of memory cells coupled to a second sense line and configured to store a second element. An example apparatus might also include sensing circuitry configured to sort the first element and the second element by performing a number of AND operations, OR operations, SHIFT operations, and INVERT operations without transferring data via an input/output (I/O) line.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus comprising:
   a first group of memory cells coupled to a first access line of a memory array and configured to store a plurality of first elements;
   a second group of memory cells coupled to a second access line of the memory array and configured to store a plurality of second elements; and
   a controller configured to cause sensing circuitry to:
      iterate through the plurality of first elements and the plurality of second elements via a loop structure to perform an operation using the plurality of first elements and the plurality of second elements;
         wherein a conditional statement associated with the loop structure is used to determine whether at least one of a plurality of bits stored as an iterator mask has a particular bit-value;
      perform a shift operation using the iterator mask at each iteration of the loop structure; and
      perform an AND operation using the iterator mask at each iteration of the loop structure.

2. The apparatus of claim 1, wherein each of the plurality of first elements and the plurality of second elements has a same element width.

3. The apparatus of claim 1, wherein the shift operation is towards a least significant bit (LSB).

4. The apparatus of claim 1, wherein performing the shift operation at each iteration of the loop structure and the AND operation at each iteration of the loop structure comprises performing the shift operation and the AND operation without performing a sense line address access.

5. The apparatus of claim 4, further comprising performing the shift operation and the AND operation using sensing circuitry on pitch with a number of columns of complementary sense lines.

6. The apparatus of claim 5, wherein the iterator mask is stored in a third group of memory cells coupled to a third access lines.

7. The apparatus of claim 6, wherein performing the shift operation include shifting a plurality of bit-values of the plurality of bits stored as the iterator mask one position towards the LSB to an adjacent cell from the third group of memory cells.

8. The apparatus of claim 5, wherein the sensing circuitry comprises a sense amplifier and a compute component corresponding to each respective one of the number of columns of complementary sense lines.

9. The apparatus of claim 8, wherein the sense amplifier further comprises a primary latch and the compute component comprises a secondary latch.

10. A method comprising:
    performing a plurality of BLOCKOR operations on an iterator mask using a loop structure to perform a particular operation using a plurality of first elements and a plurality of second elements;
       wherein a first group of memory cells that are coupled to a first access line in a memory array store the plurality of first elements; and
       wherein a second group of memory cells that are coupled to a second access line in the memory array store a plurality of second elements;
    performing a number of logical operations at each iteration of the loop structure using the plurality of first elements and the plurality of second elements to perform the particular operation;
    performing a first shift operation using the iterator mask at each iteration of the loop structure; and
    performing an AND operation using the iterator mask at each iteration of the loop structure.

11. The method of claim 10, wherein each of the plurality of first elements and the plurality of second elements that the BLOCKOR is performed using has a same element width.

12. The method of claim 10, wherein performing the first shift operation comprises performing the first shift operation towards a most significant bit (MSB) using the iterator mask at each iteration of the loop structure.

13. The method of claim 10, wherein, the loop structure includes performing a plurality of loops.

14. The method of claim 13, wherein, a quantity of the plurality of loops of the loop structure is equal to a plurality of bit positions in the iterator mask.

15. The method of claim 14, wherein the iterator mask includes:
    a plurality of bits associated with the plurality of first elements and the plurality of second elements;
    wherein each bit in the plurality of bits included in the iterator mask corresponds with a different bit pair from each of the plurality of first elements and the plurality of second elements;
    wherein the plurality of bits included in the iterator mask are grouped into a plurality of bit groups that are associated with element pairs from the plurality of first elements and the plurality of second elements; and
    wherein each of the plurality of bit groups in the iterator mask have the same element width as each element in the plurality of first elements and the plurality of second elements.

16. The method of claim 15, wherein, the quantity of the plurality of loops of the loop structure is equal to the same element width associated with each of the plurality of bit groups in the iterator mask.

17. The method of claim 16, wherein, performing the first shift operation using the iterator mask includes storing a result of the first shift operation in a number of memory cells that store the iterator mask.

18. The method of claim 17, wherein, performing the AND operation includes performing the AND operation using the iterator mask and a static mask to prevent the first shift operation from shifting bits from one of the plurality of groups in the iterator mask to a different group of the plurality of groups in the iterator mask.

19. The method of claim 18, further comprising creating the row static mask by performing an invert operation using an element mask that indicates a most significant bit for each of the plurality of first elements and the plurality of second elements.

20. The method of claim 10, further comprising, creating the iterator mask from an element mask that indicates a most significant bit for each of the plurality of first elements and the plurality of second elements.

21. The method of claim 20, further comprising, creating the element mask by:
    setting a plurality of bits in a bit-vector stored in a plurality of compute components coupled to a plurality of sense lines equal to one, wherein the plurality of sense lines are coupled to memory cells that store the plurality of first elements and the plurality of second elements;

performing a second shift operation towards a least significant bit (LSB) on the bit-vector stored in the plurality of compute components;

performing an invert operation using the bit-vector stored in the plurality of compute components to identify the most significant bit associated with the plurality of first elements and the plurality of second elements; and storing the bit-vector stored in the compute components in a number of memory cells that store the element mask.

22. The method of claim 21, wherein, the element mask is further created by:

storing the element mask in the compute components;

executing a FOR loop that iterates through a plurality of elements pairs in the plurality of first elements and the plurality of second elements;

performing a third shift operation towards the LSB using the bit-vector stored in the plurality of compute components, wherein the third shift operation shifts the bit-vector stored in the plurality of compute components based on the same element width;

performing an OR operation using the bit-vector stored in the plurality of compute components and the element mast to identify the most significant bit associated with each of the plurality of first elements and the plurality of second elements; and storing the bit-vector stored in the compute components in the number of memory cells that store the element mask.

23. The method of claim 22, wherein, the iterator mask is created by:

storing the element mask in the compute components;

performing a fourth shift operation towards the LSB on the bit-vector stored in the compute components to mark a first iteration of a number of loops associated with the loop structure; and storing the bit-vector stored in the compute components in a number of memory cells that store the iterator mask.

24. The method of claim 23, wherein, the BLOCKOR operation determines whether one or more of the compute components store a particular bit-value.

25. An apparatus configured to perform operations in memory using a loop structure, the apparatus comprising:

a first group of memory cells coupled to a first access line in a memory array and configured to store a plurality of first elements;

a second group of memory cells coupled to a second access line in the memory array and configured to store a plurality of second elements; and a controller configured to cause sensing circuitry to:

iterate through the plurality of first elements and the plurality of second elements via a loop structure with a BLOCKOR operation as a conditional statement to perform an operation using the plurality of first elements and the plurality of second elements;

wherein the BLOCKOR operation uses an iterator mask; and wherein the plurality of first elements and the plurality of second elements have variable element widths;

perform a shift operation towards a least significant bit (LSB) using the iterator mask at each iteration of the loop structure; and perform an AND operation using the iterator mask at each iteration of the loop structure.

26. The apparatus of claim 25, wherein a plurality of elements pairs are formed from the plurality of first elements and the plurality of second elements and wherein each of the plurality of first elements is associated with one of the plurality of second elements to form each of the plurality of element pairs.

27. The apparatus of claim 26, wherein elements in at least one element pair from the plurality of element pairs have a different element width as elements in at least one other element pair from the plurality of element pairs.

28. The apparatus of claim 27, wherein each element in each element pair from the plurality of element pairs has a same element width.

29. The apparatus of claim 28, wherein bit positions from the iterator mask are associated with each of the plurality of element pairs.

30. The apparatus of claim 29, wherein the AND operation prevents the first shift operation from shifting bit values, in the iterator mask, that are associated with one of the plurality of element pairs, into bit positions that are associated with a different one of the plurality of element pairs.

31. The apparatus of claim 25, wherein the sensing circuitry is further controllable by the controller to create the iterator mask by:

storing an element mask in a plurality of memory cells that store the iterator mask;

wherein the element mask identifies a most significant bit for each of the plurality of first elements and the plurality of second elements.

32. The apparatus of claim 31, wherein the sensing circuitry is further controllable by the controller to perform the AND operation using the iterator mask and a static mask that identifies all bits except the most significant bit for each of the plurality of first elements and the plurality of second elements.

33. The apparatus of claim 32, wherein the sensing circuitry is controllable by the controller to:

create the static mask by:

performing an invert operation on the element mask;

performing a second shift operation towards a most significant bit (MSB) on a result of the invert operation on the element mask; and storing a result of the second shift operation in a group of memory cells that store the static mask.

34. A method for performing operations in memory using a loop structure, the method comprising:

performing a plurality of BLOCKOR operations on an iterator mask using a loop structure to perform a particular operation using a plurality of first elements and a plurality of second elements;

wherein the plurality of first elements and the plurality of second elements have variable element widths;

wherein a first group of memory cells that are coupled to a first access line in a memory array store the plurality of first elements; and wherein a second group of memory cells that are coupled to a second access line in the memory array store a plurality of second elements;

performing a number of logical operations at each iteration of the loop structure using the plurality of first elements and the plurality of second elements to perform the particular operation;

performing a SHIFT operation towards a most significant bit (MSB) using the iterator mask at each iteration of the loop structure; and performing an AND operation using the iterator mask at each iteration of the loop structure.

35. The method of claim 34, wherein the iterator mask identifies a least significant bit from each of a plurality of element pairs from the plurality of first element and the plurality of second elements, during a first iteration of the loop structure.

36. The method of claim 35, wherein the iterators mask identifies a most significant bit from at least one of the plurality of element pairs during a last iteration of the loop structure.

37. The method of claim 36, wherein the iterator mask does not identify any bits from the plurality of element pairs after performing a last BLOCKOR operation from the plurality of BLOCKOR operations.

* * * * *